United States Patent
Ohmaru et al.

(10) Patent No.: US 9,559,105 B2
(45) Date of Patent: Jan. 31, 2017

(54) SIGNAL PROCESSING CIRCUIT

(75) Inventors: Takuro Ohmaru, Kanagawa (JP); Hidetomo Kobayashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 120 days.

(21) Appl. No.: 13/473,706

(22) Filed: May 17, 2012

(65) Prior Publication Data

US 2012/0294069 A1     Nov. 22, 2012

(30) Foreign Application Priority Data

May 20, 2011 (JP) .................................. 2011-113874

(51) Int. Cl.
| | |
|---|---|
| *G11C 11/24* | (2006.01) |
| *H01L 27/115* | (2006.01) |
| *H01L 27/105* | (2006.01) |
| *H01L 27/108* | (2006.01) |
| *H01L 27/12* | (2006.01) |
| *G11C 11/413* | (2006.01) |

(52) U.S. Cl.
CPC ............ *H01L 27/115* (2013.01); *G11C 11/413* (2013.01); *H01L 27/108* (2013.01); *H01L 27/1052* (2013.01); *H01L 27/1203* (2013.01); *H01L 27/1225* (2013.01)

(58) Field of Classification Search
CPC .............................. G11C 11/4096; G11C 15/43
USPC ........................................................ 365/149
See application file for complete search history.

(56) References Cited

U.S. PATENT DOCUMENTS

| | | |
|---|---|---|
| 5,663,905 A | 9/1997 | Matsuo et al. |
| 5,731,856 A | 3/1998 | Kim et al. |
| 5,744,864 A | 4/1998 | Cillessen et al. |
| (Continued) | | |

FOREIGN PATENT DOCUMENTS

| | | |
|---|---|---|
| EP | 1 737 044 A1 | 12/2006 |
| EP | 2 226 847 A2 | 9/2010 |
| (Continued) | | |

OTHER PUBLICATIONS

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Anthan Tran
(74) *Attorney, Agent, or Firm* — Fish & Richardson P.C.

(57) ABSTRACT

A signal processing circuit includes a memory and a control portion configured to control the memory. The control portion includes a volatile memory circuit including data latch terminals, a first non-volatile memory circuit electrically connected to one of the data latch terminals, a second non-volatile memory circuit electrically connected to the other of the data latch terminals, and a precharge circuit having a function of supplying a potential that is a half of a high power supply potential to the one and the other of the data latch terminals. Each of the first non-volatile memory circuit and the second non-volatile memory circuit includes a transistor having a channel formation region including an oxide semiconductor and a capacitor connected to a node that is brought into a floating state by turning off the transistor.

13 Claims, 40 Drawing Sheets

(56) References Cited

U.S. PATENT DOCUMENTS

| | | | |
|---|---|---|---|
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,567,911 B1 | 5/2003 | Mahmoud | |
| 6,603,165 B2 | 8/2003 | Yamauchi et al. | |
| 6,727,522 B1 | 4/2004 | Kawasaki et al. | |
| 6,897,509 B2 | 5/2005 | Yamauchi et al. | |
| 6,944,076 B2 | 9/2005 | Nakamura et al. | |
| 7,006,067 B2 | 2/2006 | Tobita et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,138,684 B2 | 11/2006 | Hidaka et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,333,363 B2 | 2/2008 | Nakai et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,508,707 B2 | 3/2009 | Nakai et al. | |
| 7,674,650 B2 | 3/2010 | Akimoto et al. | |
| 7,732,819 B2 | 6/2010 | Akimoto et al. | |
| 7,772,053 B2 | 8/2010 | Kameshiro et al. | |
| 8,279,691 B2 | 10/2012 | Takahashi et al. | |
| 8,300,452 B2 | 10/2012 | Cannon et al. | |
| 8,816,739 B2 | 8/2014 | Uemura et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0052141 A1* | 3/2004 | McAdams et al. | 365/207 |
| 2004/0127038 A1 | 7/2004 | Carcia et al. | |
| 2004/0141360 A1* | 7/2004 | Parris et al. | 365/149 |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1* | 5/2006 | Sano | H01L 21/428 257/347 |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0268652 A1* | 11/2006 | Jeong | 365/230.06 |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0242543 A1* | 10/2007 | Romanovskyy et al. | 365/208 |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0012052 A1* | 1/2008 | Menut et al. | 257/288 |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0003105 A1* | 1/2009 | Itoh et al. | 365/203 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092809 A1 | 4/2010 | Itagaki et al. | |
| 2010/0109002 A1 | 5/2010 | Itagaki et al. | |
| 2010/0124094 A1 | 5/2010 | Kimura | |
| 2010/0148171 A1 | 6/2010 | Hayashi et al. | |
| 2011/0176357 A1 | 7/2011 | Koyama et al. | |
| 2011/0187410 A1 | 8/2011 | Kato et al. | |
| 2011/0193078 A1 | 8/2011 | Takemura | |
| 2012/0032730 A1 | 2/2012 | Koyama | |
| 2012/0120715 A1 | 5/2012 | Saito | |
| 2012/0161127 A1 | 6/2012 | Kato et al. | |
| 2012/0161132 A1 | 6/2012 | Yamazaki | |
| 2012/0182790 A1 | 7/2012 | Yamazaki et al. | |
| 2012/0188814 A1 | 7/2012 | Yamazaki et al. | |
| 2012/0257439 A1 | 10/2012 | Kurokawa | |
| 2012/0262982 A1 | 10/2012 | Takemura | |
| 2012/0271984 A1 | 10/2012 | Ohmaru et al. | |
| 2012/0294068 A1 | 11/2012 | Ishizu | |
| 2012/0294102 A1 | 11/2012 | Ishizu | |
| 2014/0333363 A1 | 11/2014 | Uemura et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-110392 A | 4/1993 |
| JP | 05-251705 A | 9/1993 |
| JP | 08-264794 A | 10/1996 |
| JP | 10-078836 A | 3/1998 |
| JP | 11-505377 A | 5/1999 |
| JP | 2000-040376 A | 2/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-351430 A | 12/2002 |
| JP | 2003-086000 A | 3/2003 |

(56) References Cited

FOREIGN PATENT DOCUMENTS

| | | |
|---|---|---|
| JP | 2003-086808 A | 3/2003 |
| JP | 2003-152085 A | 5/2003 |
| JP | 2004-103957 A | 4/2004 |
| JP | 2004-273614 A | 9/2004 |
| JP | 2004-273732 A | 9/2004 |
| JP | 2006-302466 A | 11/2006 |
| JP | 2007-096055 A | 4/2007 |
| JP | 2007-123861 A | 5/2007 |
| JP | 2010-124290 A | 6/2010 |
| TW | I273599 | 2/2007 |
| WO | 2004/114391 A1 | 12/2004 |
| WO | WO-2009/063542 | 5/2009 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Z-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-IN. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GiZo (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Tomoyuki Ishii et al.; "A Poly-Silicon TFT With a Sub-5-nm Thick Channel for Low-Power Gain Cell Memory in Mobile Applications"; IEEE Transactions on Electron Devices; vol. 51, No. 11; pp. 1805-1810; Nov. 1, 2004.

Wonchan Kim et al.; "An Experimental High-Density DRAM Cell with a Built-in Gain Stage"; IEEE Journal of Solid-State Circuits; vol. 29, No. 8, pp. 978-981; Aug. 1, 1994.

Shoji Shukuri et al.; "A Complementary Gain Cell Technology for Sub-1V Supply DRAMs"; IEDM 92: Technical Digest of International Electron Devices Meeting; pp. 1006-1008; Dec. 13, 1992.

Shoji Shukuri et al.; "A Semi-Static Complementary Gain Cell Technology for Sub-1 V Supply DRAM's"; IEEE Transactions on Electron Devices; vol. 41, No. 6; pp. 926-931; Jun. 1, 1994.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

(56) References Cited

OTHER PUBLICATIONS

Hirao, T et al., "Novel Top-Gate Zinc Oxide Thin-Film Transistors (ZnO TFTs) for AMLCDS," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda, T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium -Gallium-Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.
Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N et al., "Spinel,YBFE2O4, and YB2FE3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.
Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World'S Largest (15-Inch) XGA MLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.
Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "SUFTLA Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of The 6th International Display Workshops, Dec. 3, 2008, pp. 581-584.
Nakamura, "Synthesis of Homologous Compound with New Long-Period Structure," NIRIM Newsletter, Mar. 1995, vol. 150, pp. 1-4 with English translation.
Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.
Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.
Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.
Oba, F et al., "Defect energetics in ZnO: A hybrid Hartree-Fock density functional study," Phys. Rev. B (Physical Review. B), 2008, vol. 77, pp. 245202-1-245202-6.
Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.
Ohara, H et al., "21.3: 4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.
Taiwanese Office Action (Application No. 101116653) Dated Apr. 26, 2016.

* cited by examiner

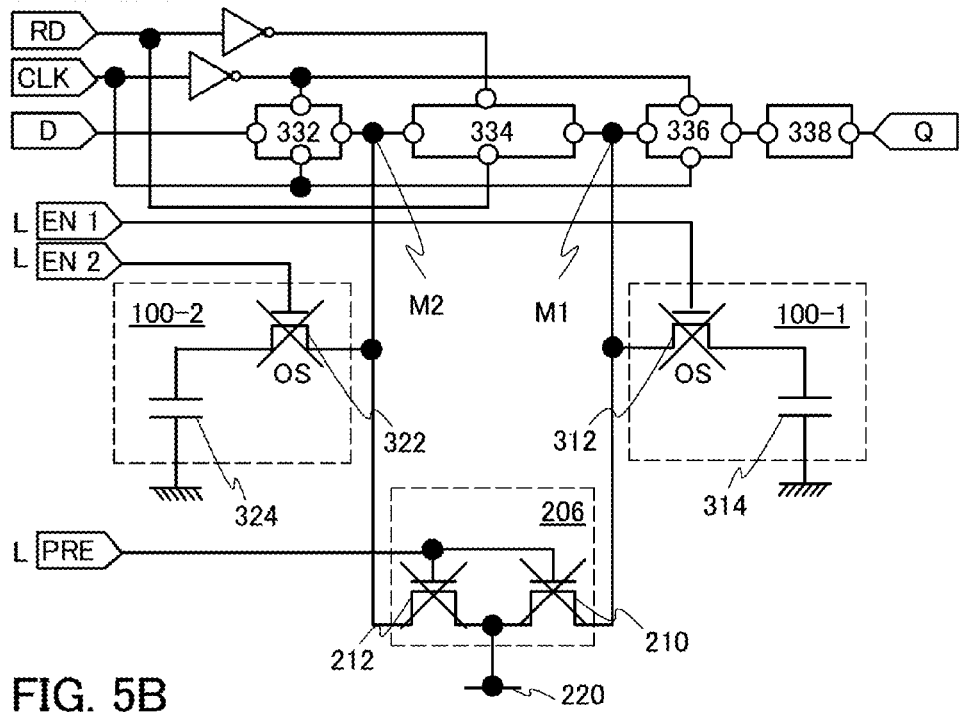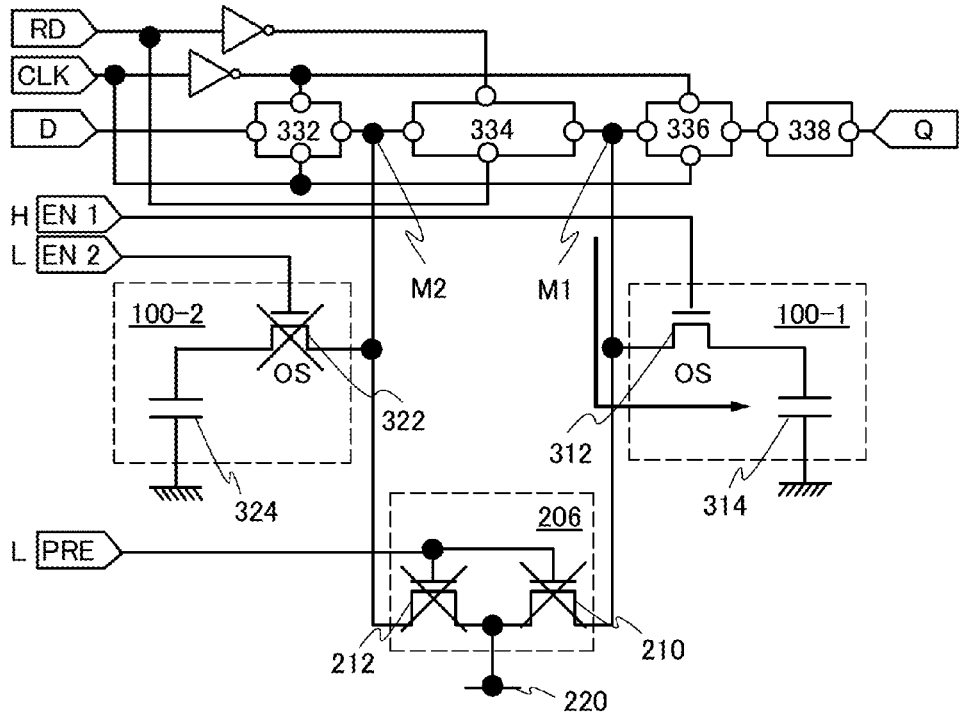

FIG. 24A    FIG. 24B
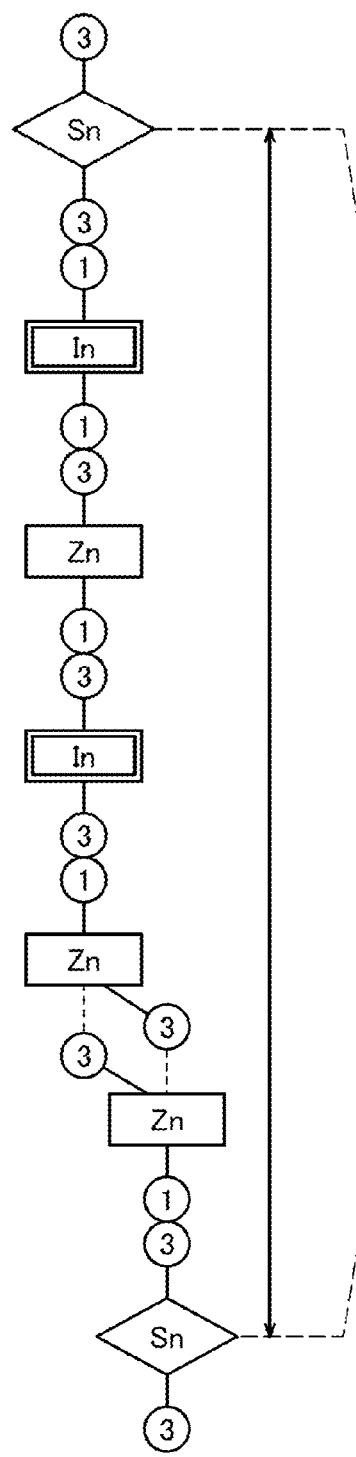
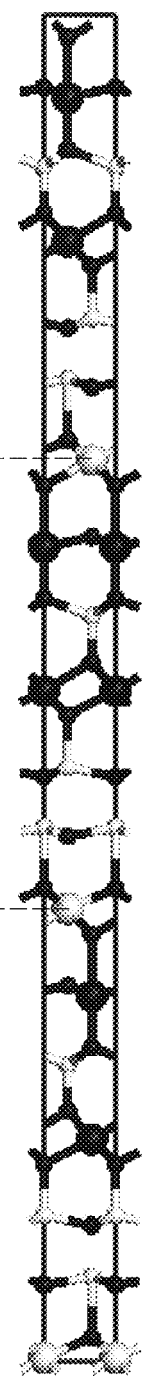
FIG. 24C
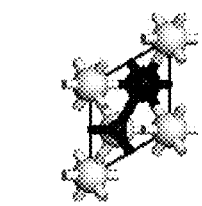
● In
○ Sn
◇ Zn
• O ● In
○ Ga
○ Zn
● O

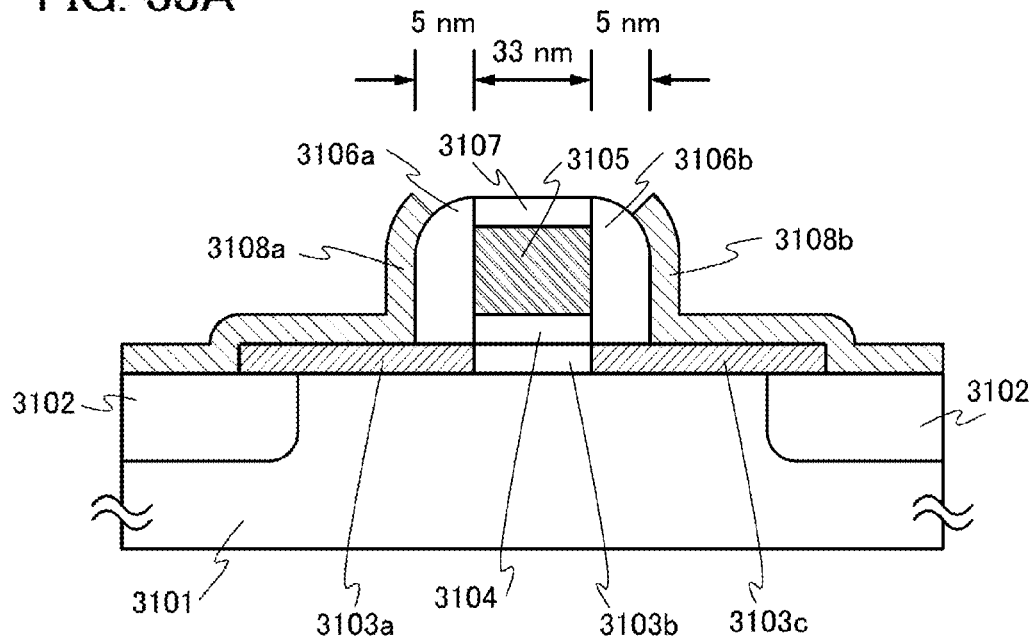
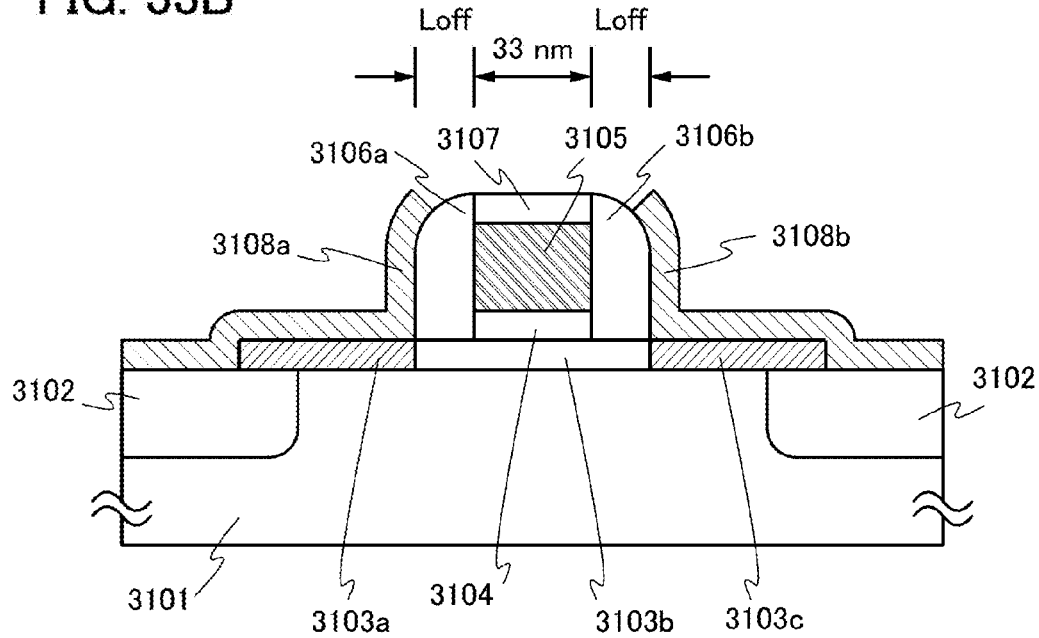

SIGNAL PROCESSING CIRCUIT

BACKGROUND OF THE INVENTION

1. Field of the Invention

The present invention relates to a signal processing circuit including a memory circuit in which a stored logic state is not lost even after power is turned off, and to an electronic device using the signal processing circuit. Further, the present invention relates to a method of driving a signal processing circuit including a memory circuit in which a stored logic state is not lost even after power is turned off.

2. Description of the Related Art

Signal processing circuits such as central processing units (CPUs) vary in structure depending on the intended use. A signal processing circuit generally has a main memory for storing data or a program and other memory circuits such as a register and a cache memory.

A register has a function of temporarily holding data in order to carry out arithmetic processing or hold a program execution state, for example. In addition, a cache memory is located between an arithmetic circuit and a main memory in order to reduce access to the low-speed main memory and speed up the arithmetic processing.

In a memory circuit in a signal processing circuit, such as a register or a cache memory, data writing and data reading need to be performed at higher speed than in a main memory. For this reason, in general, a flip-flop circuit is used as a register, and a static random access memory (SRAM) is used as a cache memory. That is, as a memory circuit such as a register or a cache memory, a volatile memory circuit in which data is lost after supply of power supply voltage is stopped is used.

Further, in order to suppress power consumption, a method in which supply of power supply voltage to a signal processing circuit is temporarily stopped in a period during which data is not input/output has been suggested (e.g., see Patent Document 1).

In Patent Document 1, a non-volatile memory circuit is located in the periphery of a volatile memory circuit such as a register or a cache memory. Data is temporarily stored in the non-volatile memory circuit while supply of power supply voltage to a signal processing circuit is stopped.

Meanwhile, in recent years, metal oxides having semiconductor characteristics (also referred to as oxide semiconductors) have attracted attention. Oxide semiconductors can be applied to transistors (e.g., see Patent Documents 2 and 3).

REFERENCE

Patent Document

[Patent Document 1] Japanese Published Patent Application No. 2010-124290
[Patent Document 2] Japanese Published Patent Application No. 2007-123861
[Patent Document 3] Japanese Published Patent Application No. 2007-096055

SUMMARY OF THE INVENTION

In the signal processing circuit having the structure disclosed in Patent Document 1, a ferroelectric is used for a memory element included in the non-volatile memory circuit.

In the memory element formed using a ferroelectric, a ferroelectric material is fatigued by repetition of data writing, which causes a problem such as a writing error. As a result, the number of rewriting times is limited in the memory element formed using a ferroelectric.

In the case where a flash memory is used as the non-volatile memory circuit, high voltage is applied to generate tunneling current, whereby injection or release of electrons is performed. Therefore, there are problems in that the memory circuit intensively deteriorates by repeatedly performing data writing and data reading. For that reason, in the case where a flash memory is used as the non-volatile memory circuit, there is a limitation on the number of rewriting times. Furthermore, the data processing speed of the non-volatile memory circuit using a flash memory is low.

In a signal processing circuit in which data in a volatile memory circuit is stored in an external memory device while supply of power supply voltage to the signal processing circuit is stopped, it takes a long time for returning data from the external memory device to the volatile memory circuit. Therefore, such a signal processing circuit is not suitable for a short-time power-off for the purpose of a reduction in power consumption.

In view of the above problems, an object of one embodiment of the present invention is to provide a signal processing circuit having a structure in which a stored logic state is not lost even after power is turned off.

Another object of one embodiment of the present invention is to provide a method of driving a signal processing circuit having a structure in which a stored logic state is not lost even after power is turned off.

One embodiment of the present invention is a signal processing circuit including a memory and a control portion configured to control the memory. The control portion includes a volatile memory circuit including data latch terminals, a first non-volatile memory circuit electrically connected to one of the data latch terminals, a second non-volatile memory circuit electrically connected to the other of the data latch terminals, and a precharge circuit having a function of supplying a potential that is a half of a high power supply potential to the one and the other of the data latch terminals. Each of the first non-volatile memory circuit and the second non-volatile memory circuit includes a transistor having a channel formation region including an oxide semiconductor, and a capacitor connected to a node that is brought into a floating state by turning off the transistor. In this specification, a "semiconductor device" refers to a device which can function by utilizing semiconductor characteristics; an electro-optical device, and an electronic device using a semiconductor circuit and a semiconductor element are all included in semiconductor devices.

Another embodiment of the present invention is a signal processing circuit including a memory and a control portion configured to control the memory. The control portion includes a volatile memory circuit including data latch terminals, a plurality of first non-volatile memory circuits electrically connected to one of the data latch terminals, a plurality of second non-volatile memory circuits electrically connected to the other of the data latch terminals, and a precharge circuit having a function of supplying a potential that is a half of a high power supply potential to the one and the other of the data latch terminals. Each of the plurality of first non-volatile memory circuits and the plurality of second non-volatile memory circuits includes a transistor having a channel formation region including an oxide semiconductor, and a capacitor connected to a node that is brought into a floating state by turning off the transistor.

Another embodiment of the present invention is a signal processing circuit including a memory and a control portion configured to control the memory. The control portion includes a volatile memory circuit including data latch terminals, a first non-volatile memory circuit electrically connected to one of the data latch terminals, a second non-volatile memory circuit electrically connected to the other of the data latch terminals, and a precharge circuit having a function of supplying a potential that is a half of a high power supply potential to the one and the other of the data latch terminals. Each of the first non-volatile memory circuit and the second non-volatile memory circuit includes a transistor having a channel formation region including an oxide semiconductor, and a capacitor connected to a node that is brought into a floating state by turning off the transistor. The volatile memory circuit functions as a latch circuit of a flip-flop circuit.

In any of the above embodiments of the present invention, the first non-volatile memory circuit may have a function of holding a data signal written from the volatile memory circuit, and the second non-volatile memory circuit may have a function of holding a data signal written from the volatile memory circuit.

In any of the above embodiments of the present invention, the first non-volatile memory circuit and the second non-volatile memory circuit may have functions of holding data signals different from each other.

In any of the above embodiments of the present invention, the control portion may include at least one of a control circuit, an arithmetic circuit, and a register.

In any of the above embodiments of the present invention, the memory may include a plurality of third non-volatile memory circuits arranged in a matrix.

According to one embodiment of the present invention, even after supply of power supply voltage to the signal processing circuit is stopped, the signal processing circuit can hold a data signal for a long time. Thus, a driving method in which power supply voltage is supplied only when needed (also referred to as a normally-off driving method) can be employed; accordingly, the power consumption of the signal processing circuit can be drastically reduced.

Since the signal processing circuit includes the volatile memory circuit and the pair of non-volatile memory circuits which are respectively connected to one and the other of the data latch terminals (also referred to as both terminals) of the volatile memory circuit, the transistors in the non-volatile memory circuits can have the same level of effects on both the terminals of the volatile memory circuit. Accordingly, writing and reading of a data signal in the volatile memory circuit can be less affected by the transistors in the non-volatile memory circuits.

Moreover, since the signal processing circuit includes the volatile memory circuit and the pair of non-volatile memory circuits which are respectively connected to the one and the other of the data latch terminals of the volatile memory circuit, the pair of non-volatile memory circuits can hold data signals different from each other.

Further, immediately after supply of the power supply voltage to a module is selected, the signal processing circuit can start predetermined processing with the use of the held data signal. Therefore, time from selection of supply of the power supply voltage to start of the predetermined processing can be shortened in the signal processing circuit.

In addition, predetermined processing is performed using a volatile memory circuit in a module supplied with the power supply voltage; therefore, the access speed of the signal processing circuit can be improved. Further, a highly reliable circuit in which the number of times data can be written is high is used as the non-volatile memory circuit for the signal processing circuit; therefore, the durability and reliability of the signal processing circuit can be improved.

Further, according to one embodiment of the present invention, a structure can be employed in which a volatile memory circuit and a pair of non-volatile memory circuits for storing a data signal held in the volatile memory circuit are provided in each module such as a control circuit, an arithmetic circuit, or a register, in which a non-volatile memory circuit is provided in a memory, and in which a power supply circuit controls supply of power supply voltage to each module.

In the signal processing circuit having the above structure, without moving a data signal between modules, input and standby of a data signal before and after supply of the power supply voltage is stopped can be performed. Therefore, it is not necessary to provide a special signal path (such as a path or a scan path) for performing input and standby of a data signal between modules, and thus the size of a circuit in the signal processing circuit can be increased easily.

BRIEF DESCRIPTION OF THE DRAWINGS

In the accompanying drawings:

FIGS. 5A and 5B illustrate an example of a method of driving a signal processing circuit;

FIGS. 24A to 24C illustrate a structure of an oxide material;

FIGS. 33A and 33B each illustrate a cross-sectional structure of a transistor used in calculation;

DETAILED DESCRIPTION OF THE INVENTION

Figure 1A:
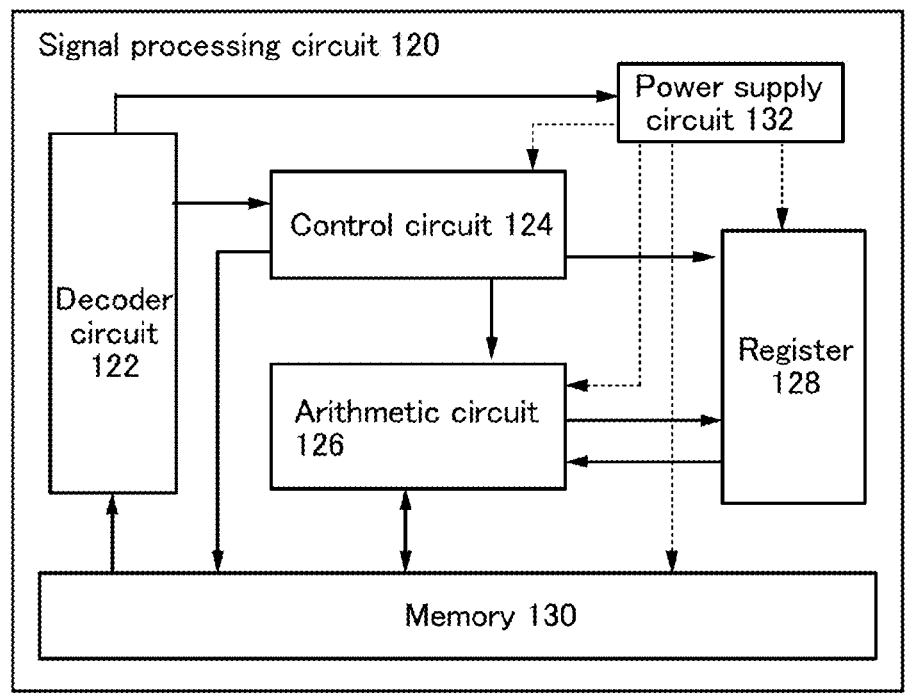
FIGS. 1A and 1B illustrate an example of a signal processing circuit.

Hereinafter, embodiments of the present invention will be described with reference to the drawings. Structures of the present invention can be used in various modes, and it is easily understood by those skilled in the art that modes and details disclosed herein can be modified in various ways without departing from the spirit and scope of the present invention. Therefore, the present invention is not construed as being limited to the description of the embodiments.

Note that in the structures of the present invention described below, identical portions are denoted by the same reference numerals in different drawings.

Note that, the size, layer thickness, signal waveform, and region of each structure shown in the drawings and the like of the embodiments are exaggerated for clarity in some cases. Therefore, the embodiments of the present invention are not limited to such scales.

Note that functions of a "source" and a "drain" may be interchanged in the case where transistors of different polarities are employed or in the case where the direction of current flow changes in circuit operation, for example. Therefore, the terms "source" and "drain" can be used to denote the drain and the source, respectively, in this specification.

Note that when it is explicitly described that "A and B are connected", the case where A and B are electrically connected, the case where A and B are functionally connected, and the case where A and B are directly connected are included therein.

In addition, the expression "electrically connected" includes the case where components are connected through an "object having any electric function". There is no particular limitation on the "object having any electric function" as long as electric signals can be transmitted and received between the components connected through the object.

In addition, even when independent components are electrically connected to each other in a circuit diagram, there is the case where one conductive film has functions of a plurality of components, such as the case where part of a wiring functions as an electrode or a terminal. The expression "electrically connected" in this specification includes in its category such a case where one conductive film has functions of a plurality of components.

Note that the terms "over" and "below" do not necessarily mean "directly on" and "directly under", respectively, in the description of a physical relationship between components. For example, the expression "a gate electrode over a gate insulating film" can mean the case where there is an additional component between the gate insulating film and the gate electrode.

Note that in this specification, the terms "first", "second", "third", to "n-th" (n is a natural number) are used in order to avoid confusion between components and thus do not limit the components numerically.

Embodiment 1

In this embodiment, an example of a signal processing circuit and an example of a method of driving the signal processing circuit will be described with reference to FIGS. 1A and 1B, FIG. 2, FIG. 3, FIG. 4, FIGS. 5A and 5B, FIGS. 6A and 6B, and FIGS. 7A and 7B.

Note that the signal processing circuit includes large scale integrated circuits (LSIs) such as a CPU, a microprocessor, an image processing circuit, a digital signal processor (DSP), and a field programmable gate array (FPGA) in its category.

An example of a structure of a signal processing circuit will be described with reference to FIG. 1A. FIG. 1A is a block diagram schematically illustrating a structure of a signal processing circuit.

A signal processing circuit 120 includes a decoder circuit 122, a control circuit 124, an arithmetic circuit 126 (also referred to as an arithmetic logic unit (ALU)), a register 128, a memory 130, and a power supply circuit 132.

The decoder circuit 122 decodes a command. In addition, the decoder circuit 122 may have a function of inputting a control signal to the power supply circuit 132 or the control circuit 124 in response to an input from external when supply of power supply voltage to the memory 130 is stopped. Further, the decoder circuit 122 may have a counter (or a timer) and have a function of inputting a control signal to the power supply circuit 132 or the control circuit 124 with the use of the counter (or the timer) when supply of the power supply voltage to the memory 130 is stopped.

The control circuit 124 controls the arithmetic circuit 126, the register 128, and the memory 130 on the basis of the decoded command.

The register 128 temporarily stores a data signal input to the arithmetic circuit 126 and a data signal output from the arithmetic circuit 126.

Input and output of data signals are also performed between the arithmetic circuit 126 and the memory 130. The memory 130 can function as a main memory for storing a data signal or a program.

The power supply circuit 132 is controlled by the decoder circuit 122, and the power supply circuit 132 controls supply of the power supply voltage to the control circuit 124, the arithmetic circuit 126, the register 128, and the memory 130. Note that the control circuit 124, the arithmetic circuit 126, the register 128, and the memory 130 may each be referred to as a module. Here, the power supply circuit 132 can select supply or stop of the power supply voltage for each module.

For example, the power supply circuit 132 can stop supply of the power supply voltage to all the modules (the control circuit 124, the arithmetic circuit 126, the register 128, and the memory 130). Further, the power supply circuit 132 can supply the power supply voltage to all the modules. Furthermore, the power supply circuit 132 can supply the power supply voltage selectively to some of the modules (to at least one of the arithmetic circuit 126, the control circuit 124, the register 128, and the memory 130) while stopping supply of the power supply voltage to the other modules.

Next, an example of a structure applicable to the control circuit 124, the arithmetic circuit 126, and the register 128, which are included in the signal processing circuit 120, will be described with reference to FIG. 2. Here, at least one of the control circuit 124, the arithmetic circuit 126, and the register 128 includes a volatile memory circuit and a pair of non-volatile memory circuits corresponding to the volatile memory circuit. Note that the control circuit 124, the arithmetic circuit 126, and the register 128 are also collectively referred to as a control portion.

Figure 1B:
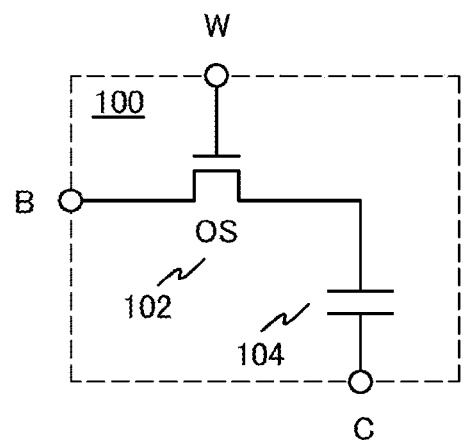
Figure 2:
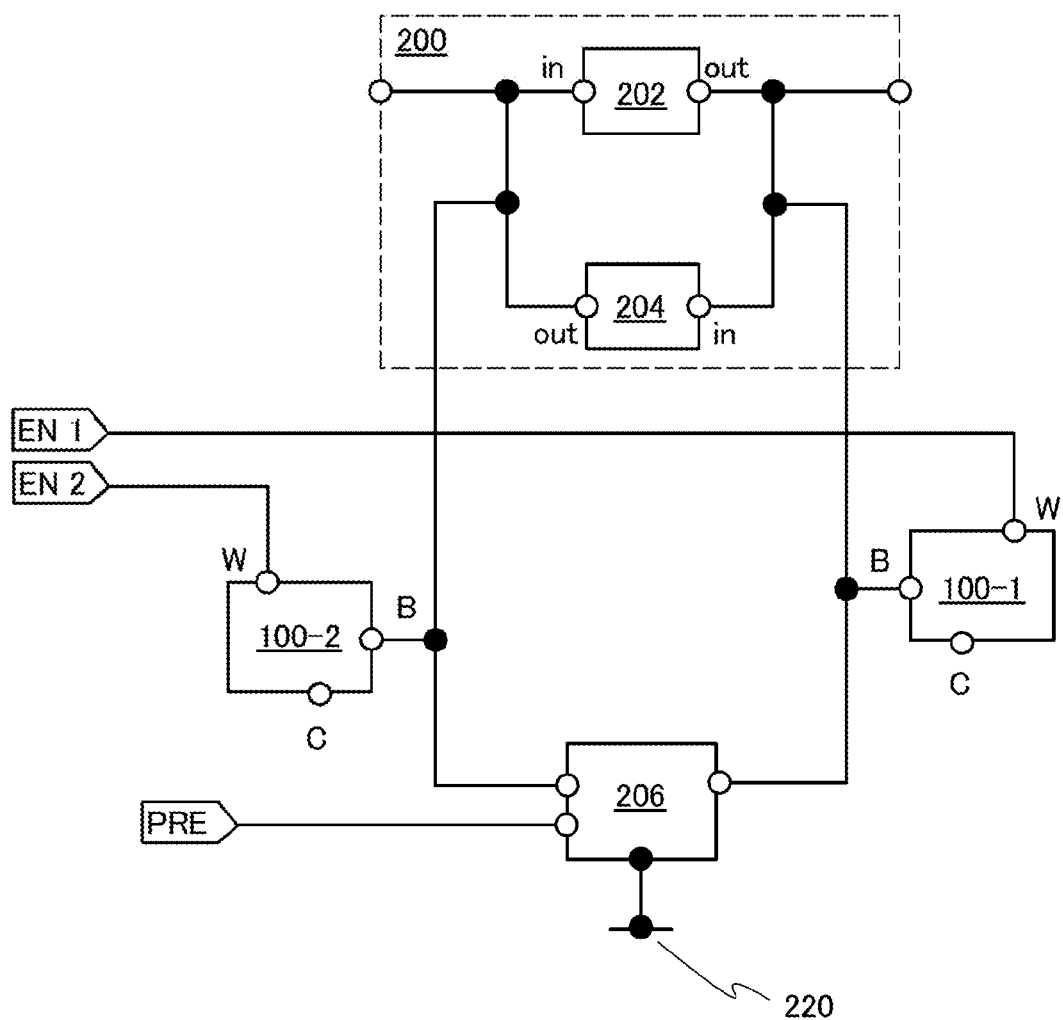
FIG. 2 illustrates an example of a signal processing circuit.

FIG. 2 illustrates an example in which a volatile memory circuit 200 for storing a 1-bit data signal is provided with two non-volatile memory circuits 100 in FIG. 1B (a non-volatile memory circuit 100-1 and a non-volatile memory circuit 100-2).

The volatile memory circuit 200, the non-volatile memory circuit 100-1, and the non-volatile memory circuit 100-2 can form a dynamic random access memory (DRAM) circuit.

<Structure of Volatile Memory Circuit>

The volatile memory circuit 200 can include at least two arithmetic circuits, and have a feedback loop in which an output of one of the arithmetic circuits is input to the other of the arithmetic circuits and an output of the other of the arithmetic circuits is input to the one of the arithmetic circuits. As examples of a memory circuit having a feedback loop, a flip-flop circuit and a latch circuit can be given.

In FIG. 2, the volatile memory circuit 200 includes an arithmetic circuit 202 and an arithmetic circuit 204, and has a feedback loop in which an output of the arithmetic circuit 202 is input to the arithmetic circuit 204 and an output of the arithmetic circuit 204 is input to the arithmetic circuit 202.

As each of the arithmetic circuit 202 and the arithmetic circuit 204, for example, an inverter circuit or a NAND circuit can be used.

<Structure of Non-Volatile Memory Circuit>

A structure of the non-volatile memory circuit 100 will be described with reference to FIG. 1B.

In FIG. 1B, the non-volatile memory circuit 100 includes a transistor 102 and a capacitor 104. Note that the memory 130 may include the non-volatile memory circuit 100 illustrated in FIG. 1B.

A gate of the transistor 102 is connected to a terminal W. One of a source and a drain of the transistor 102 is connected to a terminal B. The other of the source and the drain of the transistor 102 is connected to one terminal of the capacitor 104. The other terminal of the capacitor 104 is connected to a terminal C.

Here, a transistor with significantly small off-state current can be used as the transistor 102.

The one terminal of the capacitor 104 is connected to a node which is brought into a floating state by turning off the transistor 102.

A data signal is stored in the non-volatile memory circuit 100 by controlling the potential (or the amount of electric charge corresponding to the potential) of the one terminal of the capacitor 104 in accordance with the data signal. For example, a 1-bit data signal can be stored when a state where predetermined electric charge is held in the capacitor 104 corresponds to "1" and a state where electric charge is not held in the capacitor 104 corresponds to "0".

Here, as the transistor 102 with extremely small off-state current, it is possible to use a transistor whose channel formation region is formed in a layer or substrate formed using a semiconductor having a wider bandgap than silicon. A compound semiconductor can be given as the semiconductor having a wider bandgap than silicon. Examples of the compound semiconductor include an oxide semiconductor and a nitride semiconductor. For example, a transistor whose channel formation region is formed in an oxide semiconductor can be used.

The oxide semiconductor preferably contains at least one of indium (In) and zinc (Zn). In particular, the oxide semiconductor preferably contains In and Zn. As a stabilizer for reducing variation in electric characteristics of a transistor formed using the oxide semiconductor, gallium (Ga) is preferably added to the oxide semiconductor. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

In addition, any of the above oxide semiconductors may contain an element other than In, Ga, Sn, and Zn, for example, silicon oxide ($SiO_2$).

Note that here, for example, an "In—Ga—Zn-based oxide" means an oxide containing In, Ga, and Zn as main components and there is no particular limitation on the ratio of In, Ga, and Zn. The In—Ga—Zn-based oxide may contain a metal element other than In, Ga, and Zn.

An In—Ga—Zn-based oxide has sufficiently high resistance when there is no electric field and thus off-state current can be sufficiently reduced. In addition, also having high field-effect mobility, the In—Ga—Zn-based oxide is suitable for a semiconductor material.

Alternatively, a material expressed as $InMO_3(ZnO)_m$ (m>0, and m is not an integer) may be used as the oxide semiconductor. Note that M represents one or more metal elements selected from Ga, Fe, Mn, and Co. Further alternatively, a material expressed as $In_3SnO_5(ZnO)_n$ (n>0, and n is an integer) may be used as the oxide semiconductor.

Note that the oxide semiconductor is not limited to those given above, and a material with an appropriate composition may be used in accordance with needed semiconductor characteristics (the mobility, the threshold value, the variation, and the like). In order to obtain the needed semiconductor characteristics, it is preferable that the carrier density, the impurity concentration, the defect density, the atomic ratio of a metal element to oxygen, the interatomic distance, the density, and the like be set to be appropriate.

For example, high mobility can be relatively easily obtained with an In—Sn—Zn-based oxide. The mobility can be increased by reducing the defect density in the bulk also in the case of using an In—Ga—Zn-based oxide.

Here, for example, the expression "the composition of an oxide with an atomic ratio of In:Ga:Zn=a:b:c (a+b+c=1) is in the neighborhood of the composition of an oxide with an atomic ratio of In:Ga:Zn=A:B:C (A+B+C=1)" means that a, b, and c satisfy the following relation: $(a-A)^2+(b-B)^2+(c-C)^2 \le r^2$. For example, r may be 0.05. The same applies to other oxides.

In addition, the oxide semiconductor may be single crystal or non-single-crystal. In the case of non-single-crystal, the oxide semiconductor may be either amorphous or polycrystalline. Further, the oxide semiconductor may have either an amorphous structure including a crystalline portion or a non-amorphous structure.

An amorphous oxide semiconductor can have a flat surface with relative ease. Therefore, by manufacturing a transistor with the use of the amorphous oxide semiconductor, interface scattering can be suppressed and relatively high mobility can be obtained with relative ease.

In a crystalline oxide semiconductor, defects in the bulk can be further reduced. In addition, the crystalline oxide semiconductor can have higher mobility than an amorphous oxide semiconductor by improvement in surface planarity.

In order to improve the surface planarity, the oxide semiconductor is preferably formed over a flat surface. Specifically, the oxide semiconductor is preferably formed over a surface with an average surface roughness ($R_a$) less than or equal to 1 nm, further preferably less than or equal to 0.3 nm, still further preferably less than or equal to 0.1 nm.

Note that $R_a$ is obtained by expanding centerline average roughness, which is defined by JIS B 0601, into three dimensions so as to be applicable to a surface. $R_a$ can be expressed as an "average value of the absolute values of deviations from a reference surface to a designated surface" and is defined by the following formula.

$$Ra = \frac{1}{S_0} \int_{y_1}^{y_2} \int_{x_1}^{x_2} |f(x, y) - Z_0| dx dy \qquad \text{[Formula 1]}$$

In the above formula, $S_0$ represents the area of a measurement surface (a rectangular region which is defined by four points represented by the coordinates $(x_1,y_1)$, $(x_1,y_2)$, $(x_2,y_1)$, and $(x_2,y_2)$). $Z_0$ represents the average height of the measurement surface. $R_a$ can be measured using an atomic force microscope (AFM).

FIG. 1B illustrates an example in which a transistor whose channel formation region is formed in an oxide semiconductor is used as the transistor 102. As illustrated in FIG. 1B, a transistor whose channel formation region is formed in an oxide semiconductor is denoted by the symbol "OS".

By turning off the transistor with significantly small off-state current in the non-volatile memory circuit 100, the potential of the one terminal of the capacitor can be held for a long time even after supply of power supply voltage is stopped. Therefore, in a memory using such a non-volatile memory circuit, operation for periodically rewriting a data signal (also referred to as refresh operation) is not needed or the frequency of refresh operation can be markedly reduced.

Further, the non-volatile memory circuit 100 stores a data signal in the following manner: a signal potential corresponding to the data signal is input to a predetermined node (the one terminal of the capacitor 104), the transistor 102 with significantly small off-state current is turned off, and the node is brought into a floating state. In the non-volatile memory circuit 100, it is thus possible to reduce fatigue of the memory element due to repetitive rewriting of a data signal and to increase the number of times a data signal can be rewritten.

<Method of Driving Non-Volatile Memory Circuit>

A method of driving the non-volatile memory circuit 100 illustrated in FIG. 1B will be described.

In the non-volatile memory circuit 100, the transistor 102 is turned on in response to a control signal (EN) input to the terminal W, and a signal potential corresponding to a data signal is input to the terminal B. The signal potential is input to the one terminal of the capacitor 104.

Then, when the transistor 102 is turned off in response to the control signal (EN) input to the terminal W, the data signal is held.

Here, since the off-state current of the transistor 102 is significantly small, the potential of the one terminal of the capacitor 104 can be held for a long time even after supply of the power supply voltage is stopped.

A data signal is read from the non-volatile memory circuit 100 in the following manner: the transistor 102 is turned on in response to the control signal (EN) input to the terminal W, and the potential (or the amount of electric charge corresponding to the potential) of the one terminal of the capacitor 104 is detected from the terminal B.

<Structure of Volatile Memory Circuit and Non-Volatile Memory Circuit>

As illustrated in FIG. 2, a terminal B of the non-volatile memory circuit 100-1 is connected to an output terminal of the arithmetic circuit 202 and an input terminal of the arithmetic circuit 204. A terminal B of the non-volatile memory circuit 100-2 is connected to an input terminal of the arithmetic circuit 202 and an output terminal of the arithmetic circuit 204.

Further, a precharge circuit 206 is connected to the terminal B of the non-volatile memory circuit 100-1 and the terminal B of the non-volatile memory circuit 100-2. A precharge signal (S-PRE) is input to the precharge circuit 206 from a precharge signal input terminal PRE. The precharge circuit 206 is also supplied with a potential ($V_{dd}/2$) that is a half of a high power supply potential ($V_{dd}$) from a precharge power supply line 220.

A control signal (EN1) is input to a terminal W of the non-volatile memory circuit 100-1. A control signal (EN2) is input to a terminal W of the non-volatile memory circuit 100-2.

The same potential may be input to a terminal C of the non-volatile memory circuit 100-1 and a terminal C of the non-volatile memory circuit 100-2. For example, a ground potential can be supplied to the terminals C.

<Method of Driving Volatile Memory Circuit and Non-Volatile Memory Circuit>

A signal processing circuit including the volatile memory circuit 200, the non-volatile memory circuit 100-1, and the non-volatile memory circuit 100-2 which are illustrated in FIG. 2, and a method of driving the signal processing circuit will be described with reference to FIG. 3, FIG. 4, FIGS. 5A and 5B, FIGS. 6A and 6B, and FIGS. 7A and 7B.

Figure 3:
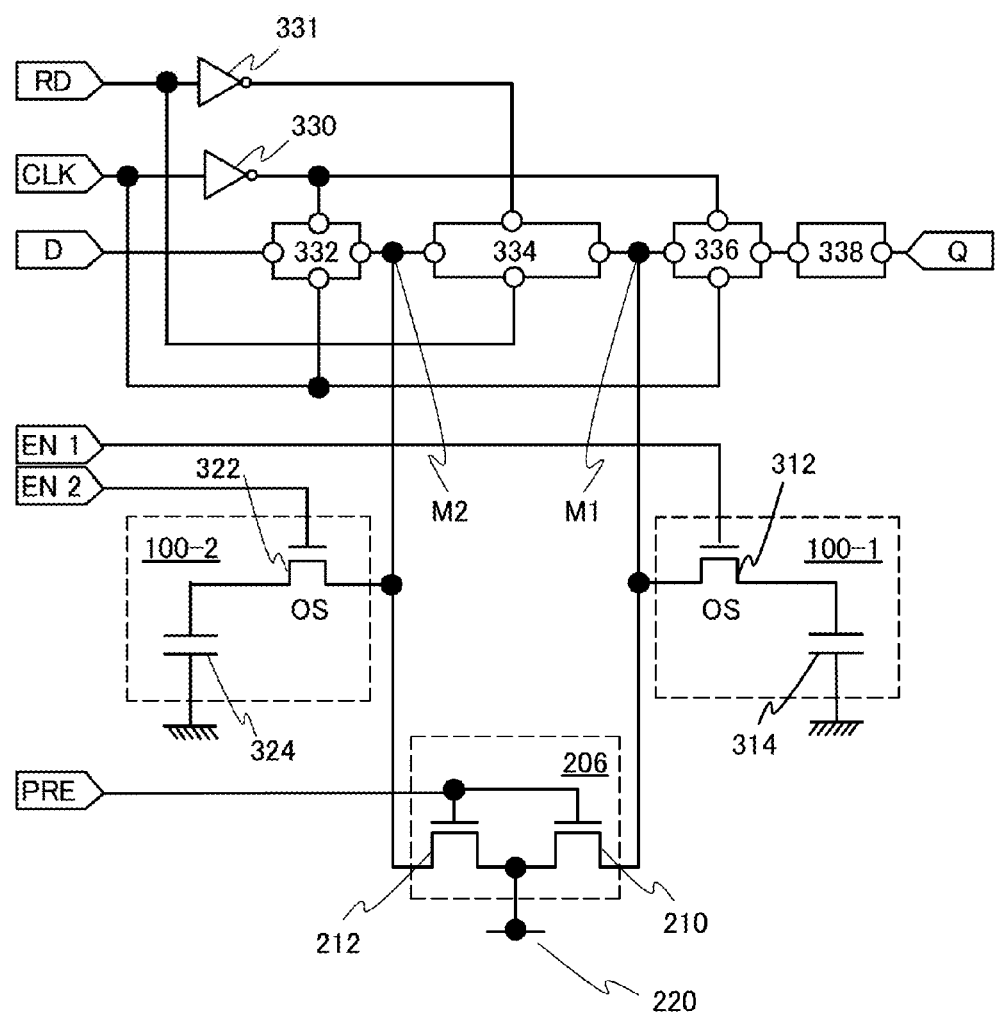
FIG. 3 illustrates an example of a signal processing circuit.

FIG. 3 illustrates an example of a signal processing circuit described in this embodiment.

In FIG. 3, the non-volatile memory circuit 100-1 includes a transistor 312 with significantly small off-state current and a capacitor 314.

One of a source and a drain of the transistor 312 is connected to one data latch terminal of a volatile memory circuit 334. The other of the source and the drain of the transistor 312 is connected to one terminal of the capacitor 314. The control signal (EN1) is input to a gate of the transistor 312.

The non-volatile memory circuit 100-2 includes a transistor 322 with significantly small off-state current and a capacitor 324.

One of a source and a drain of the transistor 322 is connected to the other data latch terminal of the volatile memory circuit 334. The other of the source and the drain of the transistor 322 is connected to one terminal of the capacitor 324. The control signal (EN2) is input to a gate of the transistor 322.

Note that the transistor 312 and the transistor 322 each correspond to the transistor 102 in FIG. 1B. The capacitor 314 and the capacitor 324 each correspond to the capacitor 104 in FIG. 1B.

The graphic symbol of ground in FIG. 3 signifies connection to a reference potential of the entire circuit.

The transistors 312 and 322 with significantly small off-state current can be manufactured in the same process.

For example, gate electrodes of these transistors can be formed by etching of one conductive film; source electrodes and drain electrodes of these transistors can be formed by etching of one conductive film; and active layers (semiconductor layers where channel formation regions are formed) of these transistors can be formed by etching of one semiconductor layer.

In addition, the capacitor 314 and the capacitor 324 can be manufactured in the same process.

For example, electrodes functioning as one terminals of these capacitors can be formed by etching of one conductive film; dielectric layers of these capacitors can be formed by etching of one insulating film; and electrodes functioning as the other terminals of these capacitors can be formed by etching of one conductive film.

As illustrated in FIG. 3, the precharge circuit 206 includes a transistor 210, a transistor 212, and the precharge power supply line 220 connected to these transistors.

One of a source and a drain of the transistor 210 is connected to the one of the source and the drain of the transistor 312. The other of the source and the drain of the transistor 210 is connected to the precharge power supply line 220. The precharge signal (S-PRE) is input to a gate of the transistor 210 from the precharge signal input terminal PRE.

One of a source and a drain of the transistor 212 is connected to the one of the source and the drain of the transistor 322. The other of the source and the drain of the transistor 212 is connected to the precharge power supply line 220. The precharge signal (S-PRE) is input to a gate of the transistor 212 from the precharge signal input terminal PRE.

The potential ($V_{dd}/2$) that is a half of the high power supply potential ($V_{dd}$) is supplied to the precharge power supply line 220.

Further, FIG. 3 illustrates an inverter circuit 330, an inverter circuit 331, a switching circuit 332, the volatile memory circuit 334, a switching circuit 336, and a buffer circuit 338.

The switching circuit 332 controls connection between an input terminal D and the volatile memory circuit 334. Specifically, when the switching circuit 332 is in an on state, a data signal is input to the other data latch terminal of the volatile memory circuit 334 from the input terminal D via the switching circuit 332 in an on state. When the switching circuit 332 is in an off state, input of a data signal to the other data latch terminal of the volatile memory circuit 334 is stopped.

Note that the on/off state of the switching circuit 332 is controlled by a clock signal (S-CLK) input from a clock signal input terminal CLK and a signal (S-CLKb) generated by inverting the clock signal with the inverter circuit 330.

Note that the clock signal (S-CLK) input from the clock signal input terminal CLK is a signal which alternates between a high (H) level and a low (L) level at given intervals.

A data signal is input to the other data latch terminal of the volatile memory circuit 334 from the input terminal D via the switching circuit 332 in an on state. Alternatively, a data signal is input to the other data latch terminal of the volatile memory circuit 334 from the non-volatile memory circuit 100-2.

A data signal is input to the one data latch terminal of the volatile memory circuit 334 from the non-volatile memory circuit 100-1.

Further, a control signal (RD) and a signal generated by inverting the control signal (RD) with the inverter circuit 331 are input to the other input terminals of the volatile memory circuit 334 from a control signal input terminal RD.

A data signal is input to the buffer circuit 338 from the one data latch terminal of the volatile memory circuit 334 via the switching circuit 336.

The volatile memory circuit 334 corresponds to the volatile memory circuit 200 in FIG. 2. Note that a latch circuit is described as the volatile memory circuit 334 in FIG. 3.

The switching circuit 336 controls connection between the one data latch terminal of the volatile memory circuit 334 and the buffer circuit 338. Specifically, when the switching circuit 336 is in an on state, a data signal is input to the buffer circuit 338 from the one data latch terminal of the volatile memory circuit 334. When the switching circuit 336 is in an off state, input of a data signal to the buffer circuit 338 is stopped.

Note that the on/off state of the switching circuit 336 is controlled by the clock signal (S-CLK) input from the clock signal input terminal CLK and the signal (S-CLKb) generated by inverting the clock signal with the inverter circuit 330.

A data signal is input to the buffer circuit 338 from the one data latch terminal of the volatile memory circuit 334 via the switching circuit 336 in an on state. Note that a latch circuit can be used as the buffer circuit 338, for example.

Here, a portion where the one data latch terminal of the volatile memory circuit 334, the one of the source and the drain of the transistor 312 included in the non-volatile memory circuit 100-1, and the switching circuit 336 are connected to one another is referred to as a node M1. A portion where the other data latch terminal of the volatile memory circuit 334, the one of the source and the drain of the transistor 322 included in the non-volatile memory circuit 100-2, and the switching circuit 332 are connected to one another is referred to as a node M2.

Next, an example of a method of driving the signal processing circuit illustrated in FIG. 3 will be described with reference to FIG. 4, FIGS. 5A and 5B, FIGS. 6A and 6B, and FIGS. 7A and 7B.

Figure 4:
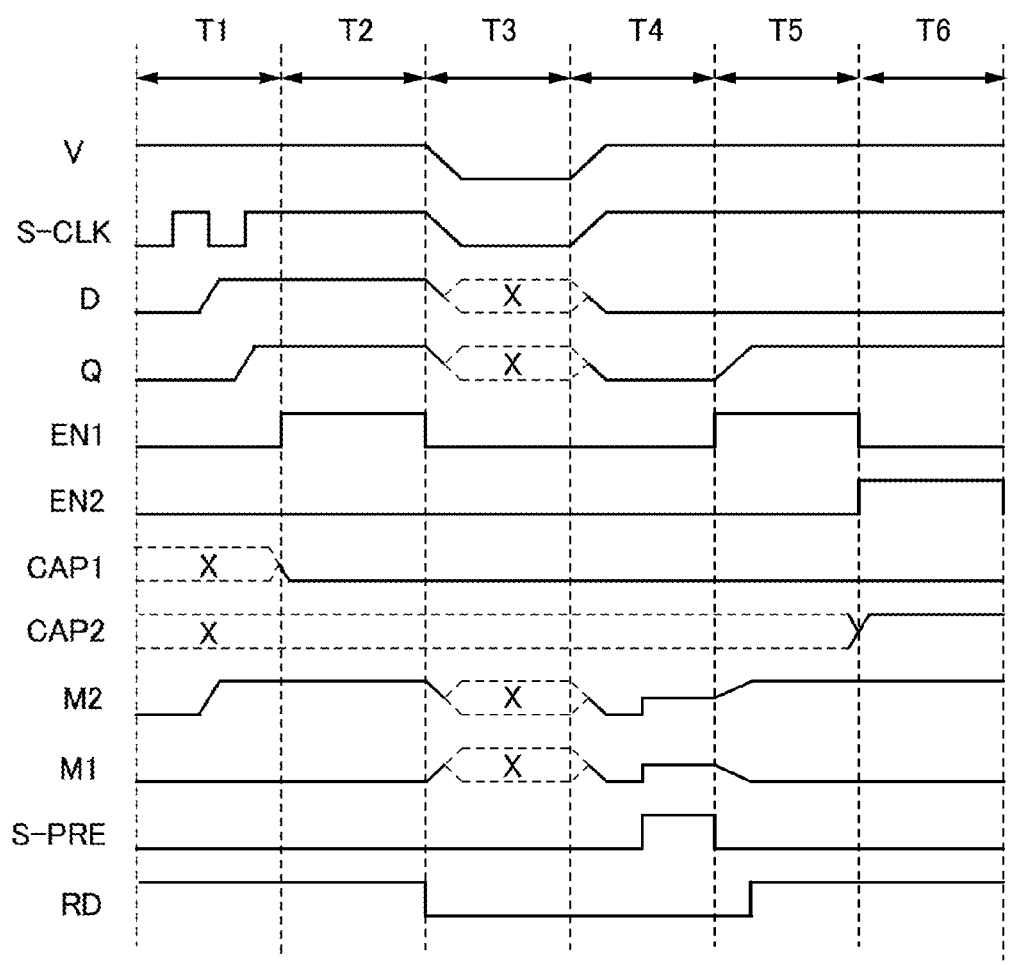
FIG. 4 illustrates an example of a method of driving a signal processing circuit.

A timing chart in FIG. 4 shows the potential of the high power supply wiring (V), the potential of the clock signal (S-CLK), the potential of a data signal (D) input to the input terminal D, the potential of a data signal (Q) output from an output terminal Q, the potential of the control signal (EN1), the potential of the control signal (EN2), the potential (CAP1) of the one terminal of the capacitor 314, the potential (CAP2) of the one terminal of the capacitor 324, the potential (M2) of the node M2, the potential (M1) of the node M1, the potential of the precharge signal (S-PRE), and the potential of the control signal (RD).

As for the high power supply wiring (V) in FIG. 4, a high power supply potential ($V_{dd}$) is supplied at an H level, and a low power supply potential ($V_{ss}$) is supplied at an L level. Here, the relation, the high power supply potential ($V_{dd}$)>the low power supply potential ($V_{ss}$) is satisfied. As the low power supply potential ($V_{ss}$), for example, GND, 0 V, or the reference potential of the entire circuit can be set.

As for each of the potential of the control signal (EN1), the potential of the control signal (EN2), the potential of the precharge signal (S-PRE), and the potential of the control signal (RD) in FIG. 4, the signal is active when the potential is at an H level, and the signal is inactive when the potential is at an L level.

The potential of the data signal (D) input to the input terminal D, the potential of the data signal (Q) output from the output terminal Q, the potential (CAP1) of the one terminal of the capacitor 314, and the potential (CAP2) of the one terminal of the capacitor 324 are each the potential of a data signal.

In FIG. 4, "X" means that the potential of the signal is in a floating state, which results from the switching circuit 332 and the switching circuit 336 being turned off by the clock signal (S-CLK).

First, a period T1 in FIG. 4 will be described with reference to FIG. 5A.

In the period T1, when the clock signal (S-CLK) is input from the clock signal input terminal CLK, a data signal (Data A) is input to the other data latch terminal of the volatile memory circuit 334 from the input terminal D via the switching circuit 332. The data signal is held by a feedback loop of the volatile memory circuit 334. Then, the data signal (Data A) output from the feedback loop of the volatile memory circuit 334 is input to the output terminal Q via the buffer circuit 338.

At this time, the control signal (EN1) is not input to the gate of the transistor 312; therefore, the transistor 312 is in an off state. The control signal (EN2) is not input to the gate of the transistor 322; therefore, the transistor 322 is also in an off state.

Similarly, the precharge signal (S-PRE) is not input to the gates of the transistor 210 and the transistor 212; therefore, the transistor 210 and the transistor 212 are in an off state.

In FIG. 4, the potential (M1) of the node M1 is the potential of a signal (Data Ab) generated by inverting the data signal (Data A), and the potential (M2) of the node M2 is the potential of the data signal (Data A).

Next, a period T2 in FIG. 4 will be described with reference to FIG. 5B.

In the period T2, the control signal (EN1) is input to the gate of the transistor 312, so that the transistor 312 is turned on. Then, the inverted signal of the data signal is input from the one data latch terminal of the volatile memory circuit 334 to the one terminal of the capacitor 314 in the non-volatile memory circuit 100-1 via the transistor 312 in an on state.

Consequently, the data signal held in the volatile memory circuit 334 can be stored in the non-volatile memory circuit 100-1. In this manner, the data signal is stored (held) in the non-volatile memory circuit 100-1.

In the periods T1 and T2 in FIG. 4 and FIGS. 5A and 5B, the data signal is held by the feedback loop of the volatile memory circuit 334 and then the data signal is stored in the non-volatile memory circuit 100-1 by turning on the transistor 312; however, this embodiment is not limited thereto.

The data signal may be stored in the non-volatile memory circuit 100-1 by turning on the transistor 312 at the same time as holding of the data signal by the feedback loop of the volatile memory circuit 334.

Next, a period T3 in FIG. 4 will be described with reference to FIG. 6A.

In the period T3, input of the control signal (EN1) to the gate of the transistor 312 is stopped, so that the transistor 312 is turned off.

Thus, the data signal stored in the non-volatile memory circuit 100-1 becomes unable to be changed by a signal from the volatile memory circuit 334. In this manner, standby of the data signal stored in the non-volatile memory circuit 100-1 can be performed.

After standby of the data signal is started, supply of the high power supply potential ($V_{dd}$) and input of the clock signal (S-CLK) are stopped.

Here, since the off-state current of the transistor 312 is significantly small, by turning off the transistor 312, the potential of the one terminal of the capacitor 314 can be held even after supply of the high power supply potential ($V_{dd}$) is stopped. Accordingly, the non-volatile memory circuit 100-1 can hold the data signal for a long time.

Note that the control signal (EN2) is not input to the gate of the transistor 322 and the precharge signal (S-PRE) is not input to the gate of the transistor 212 and the gate of the transistor 210; therefore, these transistors are in an off-state.

Next, a period T4 in FIG. 4 will be described with reference to FIG. 6B.

In the period T4, supply of the high power supply potential ($V_{dd}$) and input of the clock signal (S-CLK) are started.

Further, in the period T4, the precharge signal (S-PRE) is input to the gate of the transistor 210 and the gate of the transistor 212 from the precharge signal input terminal PRE, so that the transistor 210 and the transistor 212 are turned on.

Then, the potential ($V_{dd}/2$) that is a half of the high power supply potential ($V_{dd}$) is supplied from the precharge power supply line 220 to the one data latch terminal of the volatile memory circuit 334 via the transistor 210 in an on state. In FIG. 4, the potential (M1) of the node M1 is the potential ($V_{dd}/2$) that is a half of the high power supply potential ($V_{dd}$).

Similarly, the potential ($V_{dd}/2$) that is a half of the high power supply potential ($V_{dd}$) is supplied from the precharge power supply line 220 to the other data latch terminal of the volatile memory circuit 334 via the transistor 212 in an on state. In FIG. 4, the potential (M2) of the node M2 is the potential ($V_{dd}/2$) that is a half of the high power supply potential ($V_{dd}$).

Note that the control signal (EN1) is not supplied to the gate of the transistor 312; therefore, the transistor 312 is in an off state. Thus, the data signal stored in the non-volatile memory circuit 100-1 keeps being held.

The control signal (EN2) is not input to the gate of the transistor 322; therefore, the transistor 322 is also in an off state.

After that, input of the precharge signal (S-PRE) is stopped upon completion of precharge. The precharge may be completed at any time before the transistor 312 is turned on.

Next, a period T5 in FIG. 4 will be described with reference to FIG. 7A.

In the period T5, the control signal (EN1) is input to the gate of the transistor 312, so that the transistor 312 is turned on. Then, the potential (or corresponding electric charge) of the one terminal of the capacitor 314 is input to the one data latch terminal of the volatile memory circuit 334 via the transistor 312 in an on state.

In FIG. 4, the potential (M1) of the node M1 is the potential of the inverted signal of the data signal.

Consequently, the data signal held in the non-volatile memory circuit 100-1 can be held by the feedback loop of the volatile memory circuit 334.

The data signal held in the volatile memory circuit 334 is input to the buffer circuit 338 via the switching circuit 336 in an on state, and then inverted in the buffer circuit 338 into the data signal (Data A) to be input to the output terminal Q.

Here, as described with reference to FIG. 6B, the one and the other of the data latch terminals of the volatile memory circuit 334 are precharged in advance, thereby having the potential ($V_{dd}/2$) that is a half of the high power supply potential ($V_{dd}$).

As a result, it is possible to detect even a slight change of the data signal which is read from the non-volatile memory circuit 100-1 to the volatile memory circuit 334. Accordingly, the data signal can be read at high speed with high accuracy even when the capacitance of the capacitor 314 is not high.

In this embodiment, not only one terminal of the volatile memory circuit is provided with a non-volatile memory circuit; the one and the other of the data latch terminals of the volatile memory circuit 334 are provided with the non-volatile memory circuit 100-1 and the non-volatile memory circuit 100-2, respectively. Thus, the non-volatile memory circuit 100-1 and the non-volatile memory circuit 100-2 are arranged in parallel with respect to the volatile memory circuit 334.

Here, in the case where only one terminal of the volatile memory circuit is provided with a non-volatile memory circuit, the one terminal of the volatile memory circuit is affected by a transistor included in the non-volatile memory circuit. For example, the potential of the one terminal of the volatile memory circuit might be changed by the parasitic capacitance of a gate of the transistor included in the non-volatile memory circuit. In this case, a data signal cannot be read into the volatile memory circuit accurately.

In contrast, both the terminals of the volatile memory circuit 334 described in this embodiment are provided with the corresponding one of the pair of non-volatile memory circuits. Specifically, the non-volatile memory circuit 100-1 is connected to the one data latch terminal of the volatile memory circuit 334, and the non-volatile memory circuit 100-2 is connected to the other data latch terminal of the volatile memory circuit 334.

Therefore, an effect of the transistor 322 on the other data latch terminal of the volatile memory circuit 334 can be substantially equal to an effect of the transistor 312 on the one data latch terminal of the volatile memory circuit 334.

Thus, even when the potentials of both the terminals of the volatile memory circuit are changed due to the transistors included in the non-volatile memory circuits, the changes can be substantially equal to each other; accordingly, writing and reading of a data signal in the volatile memory circuit can be less affected.

Next, a period T6 in FIG. 4 will be described with reference to FIG. 7B.

In the period T6, the control signal (EN2) is input to the gate of the transistor 322, so that the transistor 322 is turned on. Thus, a data signal held in the volatile memory circuit 334 can be stored in the capacitor 324 via the transistor 322 in an on state.

After that, in the non-volatile memory circuit 100-2, operations from standby of the stored data signal to writing of the data signal into the volatile memory circuit 334 can be performed as in the non-volatile memory circuit 100-1 by performing operations similar to those in the non-volatile memory circuit 100-1 in the periods T3 to T5 in FIG. 4.

In this manner, data signals are held using the non-volatile memory circuit 100-1 and the non-volatile memory circuit 100-2 alternately, whereby the degree of deterioration of the transistors included in the non-volatile memory circuits can be substantially equalized.

Thus, even when the potentials of both the terminals of the volatile memory circuit are changed due to deterioration of the transistors included in the non-volatile memory circuits, the changes can be substantially equal to each other; accordingly, writing and reading of a data signal in the volatile memory circuit can be less affected.

This embodiment can be combined with any of the other embodiments as appropriate.

Embodiment 2

In Embodiment 1, an example of a structure applicable to the control circuit 124, the arithmetic circuit 126, and the register 128 which are included in the signal processing circuit is described with reference to FIG. 2 and the like.

In this embodiment, an example of a structure applicable to the control circuit 124, the arithmetic circuit 126, and the register 128, which is different from the above structure, will be described with reference to FIG. 8. Note that the control circuit 124, the arithmetic circuit 126, and the register 128 are also collectively referred to as a control portion. Here, at least one of the control circuit 124, the arithmetic circuit 126, and the register 128 includes a volatile memory circuit and plural pairs of non-volatile memory circuits corresponding to the volatile memory circuit.

<Example of Structure of Volatile Memory Circuit and Non-Volatile Memory Circuit>

Figure 8:
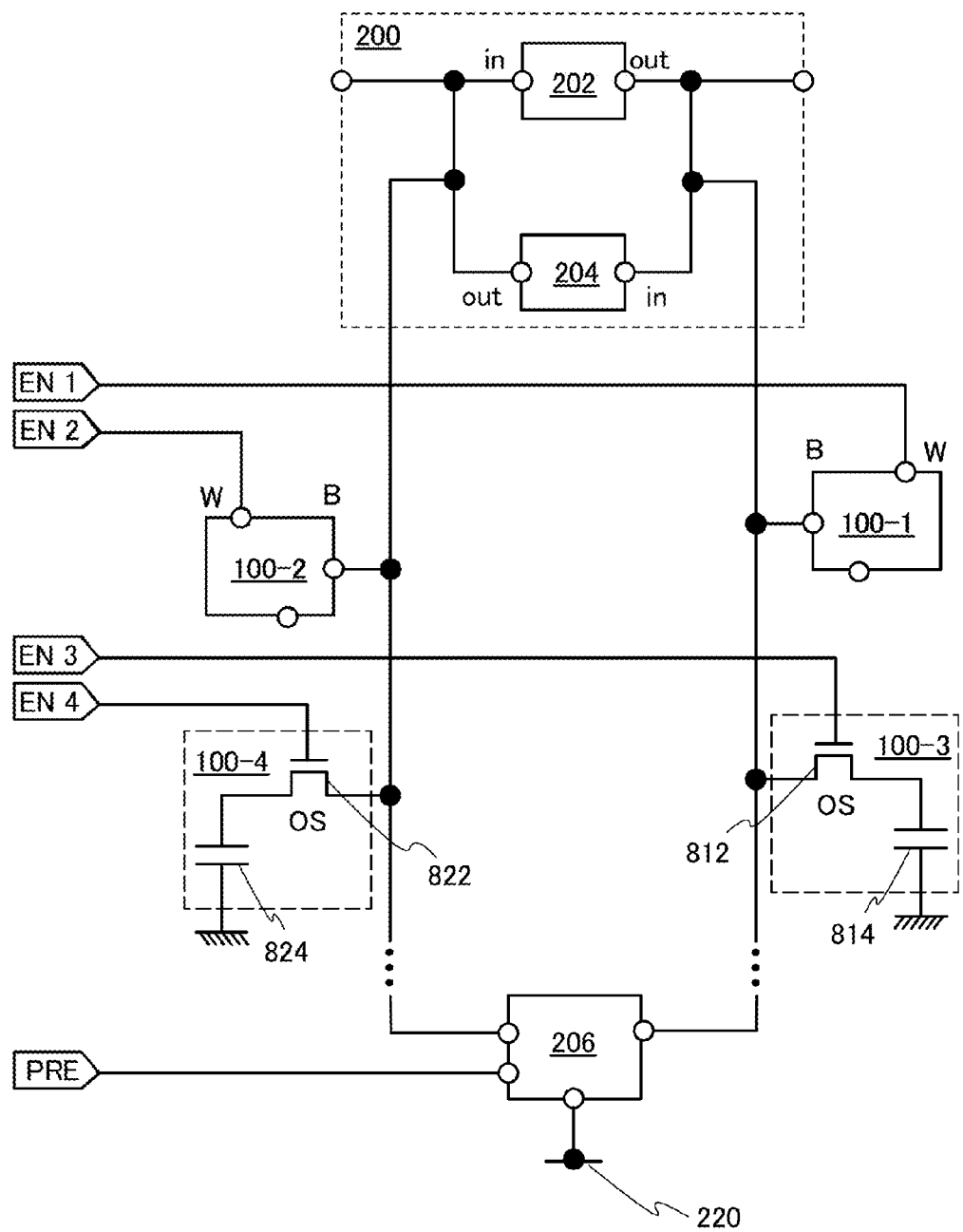
FIG. 8 illustrates an example of a signal processing circuit.

FIG. 8 illustrates an example in which one volatile memory circuit 200 that can store a 1-bit data signal is provided with a plurality of non-volatile memory circuits 100 in FIG. 1B.

In FIG. 8, one volatile memory circuit is provided with two pairs of non-volatile memory circuits (the non-volatile memory circuit 100-1 and the non-volatile memory circuit 100-2, and a non-volatile memory circuit 100-3 and a non-volatile memory circuit 100-4).

Although an example in which two pairs of non-volatile memory circuits are provided is described in this embodiment, the number of pairs of non-volatile memory circuits is not limited to two. One volatile memory circuit may be provided with three or more pairs of non-volatile memory circuits. Note that in the structure described in Embodiment 1, one volatile memory circuit is provided with one pair of non-volatile memory circuits.

For example, in the register 128 in FIG. 1A, the volatile memory circuit 200 that can store a 1-bit data signal can be provided with plural pairs of non-volatile memory circuits 100. In each of the control circuit 124 and the arithmetic circuit 126 in FIG. 1A, the volatile memory circuit 200 that can store a 1-bit data signal can be provided with one pair of non-volatile memory circuits 100.

In FIG. 8, the structures of the volatile memory circuit 200, the non-volatile memory circuit 100-1, and the non-volatile memory circuit 100-2 are the same as those in Embodiment 1, and thus description thereof is omitted.

In FIG. 8, the non-volatile memory circuit 100-3 includes a transistor 812 with significantly small off-state current and a capacitor 814.

One of a source and a drain of the transistor 812 is connected to one data latch terminal of the volatile memory circuit 200. The other of the source and the drain of the transistor 812 is connected to one terminal of the capacitor 814. A control signal (EN3) is input to a gate of the transistor 812.

The non-volatile memory circuit 100-4 includes a transistor 822 with significantly small off-state current and a capacitor 824.

One of a source and a drain of the transistor 822 is connected to the other data latch terminal of the volatile memory circuit 200. The other of the source and the drain of the transistor 822 is connected to one terminal of the capacitor 824. A control signal (EN4) is input to a gate of the transistor 822.

Note that the transistor 812 and the transistor 822 each correspond to the transistor 102 in FIG. 1B. The capacitor 814 and the capacitor 824 each correspond to the capacitor 104 in FIG. 1B.

The graphic symbol of ground in FIG. 8 signifies connection to a reference potential of the entire circuit.

The same potential may be input to the other terminals of the capacitor 314, the capacitor 324, the capacitor 814, and the capacitor 824. For example, a ground potential can be supplied to these terminals.

The transistors 312, 322, 812, and 822 with significantly small off-state current can be manufactured in the same process.

For example, gate electrodes of these transistors can be formed by etching of one conductive film; source electrodes and drain electrodes of these transistors can be formed by etching of one conductive film; and active layers (semiconductor layers where channel formation regions are formed) of these transistors can be formed by etching of one semiconductor layer.

In addition, the capacitor 314, the capacitor 324, the capacitor 814, and the capacitor 824 can be manufactured in the same process.

For example, electrodes functioning as one terminals of these capacitors can be formed by etching of one conductive film; dielectric layers of these capacitors can be formed by etching of one insulating film; and electrodes functioning as the other terminals of these capacitors can be formed by etching of one conductive film.

As in the case of the transistor 312 and the transistor 322, the precharge circuit 206 is connected to the one of the source and the drain of the transistor 812 and the one of the source and the drain of the transistor 822.

The structure of the precharge circuit 206 is similar to that in Embodiment 1, and thus description thereof is omitted.

<Method of Driving Volatile Memory Circuit and Non-Volatile Memory Circuit>

A method of driving the signal processing circuit in FIG. 8, which includes the volatile memory circuit 200 and the non-volatile memory circuits 100-1 to 100-4, will be described below. Note that the reference numerals in the drawings used in Embodiment 1 are also used in this embodiment.

First, a data signal is held by a feedback loop of the volatile memory circuit 200 (see the period T1 in FIG. 4 and FIG. 5A).

After that, the control signal (EN1) and the control signal (EN3) are input to the gate of the transistor 312 and the gate of the transistor 812, respectively, so that these transistors are turned on (see the period T2 in FIG. 4 and FIG. 5B).

The data signal is input from the one data latch terminal of the volatile memory circuit 200 to the one terminal of the capacitor 314 in the non-volatile memory circuit 100-1 via the transistor 312 in an on state. The data signal is input from the one data latch terminal of the volatile memory circuit 200 to the one terminal of the capacitor 814 in the non-volatile memory circuit 100-3 via the transistor 812 in an on state.

Consequently, the data signal held in the volatile memory circuit 200 can be stored in the non-volatile memory circuit 100-1 and the non-volatile memory circuit 100-3. In this manner, the data signal is stored (held) in the non-volatile memory circuit 100-1 and the non-volatile memory circuit 100-3.

Alternatively, in the case where the volatile memory circuit 200 holds different data signals in different periods, data signals for the respective periods can be stored in the different non-volatile memory circuits (the non-volatile memory circuit 100-1 and the non-volatile memory circuit 100-3).

In other words, the input timing is varied between the control signal (EN1) and the control signal (EN3) so as to correspond to the periods during which different data signals are held, whereby the transistor 312 and the transistor 812 can each be selectively turned on. Accordingly, data signals input to the respective one terminals of the capacitor 314 and the capacitor 814 can be different from each other.

For example, in the register 128, in the case where the volatile memory circuit 200 that can store a 1-bit data signal is provided with plural pairs of non-volatile memory circuits 100, the non-volatile memory circuits 100 can each be referred to as a bank. Thus, different data signals can be stored in the respective banks.

In the above description, the data signal is held by the feedback loop of the volatile memory circuit 200 and then the data signal is stored in the non-volatile memory circuit 100-1 and/or the non-volatile memory circuit 100-3 by turning on the transistor 312 and/or the transistor 812; however, this embodiment is not limited thereto.

The data signal may be stored in the non-volatile memory circuit 100-1 and/or the non-volatile memory circuit 100-3 by turning on the transistor 312 and/or the transistor 812 at the same time as holding of the data signal by the feedback loop of the volatile memory circuit 200.

Figure 6A:
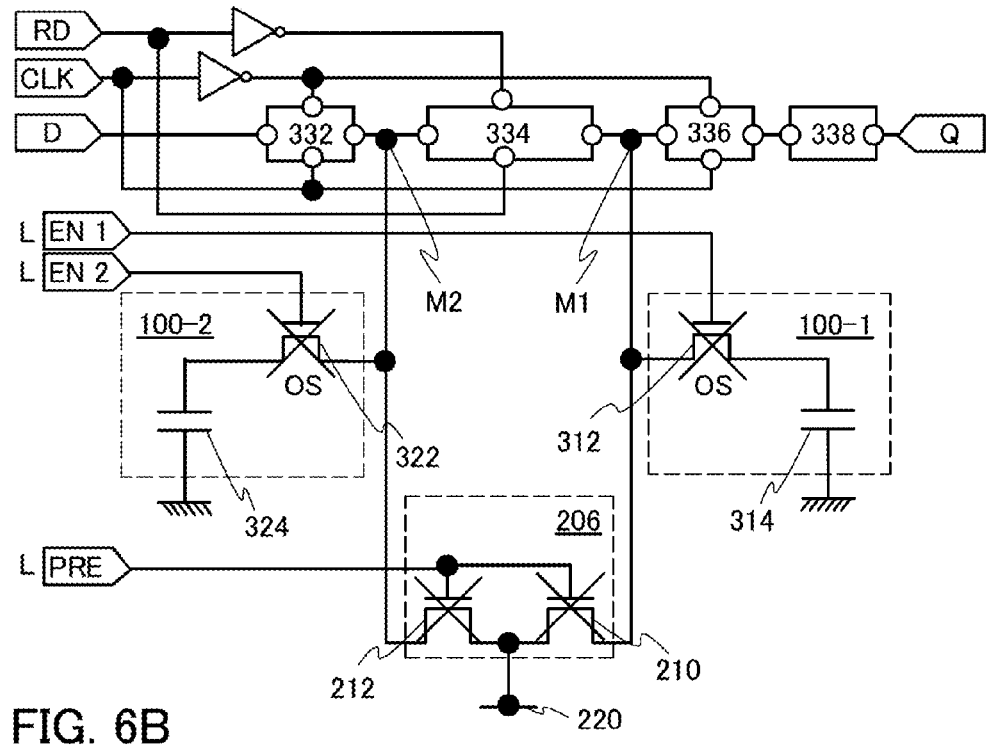
FIGS. 6A and 6B illustrate an example of a method of driving a signal processing circuit.

Next, input of the control signal (EN1) and the control signal (EN3) to the respective gates of the transistor 312 and the transistor 812 is stopped, so that the transistor 312 and the transistor 812 are turned off (see the period T3 in FIG. 4 and FIG. 6A).

Thus, the data signal stored in the non-volatile memory circuit 100-1 and the non-volatile memory circuit 100-3 becomes unable to be changed by a signal from the volatile memory circuit 200. In this manner, standby of the data signal stored in the non-volatile memory circuit 100-1 and the non-volatile memory circuit 100-3 can be performed.

After standby of the data signal is started, supply of the high power supply potential ($V_{dd}$) and input of the clock signal (S-CLK) are stopped.

Here, since the off-state current of each of the transistor 312 and the transistor 812 is significantly small, by turning off these transistors, the potential of one of the source and the drain of the transistor 312 and the potential of one of the source and the drain of the transistor 812 can be held even after supply of the high power supply potential ($V_{dd}$) is stopped. Accordingly, the non-volatile memory circuit 100-1 and the non-volatile memory circuit 100-3 can hold the data signal for a long time.

Note that the control signal (EN2) is not input to the gate of the transistor 322, the control signal (EN4) is not input to the gate of the transistor 822, and the precharge signal (S-PRE) is not input to the gates of the transistors 212 and 210 included in the precharge circuit 206; therefore, these transistors are in an off-state.

Figure 6B:
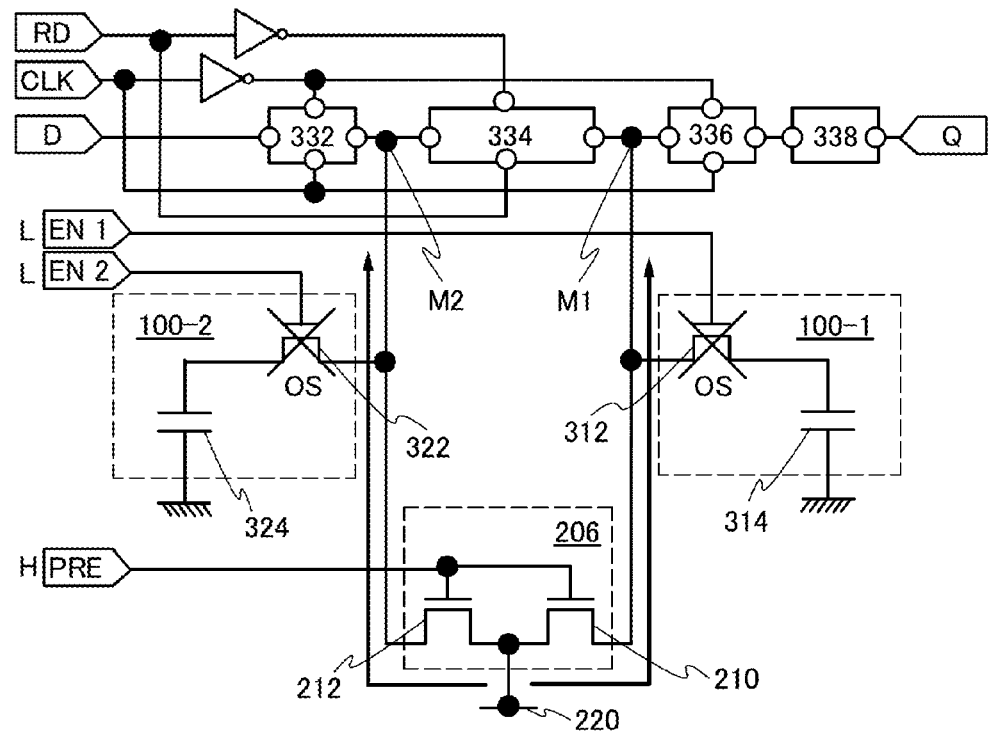

Next, the precharge signal (S-PRE) is input to the gates of the transistors 210 and 212 included in the precharge circuit 206 from the precharge signal input terminal PRE, so that the transistor 210 and the transistor 212 are turned on (see the period T4 in FIG. 4 and FIG. 6B).

Then, the potential ($V_{dd}/2$) that is a half of the high power supply potential ($V_{dd}$) is supplied from the precharge power supply line 220 to the other data latch terminal of the volatile memory circuit 200 via the transistor 212 in an on state.

Similarly, the potential ($V_{dd}/2$) that is a half of the high power supply potential ($V_{dd}$) is supplied from the precharge power supply line 220 to the one data latch terminal of the volatile memory circuit 200 via the transistor 210 in an on state.

Note that the control signal (EN1) and the control signal (EN3) are not input to the gate of the transistor 312 and the gate of the transistor 812, respectively; therefore, these transistors are in an off state. Thus, the data signal stored in the non-volatile memory circuit 100-1 and the non-volatile memory circuit 100-3 keeps being held.

The control signal (EN2) and the control signal (EN4) are not input to the gate of the transistor 322 and the gate of the transistor 822, respectively; therefore, these transistors are also in an off state.

After that, input of the precharge signal (S-PRE) is stopped upon completion of precharge. The precharge may be completed at any time before the transistor 312 and the transistor 812 are turned on.

Figure 7A:
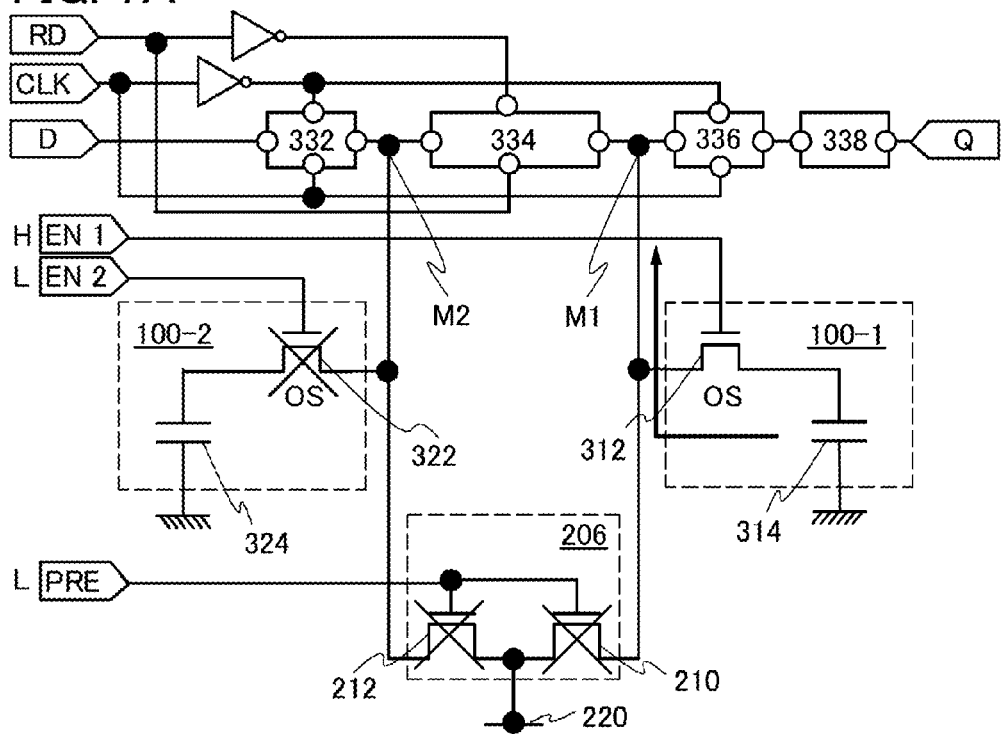
FIGS. 7A and 7B illustrate an example of a method of driving a signal processing circuit.

Next, the control signal (EN1) and the control signal (EN3) are input to the gate of the transistor 312 and the gate of the transistor 812, respectively, so that these transistors are turned on (see the period T5 in FIG. 4 and FIG. 7A).

Then, the potential (or corresponding electric charge) of the one terminal of the capacitor 314 and the potential (or corresponding electric charge) of the one terminal of the capacitor 814 are input to the one data latch terminal of the volatile memory circuit 200 via the transistors in an on state.

Consequently, the data signal held in the non-volatile memory circuit 100-1 and the non-volatile memory circuit 100-3 can be held by the feedback loop of the volatile memory circuit 200.

The data signal held in the volatile memory circuit 200 is input to the buffer circuit 338 via the switching circuit 336 in an on state, and then inverted in the buffer circuit 338 to be input to the output terminal Q.

Here, as described above, the one and the other of the data latch terminals of the volatile memory circuit 200 are precharged in advance, thereby having the potential ($V_{dd}/2$) that is a half of the high power supply potential ($V_{dd}$).

As a result, it is possible to detect even a slight change of the data signal which is read from the non-volatile memory circuit 100-1 and the non-volatile memory circuit 100-3 to the volatile memory circuit 200. Accordingly, the data signal can be read at high speed with high accuracy even when the capacitance of the capacitor 314 and the capacitance of the capacitor 814 are not high.

Alternatively, in the case where the non-volatile memory circuits (the non-volatile memory circuit 100-1 and the non-volatile memory circuit 100-3) hold different data signals, the data signals can be sequentially read to the volatile memory circuit 200.

In other words, the input timing is varied between the control signal (EN1) and the control signal (EN3), whereby the transistor 312 and the transistor 812 can each be selectively turned on. Accordingly, data signals held in the respective one terminals of the capacitor 314 and the capacitor 814 can be read in different periods.

In this embodiment, not only one terminal of the volatile memory circuit is provided with a non-volatile memory circuit; the one and the other of the data latch terminals of the volatile memory circuit 200 are provided with the non-volatile memory circuit 100-1 and the non-volatile memory circuit 100-2, respectively. In a similar manner, both the terminals of the volatile memory circuit 200 are provided with the corresponding one of the non-volatile memory circuit 100-3 and the non-volatile memory circuit 100-4. Thus, the plurality of non-volatile memory circuits is arranged in parallel with respect to the volatile memory circuit 200.

Here, in the case where only one terminal of the volatile memory circuit is provided with a non-volatile memory circuit, the one terminal of the volatile memory circuit is affected by a transistor included in the non-volatile memory circuit. For example, the potential of the one terminal of the volatile memory circuit might be changed by the parasitic capacitance of a gate of the transistor included in the non-volatile memory circuit. In this case, a data signal cannot be written into the volatile memory circuit accurately.

In contrast, the one and the other of the data latch terminals of the volatile memory circuit 200 described in this embodiment are provided with the pairs of non-volatile memory circuits. Specifically, the non-volatile memory circuit 100-1 and the non-volatile memory circuit 100-3 are connected to the one data latch terminal of the volatile memory circuit 200, and the non-volatile memory circuit 100-2 and the non-volatile memory circuit 100-4 are connected to the other data latch terminal.

Therefore, effects of the transistor 312 and the transistor 812 on the one data latch terminal of the volatile memory circuit 200 can be substantially equal to effects of the transistor 322 and the transistor 822 on the other data latch terminal of the volatile memory circuit 200.

Thus, even when the potentials of both the terminals of the volatile memory circuit are changed due to the transistors included in the non-volatile memory circuits, the changes can be substantially equal to each other; accordingly, writing and reading of a data signal in the volatile memory circuit can be less affected.

Figure 7B:
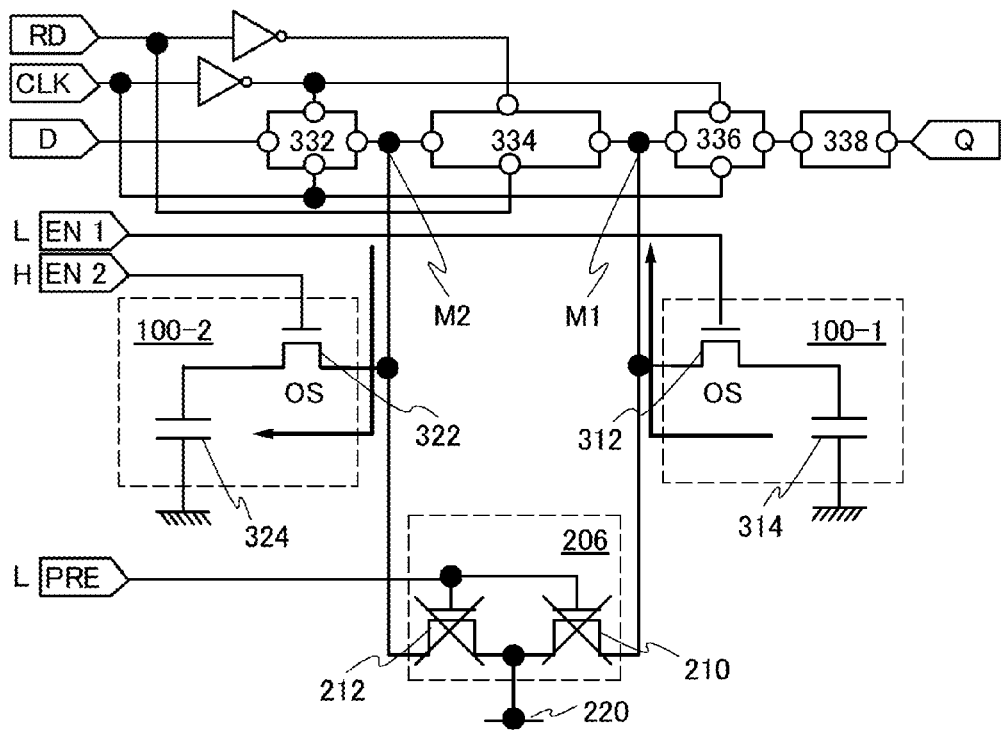

Next, the control signal (EN2) and the control signal (EN4) are input to the gate of the transistor 322 and the gate of the transistor 822, respectively, so that these transistors are turned on (see the period T6 in FIG. 4 and FIG. 7B).

Thus, a data signal written into the volatile memory circuit 200 can be stored in the capacitor 324 and the capacitor 824 via the transistors in an on state.

After that, in each of the non-volatile memory circuit 100-2 and the non-volatile memory circuit 100-4, operations from standby of the stored data signal to writing of the data signal into the volatile memory circuit 200 can be performed as in the non-volatile memory circuit 100-1 by performing operations similar to those in the non-volatile memory circuit 100-1 in the periods T3 to T5 in FIG. 4.

In this manner, data signals are held using the non-volatile memory circuit 100-1 and the non-volatile memory circuit 100-3, and the non-volatile memory circuit 100-2 and the non-volatile memory circuit 100-4 alternately, whereby the degree of deterioration of the transistors included in the non-volatile memory circuits can be substantially equalized.

Alternatively, data signals may be held by sequentially using the non-volatile memory circuits 100-1 to 100-4. Accordingly, the degree of deterioration of the transistors included in the non-volatile memory circuits can be substantially equalized.

Thus, even when the potentials of both the terminals of the volatile memory circuit are changed due to the transistors included in the non-volatile memory circuits, the changes can be substantially equal to each other; accordingly, writing and reading of a data signal in the volatile memory circuit can be less affected.

This embodiment can be combined with any of the other embodiments as appropriate.

Embodiment 3

In Embodiments 1 and 2, examples of a structure applicable to the control circuit 124, the arithmetic circuit 126, and the register 128 which are included in the signal processing circuit are described with reference to FIG. 2, FIG. 8, and the like.

In this embodiment, a structure in which a volatile memory circuit is also used as a latch circuit of a flip-flop circuit will be described with reference to FIG. 9.

Figure 9:
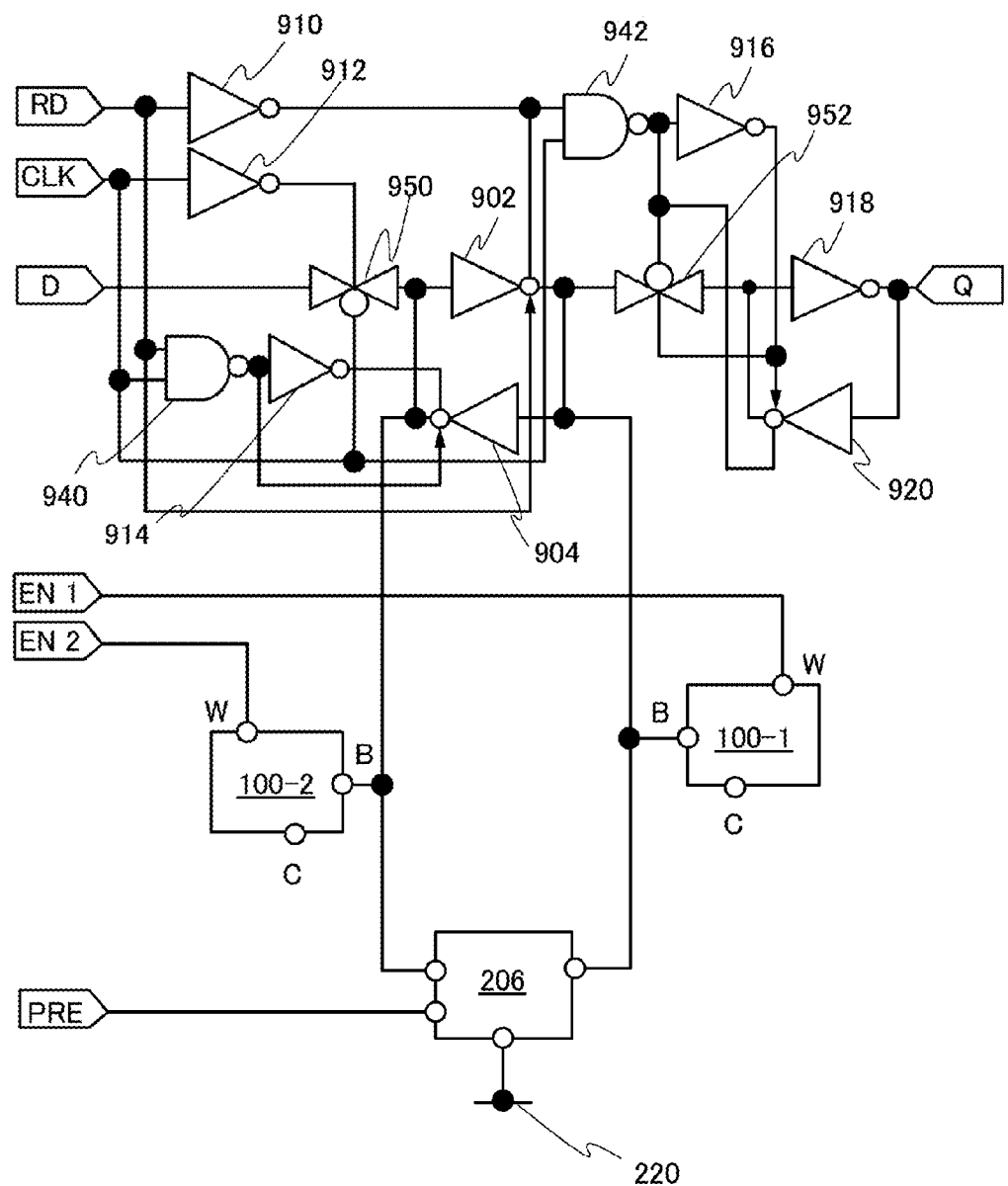
FIG. 9 illustrates an example of a signal processing circuit.

FIG. 9 illustrates an inverter circuit 902 and an inverter circuit 904 which form a volatile memory circuit. These inverter circuits correspond to the arithmetic circuit 202 and the arithmetic circuit 204 described in Embodiment 1 with reference to FIG. 2.

A DRAM circuit can be formed using the volatile memory circuit (the inverter circuit 902 and the inverter circuit 904) and the pair of non-volatile memory circuits (the non-volatile memory circuit 100-1 and the non-volatile memory circuit 100-2). Note that the number of pairs of non-volatile memory circuits is not limited to one.

Further, a flip-flop circuit illustrated in FIG. 9 includes an inverter circuit 910, an inverter circuit 912, an inverter circuit 914, an inverter circuit 916, an inverter circuit 918, an inverter circuit 920, a NAND circuit 940, a NAND circuit 942, a switching circuit 950, a switching circuit 952, the inverter circuit 902, and the inverter circuit 904. The inverter circuit 902 and the inverter circuit 904 can form a latch circuit.

The inverter circuits are shared by the flip-flop circuit and the volatile memory circuit included in the DRAM circuit in this manner, whereby the size of a signal processing device can be reduced.

This embodiment can be combined with any of the other embodiments as appropriate.

Embodiment 4

In this embodiment, an example of a structure of the memory described in Embodiment 1 will be described with reference to FIGS. 10A and 10B, FIGS. 11A and 11B, and FIG. 12.

<Structure of Memory>

Figure 10A:
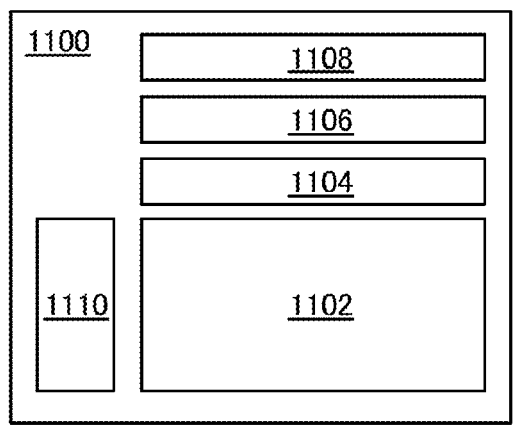
FIGS. 10A and 10B illustrate an example of a structure of a memory.

FIG. 10A illustrates an example of a structure of a memory. In FIG. 10A, a memory 1100 includes a memory cell array 1102 having a matrix of a plurality of non-volatile memory circuits.

Further, the memory 1100 can include at least one of a sense amplifier circuit 1104, a precharge circuit 1106, a column decoder 1108, and a row decoder 1110.

Note that one circuit may involve some functions of these circuits. For example, the sense amplifier circuit 1104 may temporarily function as a memory circuit.

Note that the arrangement of the circuits is not limited to the arrangement schematically illustrated in FIG. 10A, which is merely an example of the structure of the memory 1100.

FIG. 10A illustrates a structure in which the sense amplifier circuit 1104 and the precharge circuit 1106 are provided on the column decoder 1108 side of the memory cell array 1102; the arrangement of the sense amplifier circuit 1104 and the precharge circuit 1106 is not limited thereto.

The sense amplifier circuit 1104, the precharge circuit 1106, or both may be provided on the side opposite to the column decoder 1108 side of the memory cell array 1102. Further, the sense amplifier circuit 1104 and the precharge circuit 1106 may be integrated to form one circuit.

Further, the memory cell array 1102 may overlap with at least one of the other circuits (the sense amplifier circuit 1104, the precharge circuit 1106, the column decoder 1108, and the row decoder 1110). In addition, the memory cell array 1102 may be divided and the divided memory cell arrays may be stacked to overlap with each other (may be multilayered). Such an arrangement enables the memory capacity to be increased while the area of the memory cell array 1102 is reduced.

<Structure of Memory Cell Array>

Figure 10B:
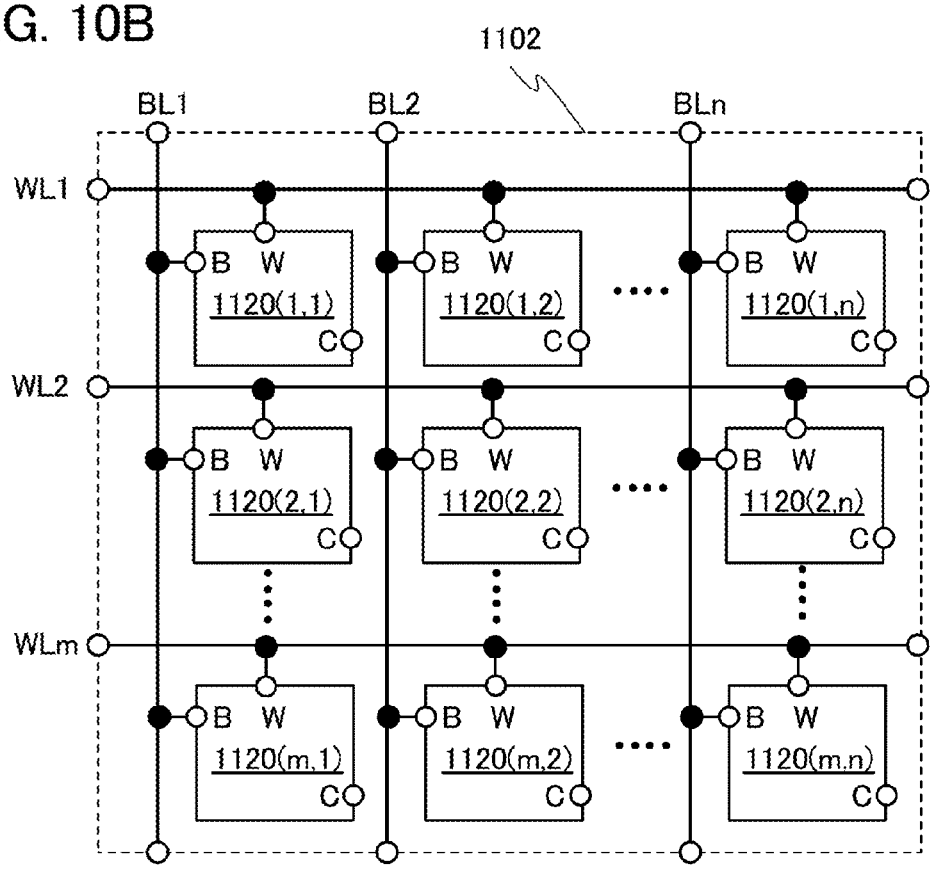

FIG. 10B illustrates an example of a structure of the memory cell array 1102. The memory cell array 1102 in FIG. 10B includes m×n (m is a natural number and n is a natural number) non-volatile memory circuits 1120(i,j) (i is a natural number less than or equal to m and j is a natural number less than or equal to n). The non-volatile memory circuit 100 illustrated in FIG. 1B can be used as the non-volatile memory circuit 1120($i,j$). Hereinafter, the non-volatile memory circuit 1120($i,j$) is also referred to as a memory cell.

As illustrated in FIG. 10B, terminals B of a plurality of memory cells arranged in one column (j-th column) are connected to one wiring (BLj) and share the wiring (BLj). For example, terminals B of a plurality of memory cells arranged in a first column are connected to a wiring (BL1) and share the wiring (BL1). Here, the wiring (BLj) is also referred to as a bit line.

As illustrated in FIG. 10B, terminals W of a plurality of memory cells arranged in one row (i-th row) are connected to one wiring (WLi) and share the wiring (WLi). For example, terminals W of a plurality of memory cells arranged in a first row are connected to a wiring (WL1) and share the wiring (WL1). Here, the wiring (WLi) is also referred to as a word line.

Note that the structure of the memory cell array 1102 is not limited thereto. A plurality of wirings (BLj) connected to the respective memory cells arranged in one column may be provided. A plurality of wirings (WLi) connected to the respective memory cells arranged in one row may be provided. Further, terminals C of the m×n memory cells may be connected to one electrode or one wiring. Alternatively, the terminals C of the m×n memory cells may be connected to different electrodes or different wirings.

In the memory cell array 1102 illustrated in FIG. 10B, a data signal is selectively written into and read from the memory cells arranged in a row specified by a signal input to the wiring (WLi).

Specifically, transistors in the memory cells other than the memory cell into which a data signal is written are turned off, and a transistor in the memory cell into which the data signal is written is turned on by a signal input to the wiring (WLi); thus, the data signal is selectively written into the memory cell.

Further, the transistors in the memory cells other than the memory cell from which the data signal is read are turned off, and the transistor in the memory cell from which the data signal is read is turned on by a signal input to the wiring (WLi); thus, the data signal is selectively read from the memory cell.

A method of writing and reading a data signal into and from a specified memory cell is similar to the method of driving the non-volatile memory circuit 100 which is described above, and thus description thereof is omitted.

<Structure of Decoder>

The row decoder 1108 and the column decoder 1110 have a function of selecting a given memory cell in the memory cell array 1102. In the memory cell selected by the column decoder 1108 and the row decoder 1110, writing and reading of a data signal are performed.

<Structure of Precharge Circuit>

The precharge circuit 1106 has a function of setting the potential of (precharging) the bit line provided in the memory cell array 1102 to a predetermined potential before a data signal is read from the memory cell. Since the data signal is read from the memory cell after the potential of the bit line is set to the predetermined potential by the precharge circuit 1106, the speed of reading the data signal from the memory cell can be increased.

<Structure of Sense Amplifier Circuit>

The sense amplifier circuit 1104 has a function of amplifying the potential of the bit line that corresponds to a data signal held in the memory cell and outputting the amplified potential. The data signal can be read more quickly and accurately by the sense amplifier circuit 1104.

The sense amplifier circuit 1104 includes a plurality of sense amplifiers. Each of the plurality of sense amplifiers can be provided to correspond to one of the bit lines arranged in the memory cell array 1102.

The potentials of the bit lines can be amplified by the sense amplifiers, and the amplified potential can be detected from an output terminal of each of the sense amplifiers. Here, the potential of the bit line is based on a signal potential held in a memory cell which is connected to the bit line and from which a data signal is read. Thus, a signal (an amplified signal) output from the output terminal of the sense amplifier corresponds to the data signal held in the memory cell from which the data signal is read. In this manner, data signals held in the plurality of memory cells in the memory cell array 1102 can be detected by the sense amplifier circuit 1104.

The sense amplifier can be formed using an inverter circuit or a buffer circuit, for example.

Further, the sense amplifier circuit can include a latch circuit. A sense amplifier circuit with such a structure is also referred to as a latch-type sense amplifier circuit.

The latch-type sense amplifier circuit can amplify an input signal with a latch circuit therein and can hold the amplified signal. Thus, even when electric charge corresponding to a signal potential held in a capacitor in the memory cell (the non-volatile memory circuit 1120($i,j$)) is changed (even when destructive reading is caused) at the time of reading data from the memory cell, a signal having a potential corresponding to the signal potential can be held in the latch circuit and can be written into the memory cell again.

Other than the structure including a latch circuit, the sense amplifier circuit 1104 may have a structure including a page buffer circuit. In this case, the sense amplifier circuit 1104 can temporarily have a function of a memory circuit. For example, the sense amplifier circuit 1104 can have a function of temporarily holding a data signal input from the outside of the memory 1100. The sense amplifier circuit 1104 can also have a function of holding a data signal read from the memory cell array.

An example of a structure of the sense amplifier circuit 1104 using a latch circuit will be described with reference to FIGS. 11A and 11B.

Figure 11A:
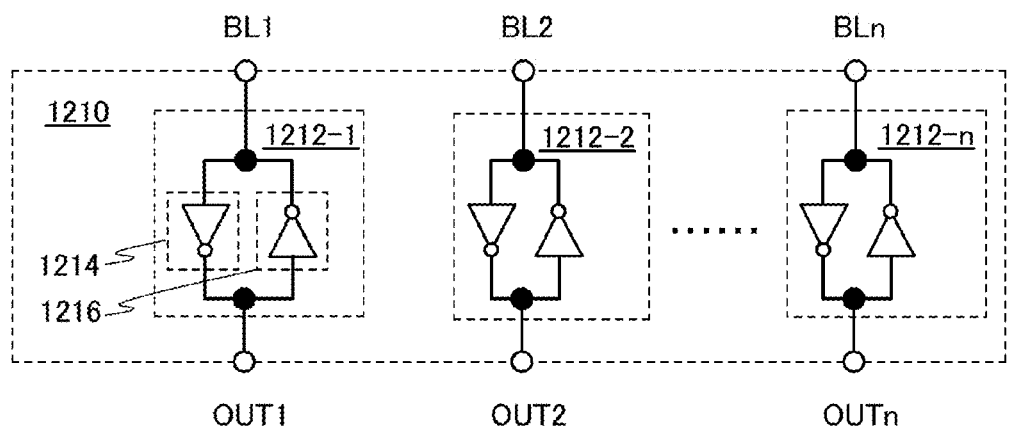
FIGS. 11A and 11B each illustrate an example of a structure of a memory.
Figure 11B:
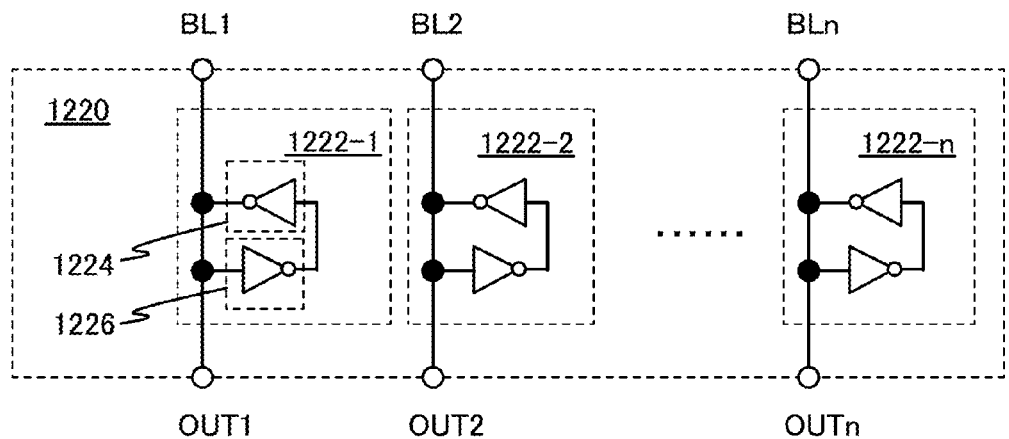

Sense amplifier circuits illustrated in FIGS. 11A and 11B are each an example of a latch-type sense amplifier circuit which includes a latch circuit.

The latch-type sense amplifier circuit can include two inverter circuits, for example. A sense amplifier circuit 1210 illustrated in FIG. 11A includes n latch circuits 1212-1 to 1212-*n* each including two inverter circuits (an inverter circuit 1214 and an inverter circuit 1216). A sense amplifier circuit 1220 illustrated in FIG. 11B includes n latch circuits 1222-1 to 1222-*n* each including two inverter circuits (an inverter circuit 1224 and an inverter circuit 1226).

The potentials of the bit lines (BL1) to (BLn) can be amplified by the n latch circuits, and the amplified potentials can be output from output terminals (OUT1) to (OUTn).

As each of the n latch circuits, the latch circuit 1212 illustrated in FIG. 11A or the latch circuit 1222 illustrated in FIG. 11B can be used.

Here, the potential of the bit line is based on a signal potential held in a memory cell which is connected to the bit line and from which a data signal is read. Thus, a signal (an amplified signal) output from the output terminal of each of the latch circuits corresponds to the data signal held in the memory cell from which the data signal is read. In this manner, data signals held in the memory cells in the memory cell array 1102 can be detected by the n latch circuits.

Further, each of the n latch circuits can hold an amplified signal. Thus, even when electric charge corresponding to a signal potential held in a capacitor in the memory cell in the memory cell array 1102 is changed (even when destructive reading is caused) at the time of reading data from the memory cell, a corresponding signal can be held in corresponding one of the n latch circuits and can be written into the memory cell again.

<Structure of Precharge Circuit>

An example of a structure of the precharge circuit 1106 will be described with reference to FIG. 12.

Figure 12:
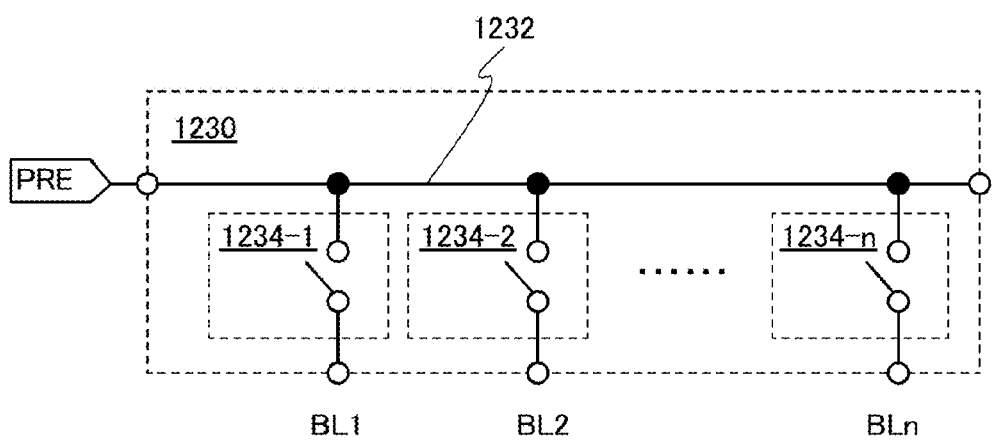
FIG. 12 illustrates an example of a structure of a memory.

In FIG. 12, a precharge circuit 1230 includes a precharge line 1232 to which a precharge signal (S-PRE) is input from a precharge signal input terminal PRE, and n switching circuits 1234-1 to 1234-*n*.

Each of the n switching circuits 1234 can be provided to correspond to one of the bit lines (BL1) to (BLn) arranged in the memory cell array 1102. Electrical connection between the bit line and the precharge line 1232 is selected by the switching circuit 1234, and the potential (the potential of the precharge signal (S-PRE)) of the precharge line 1232 can be input to the bit line.

As the switching circuit 1234, an analog switch or a transistor can be used, for example. As the switching circuit 1234, an arithmetic circuit to which a clock signal, an inverted signal of the clock signal, or both the clock signal and the inverted signal of the clock signal are input can be used.

This embodiment can be combined with any of the other embodiments as appropriate.

Embodiment 5

Figure 13:
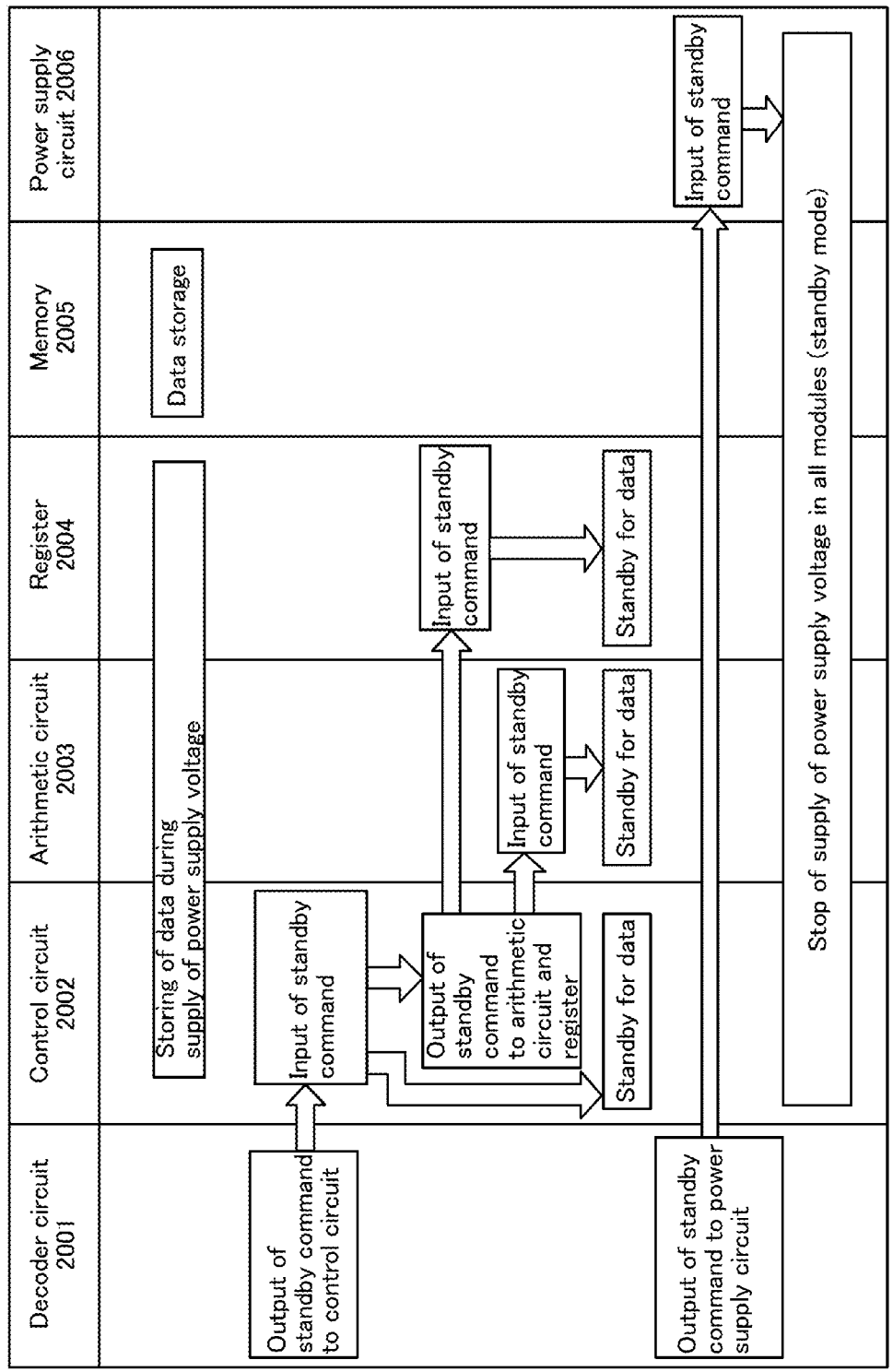
FIG. 13 shows an example of a method of operating a signal processing circuit.
Figure 14:
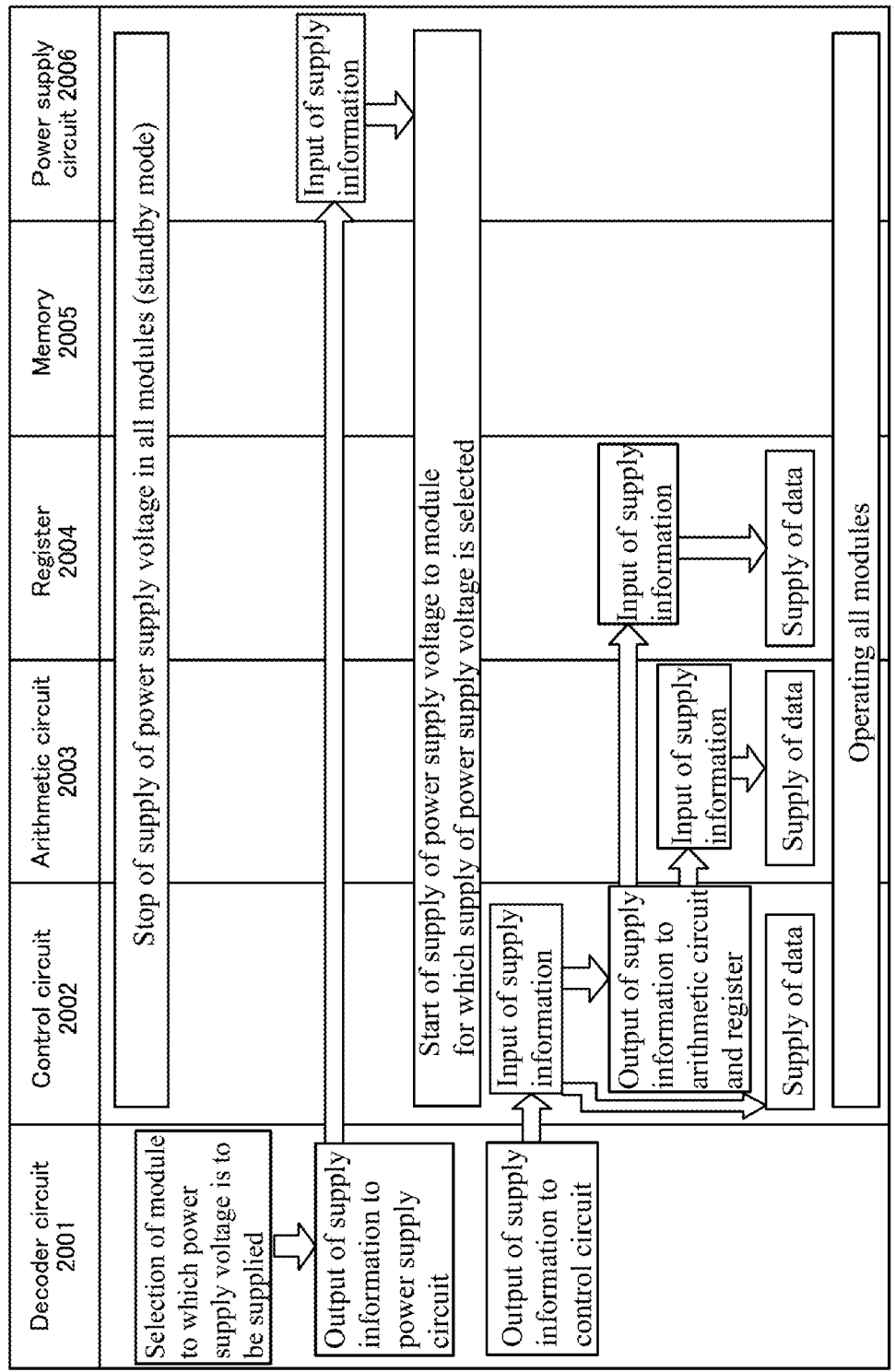
FIG. 14 shows an example of a method of operating a signal processing circuit.
Figure 15:
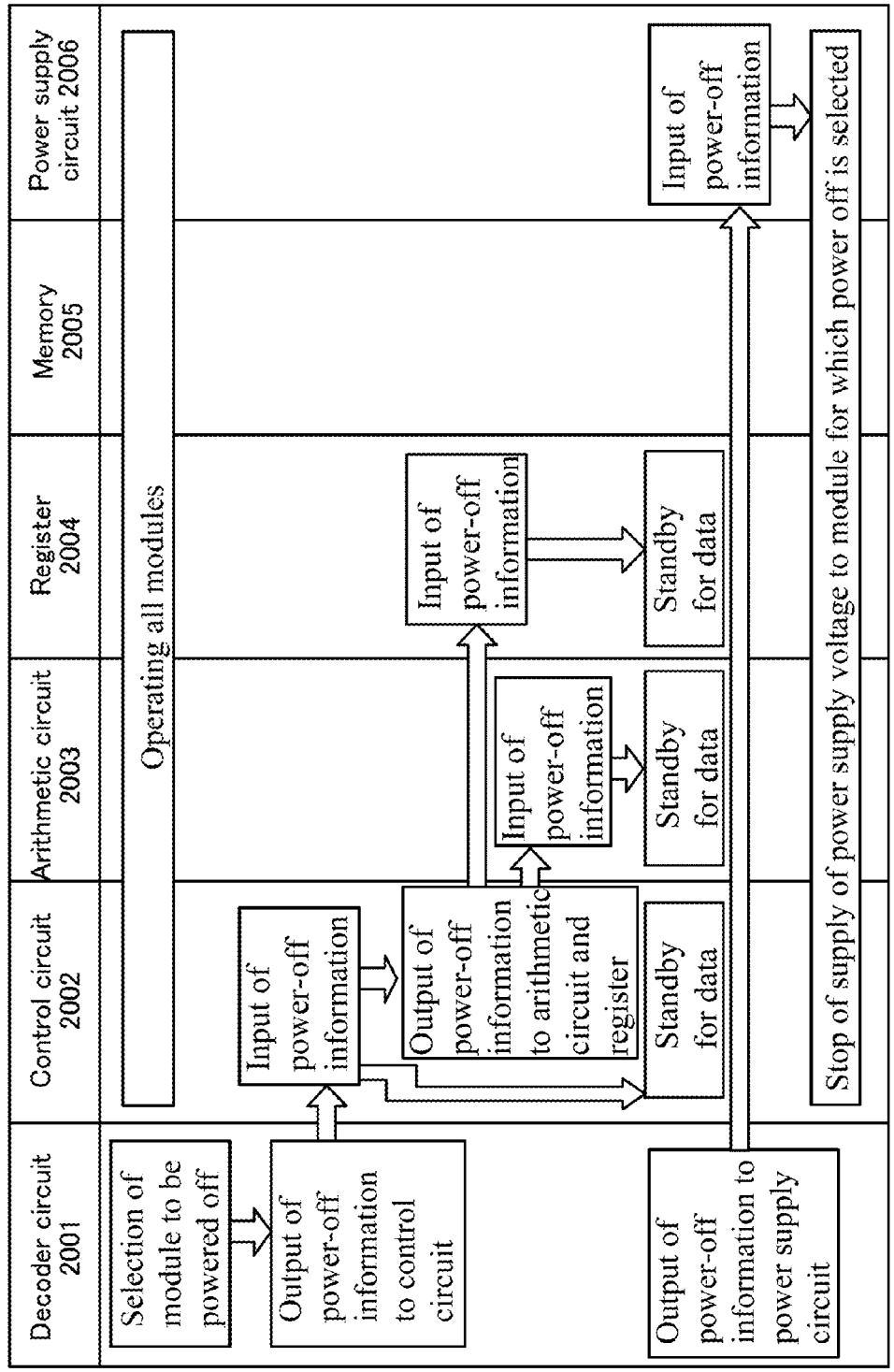
FIG. 15 shows an example of a method of operating a signal processing circuit.

In this embodiment, an example of a method of operating a signal processing circuit will be described with reference to FIG. 13, FIG. 14, and FIG. 15. FIG. 13, FIG. 14, and FIG. 15 are flowcharts showing a normally-off operation method.

Note that a normally-off operation method in this embodiment refers to an operation method in which power supply voltage is supplied only when needed to operate all or some modules in a signal processing circuit.

FIG. 13, FIG. 14, and FIG. 15 are flowcharts showing operation of a decoder circuit 2001, a control circuit 2002, an arithmetic circuit 2003, a register 2004, a memory 2005, and a power supply circuit 2006 which are included in a signal processing circuit. In this embodiment, the control circuit 2002, the arithmetic circuit 2003, the register 2004, and the memory 2005 may each be referred to as a module. Note that the control circuit 2002, the arithmetic circuit 2003, and the register 2004 are also collectively referred to as a control portion.

In addition, the decoder circuit 122, the control circuit 124, the arithmetic circuit 126, the register 128, the memory 130, and the power supply circuit 132, which are described in Embodiment 1 with reference to FIG. 1A, can be used as the decoder circuit 2001, the control circuit 2002, the arithmetic circuit 2003, the register 2004, the memory 2005, and the power supply circuit 2006, respectively.

First, operation of the signal processing circuit until supply of power supply voltage is stopped in all the modules in the signal processing circuit (also referred to as a standby mode) will be described with reference to FIG. 13.

While the power supply voltage is supplied to the signal processing circuit, operation for storing a data signal is performed in each of the control circuit 2002, the arithmetic circuit 2003, and the register 2004 ("Storing of data during supply of power supply voltage" in FIG. 13). The operation for storing a data signal in the control circuit 2002, the arithmetic circuit 2003, and the register 2004 is similar to that in Embodiment 1 and the like, and thus description thereof is omitted. In addition, the data signal is written into the memory 2005 ("Data storage" in FIG. 13).

After that, the decoder circuit 2001 outputs a command to stop supply of the power supply voltage in all the modules (hereinafter referred to as a standby command) to the control circuit 2002 ("Output of standby command to control circuit" in FIG. 13).

The standby command is input to the control circuit 2002 from the decoder circuit 2001 ("Input of standby command" in FIG. 13). On the basis of the input standby command, the control circuit 2002 outputs a standby command to all the modules.

In FIG. 13, in order to stop supply of the power supply voltage in the control circuit 2002, the arithmetic circuit 2003, the register 2004, and the memory 2005, the control circuit 2002 outputs a standby command to the arithmetic circuit 2003 and the register 2004 ("Output of standby command to arithmetic circuit and register" in FIG. 13).

In parallel with the output of the standby command, at least one of a pair of non-volatile memory circuits corresponding to a volatile memory circuit included in the control circuit 2002 is set on standby for the data signal of the volatile memory circuit ("Standby for data" in FIG. 13). The structures of the volatile memory circuit and the pair of non-volatile memory circuits which are included in the control circuit 2002 and the operation for standby for the data signal are similar to those in Embodiment 1 and the like, and thus description thereof is omitted.

When the standby command is input from the control circuit 2002 to the arithmetic circuit 2003 ("Input of standby command" in FIG. 13), in the arithmetic circuit 2003, at least one of a pair of non-volatile memory circuits corresponding to a volatile memory circuit is set on standby for the data signal of the volatile memory circuit ("Standby for data" in FIG. 13). The structures of the volatile memory circuit and the pair of non-volatile memory circuits which are included in the arithmetic circuit 2003 and the operation for standby for the data signal are similar to those in Embodiment 1 and the like, and thus description thereof is omitted.

When the standby command is input from the control circuit 2002 to the register 2004 ("Input of standby command" in FIG. 13), in the register 2004, at least one of a pair of non-volatile memory circuits corresponding to a volatile memory circuit is set on standby for the data signal of the volatile memory circuit ("Standby for data" in FIG. 13). The structures of the volatile memory circuit and the pair of non-volatile memory circuits which are included in the register 2004 and the operation for standby for the data signal are similar to those in Embodiment 1 and the like, and thus description thereof is omitted.

In this manner, standby for the data signal is completed in the control circuit 2002, the arithmetic circuit 2003, and the register 2004.

After completion of standby for the data signal, the decoder circuit 2001 outputs a standby command to the power supply circuit 2006 ("Output of standby command to power supply circuit" in FIG. 13).

When the standby command is input from the decoder circuit 2001 to the power supply circuit 2006 ("Input of standby command" in FIG. 13), the power supply circuit 2006 stops supply of the power supply voltage to the modules on the basis of the standby command ("Stop of supply of power supply voltage in all modules (standby mode)" in FIG. 13).

Note that as described in Embodiment 1, the memory 2005 includes, as a memory cell, a non-volatile memory circuit which can continue to hold a data signal even after supply of the power supply voltage is stopped. Therefore, in the signal processing circuit in this embodiment, supply of the power supply voltage can be stopped without making a backup of a data signal or the like.

Here, stop of supply of power supply voltage refers to, in the case where voltage corresponding to a difference between a high power supply potential and a low power supply potential is supplied to a module as a power supply potential, operation for stopping supply of one of the potentials or operation for making one of the potentials the same as the other of the potentials.

In the above manner, supply of the power supply voltage is stopped in all the modules in the signal processing circuit (standby mode).

Next, the following operation of the signal processing circuit will be described with reference to FIG. 14: a module to be supplied with the power supply voltage is selected after supply of the power supply voltage is stopped in all the modules, supply of the power supply voltage to the selected module is started, and the module starts operating.

First, the decoder circuit 2001 selects a module to which the power supply voltage is to be supplied ("Selection of module to which power supply voltage is to be supplied" in FIG. 14).

Historical information on commands which have been received by the decoder circuit 2001 can be used for this selection. For example, a module which is to be operated may be predicted and supply of the power supply voltage to the module may be selected.

FIG. 14 shows an example in which supply of the power supply voltage is restarted in the control circuit 2002, the arithmetic circuit 2003, the register 2004, and the memory 2005. Note that the power supply voltage can be selectively supplied to some of these modules.

After the module to which the power supply voltage is to be supplied is selected, the decoder circuit 2001 outputs information on which module is to be supplied with the power supply voltage (also referred to as supply information) to the power supply circuit 2006 ("Output of supply information to power supply circuit" in FIG. 14).

When the supply information is input from the decoder circuit 2001 to the power supply circuit 2006 ("Input of supply information" in FIG. 14), the power supply circuit 2006 supplies the power supply voltage to the module on the basis of the supply information ("Start of supply of power supply voltage to module for which supply of power supply voltage is selected" in FIG. 14). Note that in the case where the memory 2005 is selected as the module to which the power supply voltage is to be supplied, the power supply voltage is also supplied to the memory 2005.

After the power supply voltage is supplied, the decoder circuit 2001 outputs supply information to the control circuit 2002 ("Output of supply information to control circuit" in FIG. 14).

The supply information is input to the control circuit 2002 from the decoder circuit 2001 ("Input of supply information" in FIG. 14). On the basis of the input supply information, the control circuit 2002 outputs supply information to the module to which the power supply voltage is supplied.

In FIG. 14, in order to supply the power supply voltage to the control circuit 2002, the arithmetic circuit 2003, the register 2004, and the memory 2005, the control circuit 2002 outputs the supply information to the arithmetic circuit 2003 and the register 2004 ("Output of supply information to arithmetic circuit and register" in FIG. 14).

In parallel with the output of the supply information, the data signal of at least one of the pair of non-volatile memory circuits included in the control circuit 2002 is input to the volatile memory circuit corresponding to the pair of non-volatile memory circuits ("Supply of data" in FIG. 14). The structures of the volatile memory circuit and the pair of non-volatile memory circuits which are included in the control circuit 2002 and the operation for supplying the data signal are similar to those in Embodiment 1 and the like, and thus description thereof is omitted.

When the supply information is input from the control circuit 2002 to the arithmetic circuit 2003 ("Input of supply information" in FIG. 14), in the arithmetic circuit 2003, the data signal of at least one of the pair of non-volatile memory circuits is input to the volatile memory circuit corresponding to the pair of non-volatile memory circuits ("Supply of data" in FIG. 14). The structures of the volatile memory circuit and the pair of non-volatile memory circuits which are included in the arithmetic circuit 2003 and the operation for supplying the data signal are similar to those in Embodiment 1 and the like, and thus description thereof is omitted.

When the supply information is input from the control circuit 2002 to the register 2004 ("Input of supply information" in FIG. 14), in the register 2004, the data signal of at least one of the pair of non-volatile memory circuits is input to the volatile memory circuit corresponding to the pair of non-volatile memory circuits ("Supply of data" in FIG. 14). The structures of the volatile memory circuit and the pair of non-volatile memory circuits which are included in the register 2004 and the operation for supplying the data signal are similar to those in Embodiment 1 and the like, and thus description thereof is omitted.

Note that as described in Embodiment 1 and the like, the memory 2005 includes, as a memory cell, a non-volatile memory circuit which can continue to hold a data signal even after supply of the power supply voltage is stopped.

In this manner, the power supply voltage can be supplied to the control circuit 2002, the arithmetic circuit 2003, the register 2004, and the memory 2005, and these modules can be operated to perform predetermined processing immediately ("Operating all modules" in FIG. 14).

Although FIG. 14 shows an example in which the power supply voltage is supplied to the control circuit 2002, the arithmetic circuit 2003, the register 2004, and the memory 2005, the operation of the signal processing circuit in this embodiment is not limited thereto.

While the power supply voltage is supplied to some of these modules, supply of the power supply voltage can be stopped in the other modules. In this case, operation for inputting the data signal can be performed only in the modules to which the power supply voltage is supplied on the basis of the supply information, and these modules can be selectively operated.

In the above manner, all or some of the modules in the signal processing circuit are operated.

Next, operation of the signal processing circuit, from the state where the modules start operating to the state where supply of the power supply voltage is stopped in the modules, will be described with reference to FIG. 15.

First, the decoder circuit 2001 selects a module in which supply of the power supply voltage is to be stopped ("Selection of module to be powered off" in FIG. 15).

Historical information on commands which have been received by the decoder circuit 2001 and the supply information which have been output from the decoder circuit 2001 can be used for this selection.

For example, in the case where there is historical information on successive reception of commands which do not require operation of a specific module and the power supply voltage is supplied to the module on the basis of the supply information, supply of the power supply voltage to the module may be stopped by selecting the module with the decoder circuit 2001 on the prediction that the module is not operated for a while.

Further, the decoder circuit 2001 can acquire up-to-date historical information every given period.

FIG. 15 shows an example in which supply of the power supply voltage to all the modules (the control circuit 2002, the arithmetic circuit 2003, the register 2004, and the memory 2005) is stopped after the power supply voltage is supplied to all these modules ("Operating all modules" in FIG. 15). Note that supply of the power supply voltage can be selectively stopped in some of these modules.

After the module in which supply of the power supply voltage is to be stopped is selected, the decoder circuit 2001 outputs information on in which module supply of the power supply voltage is to be stopped (also referred to as power-off information) to the control circuit 2002 ("Output of power-off information to control circuit" in FIG. 15).

The power-off information is input to the control circuit 2002 from the decoder circuit 2001 ("Input of power-off information" in FIG. 15). On the basis of the input power-off information, the control circuit 2002 outputs power-off information to the module in which supply of the power supply voltage is to be stopped.

In FIG. 15, in order to stop supply of the power supply voltage to the control circuit 2002, the arithmetic circuit 2003, the register 2004, and the memory 2005, the control circuit 2002 outputs the power-off information to the arithmetic circuit 2003 and the register 2004 ("Output of power-off information to arithmetic circuit and register" in FIG. 15).

In parallel with the output of the power-off information, at least one of the pair of non-volatile memory circuits corresponding to the volatile memory circuit included in the control circuit 2002 is set on standby for a data signal of the volatile memory circuit ("Standby for data" in FIG. 15). The structures of the volatile memory circuit and the pair of non-volatile memory circuits which are included in the control circuit 2002 and the operation for standby for the data signal are similar to those in Embodiment 1 and the like, and thus description thereof is omitted.

When the power-off information is input from the control circuit 2002 to the arithmetic circuit 2003 ("Input of power-off information" in FIG. 15), in the arithmetic circuit 2003, at least one of the pair of non-volatile memory circuits corresponding to the volatile memory circuit is set on standby for a data signal of the volatile memory circuit ("Standby for data" in FIG. 15). The structures of the volatile memory circuit and the pair of non-volatile memory circuits which are included in the arithmetic circuit 2003 and the operation for standby for the data signal are similar to those in Embodiment 1 and the like, and thus description thereof is omitted.

When the power-off information is input from the control circuit 2002 to the register 2004 ("Input of power-off information" in FIG. 15), in the register 2004, at least one of the pair of non-volatile memory circuits corresponding to the volatile memory circuit is set on standby for a data signal of the volatile memory circuit ("Standby for data" in FIG. 15). The structures of the volatile memory circuit and the pair of non-volatile memory circuits which are included in the register 2004 and the operation for standby for the data signal are similar to those in Embodiment 1 and the like, and thus description thereof is omitted.

In this manner, after standby for the data signal is completed in the control circuit 2002, the arithmetic circuit 2003, and the register 2004 among the modules in which supply of the power supply voltage is to be stopped, the decoder circuit 2001 outputs power-off information to the power supply circuit 2006 ("Output of power-off information to power supply circuit" in FIG. 15).

When the power-off information is input from the decoder circuit 2001 to the power supply circuit 2006 ("Input of power-off information" in FIG. 15), the power supply circuit 2006 stops supply of the power supply voltage to the modules on the basis of the power-off information ("Stop of supply of power supply voltage to module for which power off is selected" in FIG. 15). Note that in the case where the memory 2005 is included in the modules for which power off is selected, supply of the power supply voltage to the memory 2005 is also stopped.

Note that as described in Embodiment 1 and the like, the memory 2005 includes, as a memory cell, a non-volatile memory circuit which can continue to hold a data signal even after supply of the power supply voltage is stopped. Therefore, in the signal processing circuit in this embodiment, supply of the power supply voltage can be stopped without making a backup of a data signal or the like.

Here, stop of supply of power supply voltage refers to, in the case where voltage corresponding to a difference between a high power supply potential and a low power supply potential is supplied to a module as a power supply potential, operation for stopping supply of one of the potentials or operation for making one of the potentials the same as the other of the potentials.

In the above manner, supply of the power supply voltage is stopped in the modules in the signal processing circuit.

In this manner, the signal processing circuit can carry out normally-off operation in which the power supply voltage is supplied only when needed to operate all or some of the modules. Accordingly, the power consumption of the signal processing circuit can be drastically reduced.

Further, when the signal processing circuit carries out the normally-off operation, each of the modules in the signal processing circuit can start predetermined processing with the use of a data signal held therein immediately after supply of the power supply voltage is selected. Therefore, time from selection of supply of the power supply voltage to start of predetermined processing can be shortened in the signal processing circuit. In addition, predetermined processing is performed using a volatile memory circuit in the module supplied with the power supply voltage; therefore, the data signal processing speed of the signal processing circuit can be improved.

Furthermore, a highly reliable circuit in which the number of times data can be written is high is used as each of the pair of non-volatile memory circuits for the signal processing circuit; therefore, the durability and reliability of the signal processing circuit can be improved.

This embodiment can be combined with any of the other embodiments as appropriate.

Embodiment 6

In this embodiment, an example of a structure of the signal processing circuit described in Embodiment 1 will be described with reference to FIGS. 16A and 16B and FIG. 17. Note that the reference numerals in the drawings used in other embodiments are also used in this embodiment.

An example of a structure of a signal processing circuit will be described with reference to FIGS. 16A and 16B.

Figure 16A:
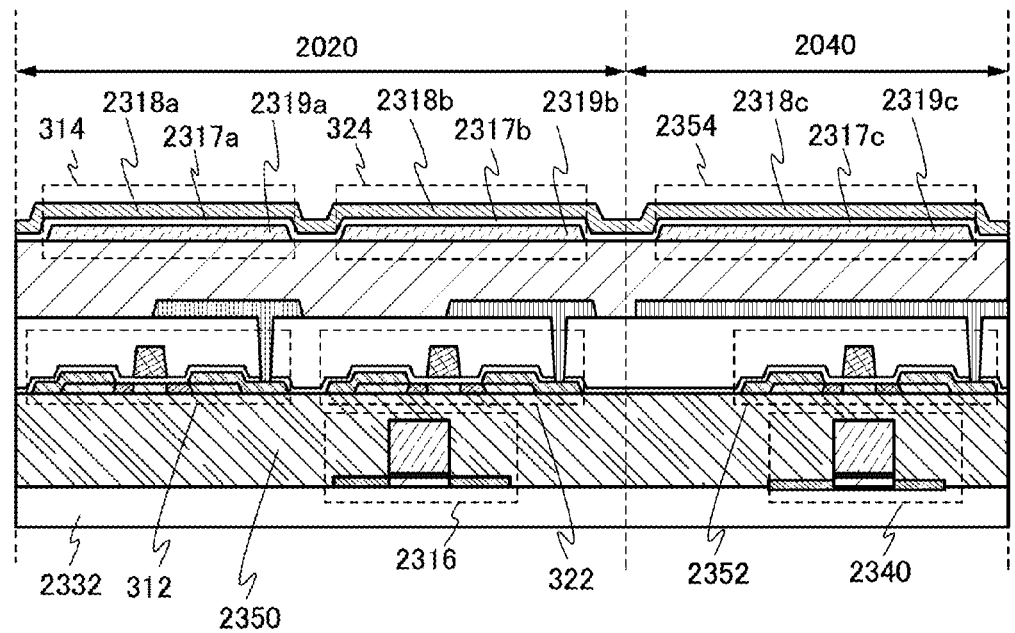
FIGS. 16A and 16B illustrate an example of a signal processing circuit.

FIG. 16A is a cross-sectional view of a signal processing circuit. A region 2020 is a region where a control circuit, an arithmetic circuit, or a register is formed, and a region 2040 is a region where a memory cell of a memory is formed.

In FIG. 16A, the control circuit, the arithmetic circuit, or the register formed in the region 2020 includes the volatile memory circuit 200 and the pair of non-volatile memory circuits (the non-volatile memory circuit 100-1 and the non-volatile memory circuit 100-2) corresponding to the volatile memory circuit 200, which are described in Embodiment 1. Note that the control circuit, the arithmetic circuit, and the register are also collectively referred to as a control portion.

Alternatively, the control circuit, the arithmetic circuit, or the register formed in the region 2020 may include the volatile memory circuit 200 and the plural pairs of non-volatile memory circuits (the non-volatile memory circuits 100-1 to 100-4, or the like) corresponding to the volatile memory circuit 200, which are described in Embodiment 2.

In the region 2020 in FIG. 16A, the transistor 312 and the capacitor 314 which are included in the non-volatile memory circuit 100-1 and the transistor 322 and the capacitor 324 which are included in the non-volatile memory circuit 100-2 are illustrated. A transistor 2316 included in the volatile memory circuit 200 is also illustrated.

The capacitor 314 includes an electrode 2319a functioning as one terminal, an electrode 2318a functioning as the other terminal, and a dielectric layer 2317a interposed between the electrode 2319a and the electrode 2318a. The capacitor 324 includes an electrode 2319b functioning as one terminal, an electrode 2318b functioning as the other terminal, and a dielectric layer 2317b interposed between the electrode 2319b and the electrode 2318b.

Note that the transistor 2316 may be provided in the region 2020 so as to overlap with the transistor 312 or the transistor 322. FIG. 16A illustrates, as an example, a structure in which the transistor 2316 is provided over a substrate 2332, the transistor 322 is provided over the transistor 2316 with an interlayer insulating layer 2350 positioned therebetween, and the capacitor 324 is provided over the transistor 322.

In addition, the memory cell of the memory, which is formed in the region 2040 in FIG. 16A, can include the non-volatile memory circuit 100 described in Embodiment 1.

In the region 2040 in FIG. 16A, a transistor 2352 and a capacitor 2354 which are included in a non-volatile memory circuit are illustrated. The capacitor 2354 includes an electrode 2319c functioning as one terminal, an electrode 2318c functioning as the other terminal, and a dielectric layer 2317c interposed between the electrode 2319c and the electrode 2318c.

Note that a transistor 2340 included in another circuit (such as the sense amplifier circuit 1104, the precharge circuit 1106, the column decoder 1108, or the row decoder 1110) may be provided in the region 2040 so as to overlap with the transistor 2352.

FIG. 16A illustrates a structure in which the transistor 2340 is provided over the substrate 2332, the transistor 2352 is provided over the transistor 2340 with the interlayer insulating layer 2350 positioned therebetween, and the capacitor 2354 is provided over the transistor 2352.

The transistor 312, the transistor 322, and the transistor 2352 in FIG. 16A can be manufactured in the same process. Further, the transistor 2316 and the transistor 2340 can be manufactured in the same process.

Here, manufacturing a plurality of transistors in the same process means that gate electrodes of the plurality of transistors are formed by etching of one conductive film; gate insulating films of the plurality of transistors are formed by using one insulating film (or by etching of one insulating film); and source electrodes and drain electrodes of the plurality of transistors are formed by etching of one conductive film. In the case where the plurality of transistors each includes a channel formation region formed using a semiconductor layer, active layers of the plurality of transistors are formed by etching of one semiconductor layer.

The capacitor 314, the capacitor 324, and the capacitor 2354 in FIG. 16A can be manufactured in the same process.

Here, manufacturing a plurality of capacitors in the same process means that electrodes serving as one terminals of the plurality of capacitors are formed by etching of one conductive film; dielectric layers of the plurality of capacitors are formed by using one insulating film (or by etching of one insulating film); and electrodes serving as the other terminals of the plurality of capacitors are formed by using one conductive film (or by etching of one conductive film).

In FIG. 16A, one insulating film is used as the dielectric layer 2317a of the capacitor 314, the dielectric layer 2317b of the capacitor 324, and the dielectric layer 2317c of the capacitor 2354. In other words, these dielectric layers share the insulating film and are not separated from each other.

In FIG. 16A, one conductive film is used as the electrode 2318a of the capacitor 314, the electrode 2318b of the capacitor 324, and the electrode 2318c of the capacitor 2354. In other words, these electrodes share the conductive film and are not separated from each other.

In the case where the conductive film is shared, the conductive film can have a function as a shielding film (e.g., an electric-field shielding film) or a light-blocking film of the signal processing circuit.

For example, as illustrated in FIG. 16A, the conductive film serving as the electrodes (the electrode 2318a, the electrode 2318b, and the electrode 2318c) which function as the other terminals of the capacitors is provided so as to cover a transistor included in the signal processing circuit, such as the transistor 312, the transistor 322, or the transistor 2316; thus, an effect of an external electric field or the like on the element included in the signal processing circuit can be reduced.

In this manner, when the electrodes of the capacitors function as a shielding film or a light-blocking film, a highly reliable signal processing circuit can be obtained without increasing the number of manufacturing steps.

Figure 16B:
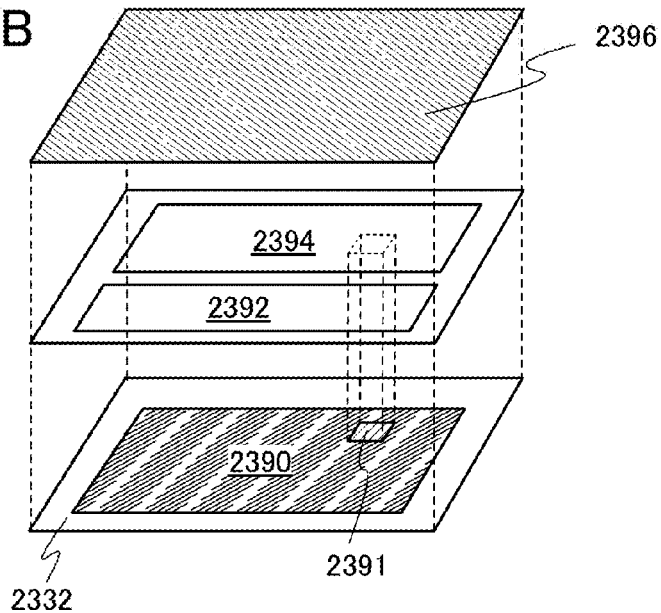

FIG. 16B is a perspective view of the signal processing circuit.

The signal processing circuit includes a circuit group 2390 provided over the substrate 2332, a circuit group 2392 and a circuit group 2394 which are provided over the circuit group 2390 so as to overlap with the circuit group 2390, and a plurality of capacitors provided over the circuit group 2392 and the circuit group 2394 so as to overlap with these circuit groups. Note that electrodes functioning as the other terminals of the plurality of capacitors are provided without being separated from each other (are formed as one film), and are illustrated as a region 2396 in FIG. 16B.

Transistors similar to the transistor 2316 and the transistor 2340 can be used for the circuit group 2390. Transistors similar to the transistor 312, the transistor 322, and the transistor 2352 can be used for the circuit group 2392 and the circuit group 2394. Capacitors similar to the capacitor 314, the capacitor 324, and the capacitor 2354 can be used as the plurality of capacitors whose electrodes are provided in the region 2396.

Here, the electrodes functioning as the other terminals of the plurality of capacitors, which are illustrated as the region 2396, are provided so as to cover the circuit group 2390, the circuit group 2392, and the circuit group 2394. This enables the electrodes functioning as the other terminals of the plurality of capacitors to function as a shielding film of the signal processing circuit.

Among the circuits included in the signal processing circuit, the circuits other than the non-volatile memory circuit 100 can be provided in the circuit group 2390.

For example, the circuit group 2390 can be provided with an element (such as the transistor 2316) included in the volatile memory circuit 200 or an element (such as the transistor 2340) included in the circuit (such as the sense amplifier circuit 1104, the precharge circuit 1106, the column decoder 1108, or the row decoder 1110) other than the memory cell array 1102 of the memory 1100 in FIG. 10A.

Among the circuits included in the signal processing circuit, the non-volatile memory circuit can be provided in the circuit group 2392.

For example, the circuit group 2392 can be provided with the transistor 312 and the transistor 322 which are included in the pair of non-volatile memory circuits (the non-volatile memory circuit 100-1 and the non-volatile memory circuit 100-2) corresponding to the volatile memory circuit 200.

Among the circuits included in the signal processing circuit, a transistor which is included in the non-volatile memory circuit 1120 in the memory cell array 1102 of the memory 1100 illustrated in FIGS. 10A and 10B can be provided in the circuit group 2394.

Furthermore, capacitors in the circuits included in the signal processing circuit can be provided above the circuit group 2390, the circuit group 2392, and the circuit group 2394. The capacitors may include, for example, the capacitor 314 in the non-volatile memory circuit 100-1 and the capacitor 324 in the non-volatile memory circuit 100-2.

Here, it is preferable that in a region 2391 which is part of the circuit group 2390, an element included in the circuit (such as the sense amplifier circuit 1104, the precharge circuit 1106, the column decoder 1108, or the row decoder 1110) other than the memory cell array 1102 of the memory 1100 in FIG. 10A be provided and that the region 2391 overlap with the circuit group 2394.

Here, the transistor included in the non-volatile memory circuit 1120 in the memory cell array 1102 of the memory 1100 in FIG. 10A is provided in the circuit group 2394, whereby a circuit that controls input/output of a data signal can be located closely to the memory cell array 1102.

FIG. 16A illustrates a structure of the signal processing circuit in which the transistor 312, the transistor 322, and the transistor 2352 are provided above the transistor 2316 and the transistor 2340, and the capacitor 314, the capacitor 324, and the capacitor 2354 are provided above the transistor 312, the transistor 322, and the transistor 2352; however, this embodiment is not limited thereto.

Another example of a structure of a signal processing circuit will be described with reference to FIG. 17.

Figure 17:
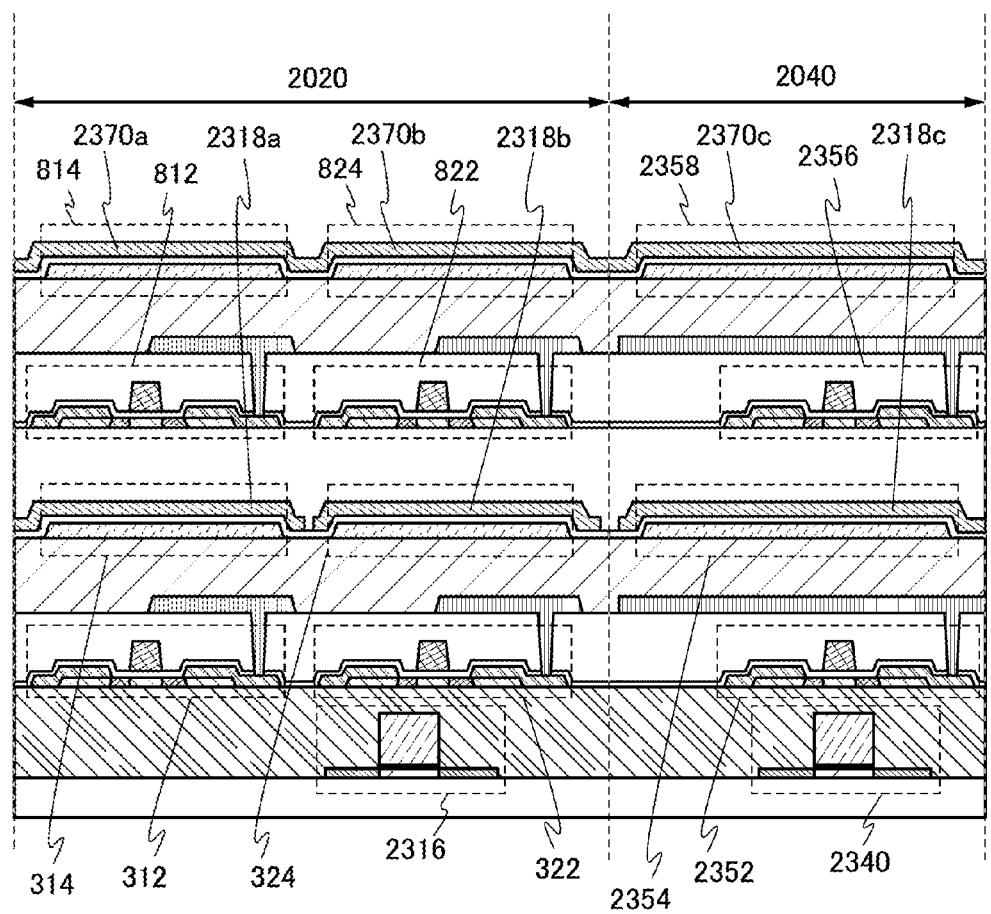
FIG. 17 illustrates an example of a signal processing circuit.

FIG. 17 is a cross-sectional view of a signal processing circuit.

As illustrated in FIG. 17, the following structure may be employed: in the region 2020, a layer including the transistor 2316, a layer including the transistor 312 and the transistor 322, and a layer including the capacitor 314 and the capacitor 324 are stacked in this order; a layer including the transistor 812 and the transistor 822 is provided over the layer including the capacitor 314 and the capacitor 324; and a layer including the capacitor 814 and the capacitor 824 is provided over the layer including the transistor 812 and the transistor 822.

As illustrated in FIG. 17, a stack of a layer including the transistor 2340, a layer including the transistor 2352, a layer including the capacitor 2354, a layer including a transistor 2356, and a layer including a capacitor 2358 may be provided in the region 2040.

Here, the electrode 2318a of the capacitor 314, the electrode 2318b of the capacitor 324, and the electrode 2318c of the capacitor 2354 are provided separately from each other, which is different from the case in FIG. 16A. This is for electrical connection between a circuit provided above the layer including the capacitor 314, the capacitor 324, and the capacitor 2354 and a circuit provided below the layer.

In FIG. 17, one conductive film is used as an electrode 2370a functioning the other terminal of the capacitor 814, an electrode 2370b functioning as the other terminal of the capacitor 824, and an electrode 2370c functioning the other terminal of the capacitor 2358. In other words, these electrodes share the conductive film and are not separated from each other.

Further, as illustrated in FIG. 17, the conductive film serving as the electrodes (the electrode 2370a, the electrode 2370b, and the electrode 2370c) which function as the other terminals of the capacitors is provided so as to cover the transistors included in the signal processing circuit; thus, an effect of an external electric field or the like on the elements included in the signal processing circuit can be reduced.

In this manner, when the electrodes functioning as the other terminals of the capacitor 814 and the capacitor 824 function as a shielding film or a light-blocking film, a highly reliable signal processing circuit can be obtained without increasing the number of manufacturing steps.

Note that it is possible to employ the structure of the signal processing circuit described in Embodiment 2 with reference to FIG. 8, in which the non-volatile memory circuit 100-3 including the transistor 812 and the capacitor 814 and the non-volatile memory circuit 100-4 including the transistor 822 and the capacitor 824 are provided.

Further, the memory cell array of the memory may be divided and the divided memory cell arrays may be stacked to overlap with each other (may be multilayered). Such an arrangement enables the memory capacity to be increased while the area of the memory cell array of the memory is reduced.

This embodiment can be combined with any of the other embodiments as appropriate.

Embodiment 7

In this embodiment, an example of a method of manufacturing the signal processing circuit described in any of the above embodiments will be described with reference to FIGS. 20A to 20D, FIGS. 21A to 21C, and FIGS. 22A to 22D. Note that the reference numerals in the drawings used in the above embodiments are also used in this embodiment.

In this embodiment, description is made using a transistor 2416 which is an element in a circuit included in the signal processing circuit 120, other than the non-volatile memory circuit 100, and the transistor 102 and the capacitor 104 which are in the non-volatile memory circuit 100 as an example.

The case where a transistor whose channel formation region is formed in silicon is used as the transistor 2416 is described here as an example. In addition, the transistor 102 is a transistor whose channel formation region is formed in an oxide semiconductor layer.

First, a method of manufacturing the transistor 2416 will be described.

Figure 20A:
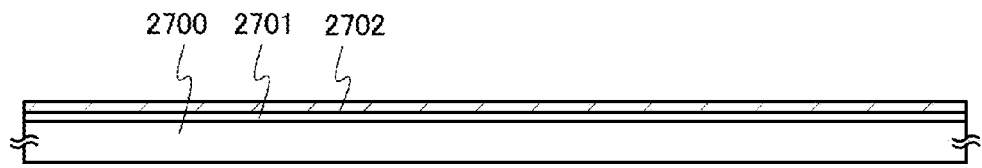
FIGS. 20A to 20D illustrate an example of a method of manufacturing a signal processing circuit.

As illustrated in FIG. 20A, an insulating film 2701 and a semiconductor film 2702 which is separated from a single crystal semiconductor substrate are formed over a substrate 2700.

Although there is no particular limitation on a material which can be used for the substrate 2700, it is necessary that the material have at least heat resistance high enough to withstand heat treatment performed later. For example, a glass substrate manufactured by a fusion process or a float process, a quartz substrate, a semiconductor substrate, or a ceramic substrate can be used as the substrate 2700. As the glass substrate, a substrate having a strain point of 730° C. or higher may be used when the temperature of heat treatment performed later is high.

In this embodiment, an example in which the semiconductor film 2702 is formed using single crystal silicon is given to describe the method of manufacturing the transistor 2416.

Here, a specific example of a method of forming the single crystal semiconductor film 2702 will be briefly described.

First, an ion beam including ions which are accelerated by an electric field enters a bond substrate which is a single crystal semiconductor substrate and an embrittlement layer which is made fragile by local disorder of the crystal structure is formed in a region at a certain depth from a surface of the bond substrate. The depth at which the embrittlement layer is formed can be adjusted by the acceleration energy of the ion beam and the angle at which the ion beam enters.

Then, the bond substrate and the substrate 2700 which is provided with the insulating film 2701 are attached to each other so that the insulating film 2701 is interposed therebetween. After the bond substrate and the substrate 2700 are overlapped with each other, a pressure approximately higher than or equal to 1 N/cm$^2$ and lower than or equal to 500 N/cm$^2$, preferably higher than or equal to 11 N/cm$^2$ lower than or equal to 20 N/cm$^2$, is applied to part of the bond substrate and part of the substrate 2700 so that the substrates are attached to each other. When the pressure is applied, bonding between the bond substrate and the insulating film 2701 starts from the parts, which results in bonding of the entire surface where the bond substrate and the insulating film 2701 are in close contact with each other.

Next, heat treatment is performed, so that microvoids that exist in the embrittlement layer are combined and the volume of the microvoids is increased. Accordingly, a single crystal semiconductor film which is part of the bond substrate is separated from the bond substrate along the embrittlement layer. The heat treatment is performed at a temperature not exceeding the strain point of the substrate 2700. Then, the single crystal semiconductor film is processed into a desired shape by etching or the like, so that a semiconductor layer 2704 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 2702.

An impurity element for controlling the threshold voltage may be added to the semiconductor film which is not etched into a predetermined shape or may be added to the semiconductor layer 2704 which has been etched into a predetermined shape. Alternatively, the impurity element for controlling the threshold voltage may be added to the bond substrate. Further alternatively, the impurity element may be added to the bond substrate in order to roughly control the threshold voltage, and the impurity element may be further added to the semiconductor film which is not etched into a predetermined shape or the semiconductor layer 2704 which has been etched into a predetermined shape in order to finely control the threshold voltage.

Note that although an example in which a single crystal semiconductor film is used is described in this embodiment, one embodiment of the present invention is not limited thereto.

For example, a polycrystalline, microcrystalline, or amorphous semiconductor film which is formed over the insulating film 2701 by a vapor deposition method may be used. The semiconductor film may be crystallized by a known technique.

As a known crystallization method, a laser crystallization method using a laser beam and a crystallization method using a catalytic element are given. Alternatively, a crystallization method using a catalyst element and a laser crystallization method can be combined.

In the case of using a heat-resistant substrate such as a quartz substrate, it is possible to combine any of the following crystallization methods: a thermal crystallization method using an electrically heated oven, a lamp heating crystallization method using infrared light, a crystallization method using a catalytic element, and a high-temperature heating method at approximately 950° C.

Figure 20B:
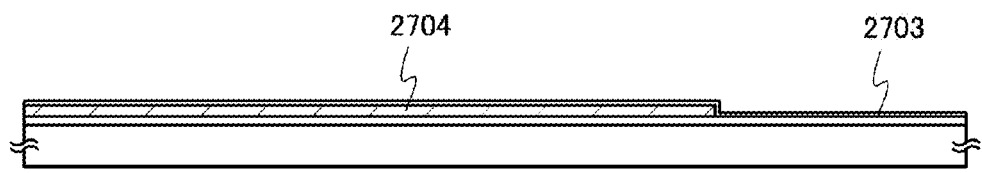

Next, as illustrated in FIG. 20B, the semiconductor film 2702 is processed into a predetermined shape, so that the semiconductor layer 2704 is formed. Then, a gate insulating film 2703 is formed over the semiconductor layer 2704.

The gate insulating film 2703 can be formed as a single layer or a stack of layers containing any of silicon oxide, silicon nitride oxide, silicon oxynitride, silicon nitride, hafnium oxide, aluminum oxide, tantalum oxide, yttrium oxide, hafnium silicate (HfSi$_x$O$_y$, (x>0, y>0)), hafnium silicate to which nitrogen is added (HfSi$_x$O$_y$N$_z$ (x>0, y>0, z>0)), hafnium aluminate to which nitrogen is added (HfAl$_x$O$_y$N$_z$ (x>0, y>0, z>0)), and the like by a plasma CVD method or a sputtering method, for example.

In this specification, an oxynitride refers to a substance in which the amount of oxygen is larger than that of nitrogen, and a nitride oxide refers to a substance in which the amount of nitrogen is larger than that of oxygen.

The thickness of the gate insulating film 2703 can be, for example, greater than or equal to 1 nm and less than or equal to 100 nm, preferably greater than or equal to 10 nm and less than or equal to 50 nm. In this embodiment, a single-layer insulating film containing silicon oxide is formed as the gate insulating film 2703 by a plasma CVD method.

Figure 20C:
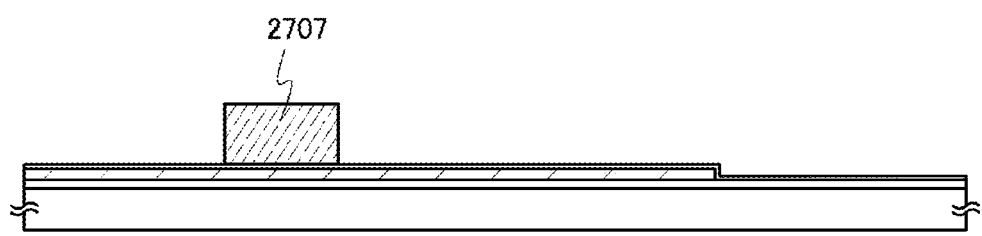

Next, a gate electrode 2707 is formed as illustrated in FIG. 20C.

A conductive film is formed and then is processed into a predetermined shape, so that the gate electrode 2707 can be formed. The conductive film can be formed by a CVD method, a sputtering method, an evaporation method, a spin coating method, or the like.

For the conductive film, tantalum (Ta), tungsten (W), titanium (Ti), molybdenum (Mo), aluminum (Al), copper (Cu), chromium (Cr), niobium (Nb), or the like can be used. For the conductive film, an alloy containing any of the above metals as a main component or a compound containing any of the above metals may be used. Alternatively, the conductive film may be formed using a semiconductor such as polycrystalline silicon doped with an impurity element imparting a conductivity type, such as phosphorus.

Note that although the gate electrode 2707 is formed using a single-layer conductive film in this embodiment, this embodiment is not limited to this structure. The gate electrode 2707 may be a stack of a plurality of conductive films.

As a combination of two conductive films, tantalum nitride or tantalum can be used for a first conductive film and tungsten can be used for a second conductive film. Besides, any of the following combinations of two conductive films can be used: tungsten nitride and tungsten; molybdenum nitride and molybdenum; aluminum and tantalum; aluminum and titanium; and the like. Since tungsten and tantalum nitride have high heat resistance, heat treatment for thermal activation can be performed after the two conductive films are formed.

Alternatively, as the combination of two conductive films, for example, nickel silicide and silicon doped with an impurity element imparting n-type conductivity, or tungsten silicide and silicon doped with an impurity element imparting n-type conductivity can be used.

In the case of using a three-layer structure in which three conductive films are stacked, a stacked structure including a molybdenum film, an aluminum film, and a molybdenum film is preferable.

A light-transmitting oxide conductive film of indium oxide, indium oxide-tin oxide, indium oxide-zinc oxide, zinc oxide, zinc aluminum oxide, zinc aluminum oxynitride, zinc gallium oxide, or the like may be used for the gate electrode 2707.

Note that the gate electrode 2707 may be selectively formed by a droplet discharge method without the use of a mask. A droplet discharge method is a method of forming a predetermined pattern by discharge or ejection of a droplet containing a predetermined composition from an orifice, and includes an inkjet method in its category.

The gate electrode 2707 can be formed in such a manner that a conductive film is formed and then is etched into a desired tapered shape by an inductively coupled plasma (ICP) etching method under appropriately controlled etching conditions (e.g., the amount of power applied to a coil-shaped electrode layer, the amount of power applied to an electrode layer on the substrate side, and the temperature of the electrode layer on the substrate side). In addition, angles and the like of the tapered shape can be controlled by the shape of a mask.

Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 20D:
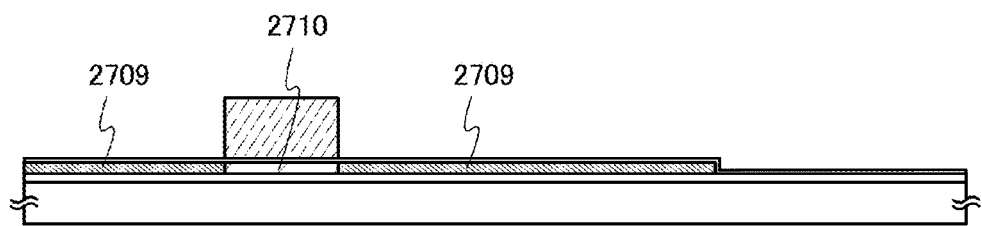

Next, an impurity element imparting one conductivity type is added to the semiconductor layer 2704 with the use of the gate electrode 2707 as a mask, whereby a channel formation region 2710 which overlaps with the gate electrode 2707 and a pair of impurity regions 2709 between which the channel formation region 2710 is interposed are formed in the semiconductor layer 2704 as illustrated in FIG. 20D.

In this embodiment, the case where an impurity element imparting p-type conductivity (e.g., boron) is added to the semiconductor layer 2704 is described.

Figure 21A:
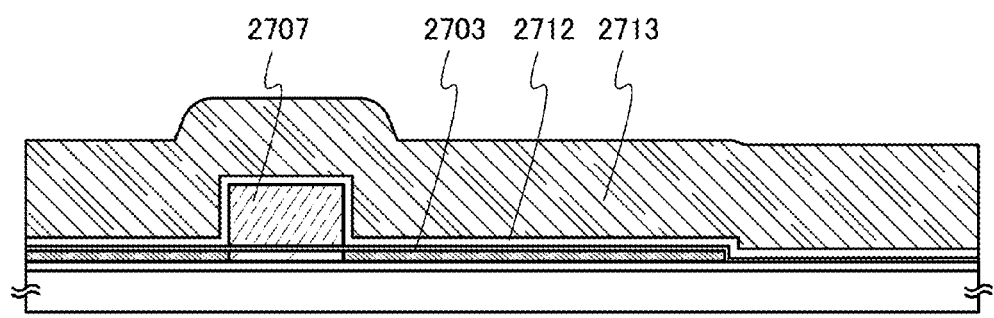
FIGS. 21A to 21C illustrate an example of a method of manufacturing a signal processing circuit.

Next, as illustrated in FIG. 21A, an insulating film 2712 and an insulating film 2713 are formed so as to cover the gate insulating film 2703 and the gate electrode 2707.

Specifically, an inorganic insulating film of silicon oxide, silicon nitride, silicon nitride oxide, silicon oxynitride, aluminum nitride, aluminum nitride oxide, or the like can be used as each of the insulating film 2712 and the insulating film 2713. The insulating film 2712 and the insulating film 2713 are preferably formed using a low dielectric constant (low-k) material to sufficiently reduce capacitance due to overlapping electrodes or wirings.

Note that a porous insulating film formed using such a material may be used as each of the insulating film 2712 and the insulating film 2713. Since the porous insulating film has lower dielectric constant than a dense insulating film, parasitic capacitance due to electrodes or wirings can be further reduced.

In this embodiment, an example in which silicon oxynitride is used for the insulating film 2712 and silicon nitride oxide is used for the insulating film 2713 is described. In addition, although an example in which the insulating film 2712 and the insulating film 2713 are formed over the gate electrode 2707 is described in this embodiment, only one insulating film may be formed over the gate electrode 2707 or three or more insulating films may be stacked over the gate electrode 2707.

Figure 21B:
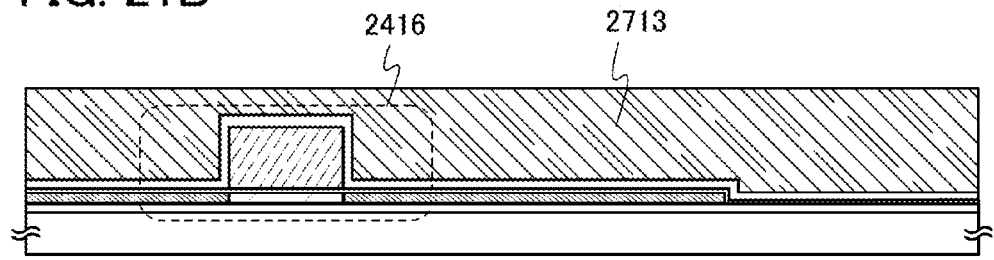

Next, as illustrated in FIG. 21B, the insulating film 2713 is subjected to chemical mechanical polishing (CMP) treatment or etching treatment, so that a top surface of the insulating film 2713 is planarized. Note that in order to improve characteristics of the transistor 102 formed later, the surface of the insulating film 2713 is preferably planarized as much as possible.

Through the above steps, the transistor 2416 can be formed.

Next, a method of manufacturing the transistor 102 will be described.

Figure 21C:
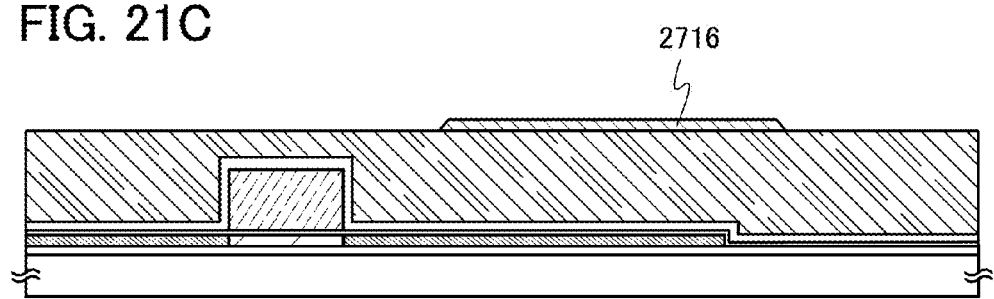

First, as illustrated in FIG. 21C, an oxide semiconductor layer 2716 is formed over the insulating film 2713.

The oxide semiconductor layer 2716 can be formed by processing an oxide semiconductor film formed over the insulating film 2713 into a desired shape. The thickness of the oxide semiconductor film is greater than or equal to 2 nm and less than or equal to 200 nm, preferably greater than or equal to 3 nm and less than or equal to 50 nm, further preferably greater than or equal to 3 nm and less than or equal to 20 nm.

The oxide semiconductor film is formed by a sputtering method using an oxide semiconductor target. The oxide semiconductor film can be formed by a sputtering method in a rare gas (e.g., argon) atmosphere, an oxygen atmosphere, or a mixed atmosphere of a rare gas (e.g., argon) and oxygen.

Note that before the oxide semiconductor film is formed by a sputtering method, dust on the surface of the insulating film 2713 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate so that a surface is modified.

Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

In this embodiment, as the oxide semiconductor film, an In—Ga—Zn—O-based oxide semiconductor thin film with a thickness of 30 nm, which is obtained by a sputtering method using a target containing indium (In), gallium (Ga), and zinc (Zn), is used.

As the target, a target having a metal composition ratio of In:Ga:Zn=1:1:0.5, In:Ga:Zn=1:1:1, or In:Ga:Zn=1:1:2 can be used, for example. The filling rate of the target containing In, Ga, and Zn is higher than or equal to 90% and lower than or equal to 100%, preferably higher than or equal to 95% and lower than 100%. With the use of the target with a high filling rate, a dense oxide semiconductor film is formed.

In this embodiment, the oxide semiconductor film is formed in such a manner that the substrate is held in a treatment chamber kept at reduced pressure, moisture remaining in the treatment chamber is removed, a sputtering gas from which hydrogen and moisture are removed is introduced, and the target is used.

The substrate temperature in film formation may be higher than or equal to 100° C. and lower than or equal to 600° C., preferably higher than or equal to 200° C. and lower than or equal to 400° C. Film formation is performed while the substrate is heated, whereby the concentration of impurities contained in the formed oxide semiconductor film can be reduced and damage due to sputtering can be reduced.

In order to remove moisture remaining in the treatment chamber, an entrapment vacuum pump is preferably used. For example, a cryopump, an ion pump, or a titanium sublimation pump is preferably used. An evacuation unit may be a turbo pump provided with a cold trap. In the treatment chamber which is evacuated with the cryopump, for example, a hydrogen atom and a compound containing a hydrogen atom, such as water ($H_2O$), (further preferably also a compound containing a carbon atom) are removed, whereby the concentration of impurities contained in the oxide semiconductor film formed in the treatment chamber can be reduced.

As an example of film formation conditions, the distance between the substrate and the target is 100 mm, the pressure is 0.6 Pa, the power of a direct-current (DC) power source is 0.5 kW, and the atmosphere is an oxygen atmosphere (the proportion of the oxygen flow rate is 100%). Note that a pulsed direct-current (DC) power source is preferable because dust generated in film formation can be reduced and the film thickness can be uniform.

Moreover, when the leakage rate of the treatment chamber of the sputtering apparatus is set to be lower than or equal to $1 \times 10^{-10}$ Pa·m$^3$/second, entry of impurities such as an alkali metal and a hydride into the oxide semiconductor film that is being formed by a sputtering method can be reduced. Further, with the use of the above entrapment vacuum pump as an evacuation unit, counter flow of impurities such as an alkali metal, a hydrogen atom, a hydrogen molecule, water, a hydroxyl group, and a hydride from the evacuation unit can be reduced.

When the purity of the target is set to 99.99% or higher, entry of an alkali metal, a hydrogen atom, a hydrogen molecule, water, a hydroxyl group, a hydride, and the like into the oxide semiconductor film can be suppressed. In addition, when the target is used, the concentration of an alkali metal such as lithium, sodium, or potassium can be reduced in the oxide semiconductor film.

Note that in order that hydrogen, a hydroxyl group, and moisture be contained in the oxide semiconductor film as little as possible, it is preferable that impurities such as hydrogen and moisture that are adsorbed to the substrate 2700 be eliminated and exhausted by preheating of the substrate 2700 over which the insulating film 2712 and the insulating film 2713 are formed in a preheating chamber of the sputtering apparatus, as pretreatment for film formation. The temperature of the preheating is higher than or equal to 100° C. and lower than or equal to 400° C., preferably higher than or equal to 150° C. and lower than or equal to 300° C. As an evacuation unit, a cryopump is preferably provided in the preheating chamber. Note that this preheating treatment can be omitted. This preheating may be similarly performed on the substrate 2700 over which a conductive layer 2719 and a conductive layer 2720 are formed, before a gate insulating film 2721 is formed.

Note that etching for forming the oxide semiconductor layer 2716 may be wet etching, dry etching, or both dry etching and wet etching. As an etching gas used for the dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate reactive ion etching (RIE) method or an inductively coupled plasma (ICP) etching method can be used. In order to etch the film into a desired shape, etching conditions (e.g., the amount of power applied to a coil-shaped electrode, the amount of power applied to an electrode on the substrate side, and the temperature of the electrode on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask used for forming the oxide semiconductor layer 2716 may be formed by an inkjet method. Formation of the resist mask by an inkjet method needs no photomask; thus, manufacturing cost can be reduced.

Note that it is preferable that reverse sputtering be performed before a conductive film is formed in a subsequent step so that resist residues and the like on surfaces of the insulating film 2713 and the oxide semiconductor layer 2716 are removed.

Note that the oxide semiconductor film formed by sputtering or the like contains moisture or hydrogen (including a hydroxyl group) as an impurity in some cases. Moisture or hydrogen easily forms a donor level and thus serves as an impurity in the oxide semiconductor.

Thus, in this embodiment, in order to reduce impurities such as moisture or hydrogen in the oxide semiconductor film (in order to perform dehydration or dehydrogenation), the oxide semiconductor layer 2716 is subjected to heat treatment in a reduced-pressure atmosphere, an atmosphere of an inert gas such as nitrogen or a rare gas, an oxygen gas atmosphere, or ultra dry air (the moisture amount is 20 ppm (−55° C. by conversion into a dew point) or less, preferably 1 ppm or less, further preferably 10 ppb or less, in the case where measurement is performed by a dew point meter of a cavity ring down laser spectroscopy (CRDS) system).

By performing heat treatment on the oxide semiconductor layer 2716, moisture or hydrogen in the oxide semiconductor layer 2716 can be eliminated. Specifically, the heat treatment may be performed at a temperature higher than or equal to 250° C. and lower than or equal to 750° C., preferably higher than or equal to 400° C. and lower than the strain point of the substrate. For example, the heat treatment may be performed at 500° C. for approximately longer than or equal to 3 minutes and shorter than equal to 6 minutes. By performing the heat treatment by an RTA method, dehydration or dehydrogenation can be performed in a short time; thus, the treatment can be performed even at a temperature higher than the strain point of a glass substrate.

In this embodiment, an electric furnace that is one of heat treatment apparatuses is used.

Note that the heat treatment apparatus is not limited to an electric furnace, and may have a device for heating an object by heat conduction or heat radiation from a heating element such as a resistance heating element. For example, a rapid thermal annealing (RTA) apparatus such as a gas rapid thermal annealing (GRTA) apparatus or a lamp rapid thermal annealing (LRTA) apparatus can be used.

An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object by heat treatment, like nitrogen or a rare gas such as argon is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon introduced into the heat treatment apparatus is preferably higher than or equal to 6N (99.9999%), further preferably higher than or equal to 7N (99.99999%) (that is, the impurity concentration is preferably lower than or equal to 1 ppm, further preferably lower than or equal to 0.1 ppm).

Through the above steps, the concentration of hydrogen in the oxide semiconductor layer 2716 can be reduced, and thus the oxide semiconductor layer can be stabilized. In addition, heat treatment at a temperature lower than or equal to the glass transition temperature makes it possible to form an oxide semiconductor layer with extremely low carrier density and a wide bandgap. Therefore, the transistor can be manufactured using a large-sized substrate, so that the productivity can be increased. In addition, with the oxide semiconductor layer in which the hydrogen concentration is reduced, a transistor with high withstand voltage and significantly small off-state current can be manufactured. The above heat treatment can be performed at any time after the oxide semiconductor layer is formed.

Note that for the oxide semiconductor layer, an oxide including a crystal with c-axis alignment (also referred to as a c-axis aligned crystal (CAAC)) that has a triangular or hexagonal atomic arrangement when seen from the direction of an a-b plane, a surface, or an interface can be used. In the crystal, metal atoms are arranged in a layered manner along the c-axis, or metal atoms and oxygen atoms are arranged in a layered manner along the c-axis, and the direction of the a-axis or the b-axis is varied in the a-b plane (the crystal rotates around the c-axis). Use of the oxide is preferable because an effect of an increase in the reliability of the transistor can be obtained.

Sputtering may be performed to form an oxide semiconductor film including CAAC. In order to obtain CAAC by sputtering, it is important to form hexagonal crystals in an initial stage of deposition of an oxide semiconductor film and to cause crystal growth from the hexagonal crystals as cores. In order to achieve this, it is preferable that the distance between the target and the substrate be made to be longer (e.g., approximately 150 mm to 200 mm) and the substrate heating temperature be 100° C. to 500° C., preferably 200° C. to 400° C., further preferably 250° C. to 300° C. In addition, the deposited oxide semiconductor film is subjected to heat treatment at a temperature higher than the substrate heating temperature during the deposition, so that micro defects in the film and defects at an interface between stacked layers can be repaired.

Figure 22A:
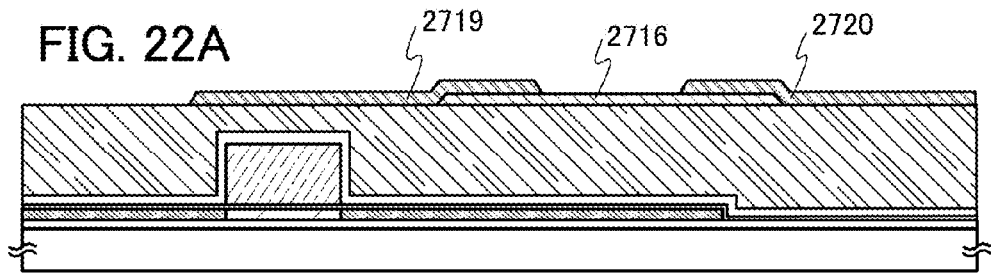
FIGS. 22A to 22D illustrate an example of a method of manufacturing a signal processing circuit.

Then, as illustrated in FIG. 22A, the conductive layer 2719 which is in contact with the oxide semiconductor layer 2716, and the conductive layer 2720 which is in contact with the oxide semiconductor layer 2716 are formed. The conductive layer 2719 and the conductive layer 2720 function as a source electrode and a drain electrode.

Specifically, the conductive layer 2719 and the conductive layer 2720 can be formed in such a manner that a conductive film is formed by a sputtering method or a vacuum evaporation method and then is processed into a predetermined shape.

The conductive film which is to be the conductive layer 2719 and the conductive layer 2720 can be formed using any of the following materials: an element selected from aluminum, chromium, copper, tantalum, titanium, molybdenum, and tungsten; an alloy containing any of these elements as a component; an alloy containing any of these elements in combination; and the like. Alternatively, a structure may be employed in which a film of a refractory metal such as chromium, tantalum, titanium, molybdenum, or tungsten is stacked on the bottom side or the top side of a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which is to be the conductive layer 2719 and the conductive layer 2720 may have a single-layer structure or a stacked structure including two or more layers. For example, a single-layer structure of an aluminum film containing silicon, a two-layer structure in which a titanium film is stacked over an aluminum film, and a three-layer structure in which a titanium film, an aluminum film, and a titanium film are stacked in this order can be given. A Cu—Mg—Al alloy, a Mo—Ti alloy, Ti, and Mo have high adhesion with an oxide film. Thus, for the conductive layer 2719 and the conductive layer 2720, a stacked structure is employed in which a conductive film containing a Cu—Mg—Al alloy, a Mo—Ti alloy, Ti, or Mo is used as a lower layer and a conductive film containing Cu is used as an upper layer. Consequently, the adhesion between an insulating film which is an oxide film and the conductive layer 2719 and the conductive layer 2720 can be increased.

For the conductive film which is to be the conductive layer 2719 and the conductive layer 2720, a conductive metal oxide may be used. As the conductive metal oxide, indium oxide, tin oxide, zinc oxide, indium oxide-tin oxide, indium oxide-zinc oxide, or any of these metal oxide materials containing silicon or silicon oxide can be used.

In the case where heat treatment is performed after formation of the conductive film, the conductive film preferably has heat resistance high enough to withstand the heat treatment.

Note that materials and etching conditions are adjusted as appropriate so that the oxide semiconductor layer 2716 is not removed as much as possible in etching of the conductive film. Depending on etching conditions, an exposed portion of the oxide semiconductor layer 2716 is partly etched and thus a groove (a recessed portion) is formed in some cases.

In this embodiment, a titanium film is used as the conductive film. Therefore, wet etching can be selectively performed on the conductive film with the use of a solution (an ammonia hydrogen peroxide mixture) containing ammonia and hydrogen peroxide water. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron trichloride ($BCl_3$), or the like.

In order to reduce the number of photomasks and steps in a photolithography step, etching may be performed with the use of a resist mask formed using a multi-tone mask through which light is transmitted so as to have a plurality of intensities. A resist mask formed using a multi-tone mask has a plurality of thicknesses and can be changed in shape by etching; thus, the resist mask can be used in a plurality of etching steps for processing films into different patterns. Therefore, a resist mask corresponding to at least two or more kinds of different patterns can be formed by one multi-tone mask. Thus, the number of light-exposure masks can be reduced and the number of corresponding photolithography steps can also be reduced, whereby a process can be simplified.

Further, an oxide conductive film functioning as a source region and a drain region may be provided between the oxide semiconductor layer 2716 and the conductive layers 2719 and 2720 functioning as the source electrode and the drain electrode. A material for the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, etching for forming the oxide conductive film and etching for forming the conductive layer 2719 and the conductive layer 2720 may be performed concurrently.

By providing the oxide conductive film functioning as the source region and the drain region, the resistance between the oxide semiconductor layer 2716 and the conductive layers 2719 and 2720 can be lowered, so that the transistor can operate at high speed. In addition, by providing the oxide conductive film functioning as the source region and the drain region, the withstand voltage of the transistor can be increased.

Next, plasma treatment may be performed using a gas such as $N_2O$, $N_2$, or Ar. By this plasma treatment, water or the like on an exposed surface of the oxide semiconductor layer is removed. Plasma treatment may be performed using a mixed gas of oxygen and argon as well.

Figure 22B:
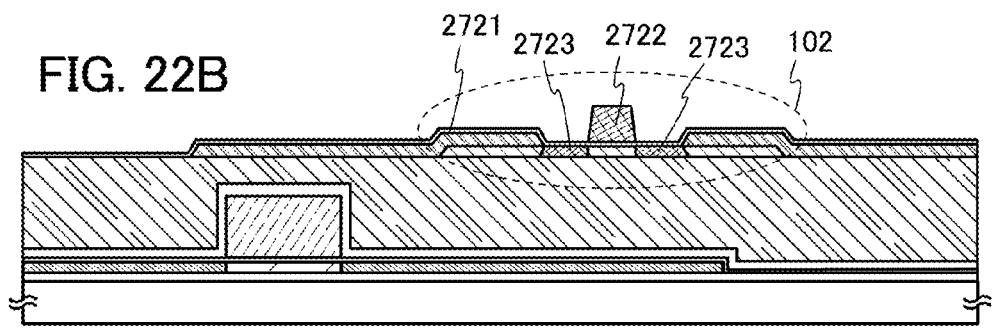

After the plasma treatment, as illustrated in FIG. 22B, the gate insulating film 2721 is formed so as to cover the conductive layer 2719, the conductive layer 2720, and the oxide semiconductor layer 2716. Then, a gate electrode 2722 is formed over the gate insulating film 2721 so as to overlap with the oxide semiconductor layer 2716.

Then, after the formation of the gate electrode 2722, a dopant imparting n-type conductivity is added to the oxide semiconductor layer 2716 with the use of the gate electrode 2722 as a mask, so that a pair of high-concentration regions 2723 is formed. Note that a region which is included in the oxide semiconductor layer 2716 and overlaps with the gate electrode 2722 with the gate insulating film 2721 positioned therebetween is a channel formation region. The oxide semiconductor layer 2716 includes the channel formation region between the pair of high-concentration regions 2723.

The dopant for formation of the high-concentration regions 2723 can be added by an ion implantation method. A rare gas such as helium, argon, or xenon; or a Group 15 element such as nitrogen, phosphorus, arsenic, or antimony can be used as the dopant, for example. For example, in the case where nitrogen is used as the dopant, the concentration of nitrogen atoms in the high-concentration region 2723 is preferably higher than or equal to $5\times10^{19}/cm^3$ and lower than or equal to $1\times10^{22}/cm^3$.

The high-concentration regions 2723 to which the dopant imparting n-type conductivity is added have higher conductivity than the other regions in the oxide semiconductor layer 2716. Thus, by provision of the high-concentration regions 2723 in the oxide semiconductor layer 2716, the resistance between the source electrode and the drain electrode (the conductive layer 2719 and the conductive layer 2720) can be lowered.

By lowering the resistance between the source electrode and the drain electrode (the conductive layer 2719 and the conductive layer 2720), large on-state current and high-speed operation can be ensured even when the transistor 102 is miniaturized. In addition, by miniaturization of the transistor 102, the area of a memory cell array including the transistor can be reduced, so that memory capacity per unit area can be increased in the memory cell array.

In the case where an In—Ga—Zn—O-based oxide semiconductor is used for the oxide semiconductor layer 2716, heat treatment is performed at a temperature higher than or equal to 300° C. and lower than or equal to 600° C. for approximately one hour after nitrogen is added. Consequently, the oxide semiconductor in the high-concentration regions 2723 has a wurtzite crystal structure. When the oxide semiconductor in the high-concentration regions 2723 has a wurtzite crystal structure, the conductivity of the high-concentration regions 2723 can be further increased and the resistance between the source electrode and the drain electrode (the conductive layer 2719 and the conductive layer 2720) can be lowered.

Note that in order to effectively lower the resistance between the source electrode and the drain electrode (the conductive layer 2719 and the conductive layer 2720) by forming an oxide semiconductor having a wurtzite crystal structure, the concentration of nitrogen atoms in the high-concentration region 2723 is preferably higher than or equal to $1\times10^{20}/cm^3$ and lower than or equal to 7 at. % in the case where nitrogen is used as the dopant. However, even when the nitrogen atom concentration is lower than the above range, the oxide semiconductor having a wurtzite crystal structure can be obtained in some cases.

The gate insulating film 2721 can be formed using a material and a stacked structure similar to those of the gate insulating film 2703. It is preferable that the gate insulating film 2721 contain impurities such as moisture and hydrogen as little as possible. The gate insulating film 2721 may be formed using a single-layer insulating film or a plurality of insulating films stacked.

When hydrogen is contained in the gate insulating film 2721, hydrogen enters the oxide semiconductor layer 2716 or extracts oxygen from the oxide semiconductor layer

2716, whereby the oxide semiconductor layer 2716 has lower resistance (n-type conductivity); thus, a parasitic channel might be formed. Therefore, it is important that a film formation method in which hydrogen is not used is employed in order to form the gate insulating film 2721 containing as little hydrogen as possible.

A material having a high barrier property is preferably used for the gate insulating film 2721. For example, as an insulating film having a high barrier property, a silicon nitride film, a silicon nitride oxide film, an aluminum nitride film, or an aluminum nitride oxide film can be used.

When a plurality of insulating films stacked is used, an insulating film having a low proportion of nitrogen, such as a silicon oxide film or a silicon oxynitride film, is formed on a side which is closer to the oxide semiconductor layer 2716 than the insulating film having a high barrier property. Then, the insulating film having a high barrier property is formed so as to overlap with the conductive layer 2719, the conductive layer 2720, and the oxide semiconductor layer 2716 with the insulating film having a low proportion of nitrogen positioned therebetween.

When the insulating film having a high barrier property is used, impurities such as moisture and hydrogen can be prevented from entering the oxide semiconductor layer 2716, the gate insulating film 2721, or an interface between the oxide semiconductor layer 2716 and another insulating film and the vicinity thereof. In addition, the insulating film having a low proportion of nitrogen, such as a silicon oxide film or a silicon oxynitride film, formed in contact with the oxide semiconductor layer 2716 can prevent the insulating film formed using a material having a high barrier property from being in direct contact with the oxide semiconductor layer 2716.

In this embodiment, the gate insulating film 2721 having a structure in which a 100-nm-thick silicon nitride film formed by a sputtering method is stacked over a 200-nm-thick silicon oxide film formed by a sputtering method is formed. The substrate temperature in film formation may be higher than or equal to room temperature and lower than or equal to 300° C. and, in this embodiment, is 100° C.

Note that after the gate insulating film 2721 is formed, heat treatment may be performed. The heat treatment is performed in a nitrogen atmosphere, ultra-dry air, or a rare gas (such as argon or helium) atmosphere preferably at a temperature higher than or equal to 200° C. and lower than or equal to 400° C., for example, higher than or equal to 250° C. and lower than or equal to 350° C. The water content in the gas is preferably 20 ppm or less, further preferably 1 ppm or less, still further preferably 10 ppb or less. In this embodiment, for example, the heat treatment is performed at 250° C. for one hour in a nitrogen atmosphere. Alternatively, RTA treatment may be performed at a high temperature for a short time before the formation of the conductive layer 2719 and the conductive layer 2720, in a manner similar to that of the heat treatment performed on the oxide semiconductor layer for reduction of moisture or hydrogen.

Even when an oxygen vacancy is generated in the oxide semiconductor layer 2716 by the heat treatment performed on the oxide semiconductor layer 2716, oxygen is supplied to the oxide semiconductor layer 2716 from the gate insulating film 2721 containing oxygen by performing heat treatment after provision of the gate insulating film 2721. By supplying oxygen to the oxide semiconductor layer 2716, oxygen vacancies that serve as donors can be reduced in the oxide semiconductor layer 2716 and the stoichiometric composition can be satisfied. It is preferable that the proportion of oxygen in the oxide semiconductor layer 2716 be higher than that in the stoichiometric proportion. As a result, the oxide semiconductor layer 2716 can be made to be substantially i-type and variation in electric characteristics of the transistor due to oxygen vacancies can be reduced, which results in improvement of the electric characteristics.

There is no particular limitation on the timing of this heat treatment as long as it is performed after formation of the gate insulating film 2721. When the heat treatment serves also as heat treatment in another step (e.g., heat treatment at the time of formation of a resin film or heat treatment for lowering the resistance of a transparent conductive film), the oxide semiconductor layer 2716 can be made to be substantially i-type without an increase in the number of steps.

Further, oxygen vacancies that serve as donors in the oxide semiconductor layer 2716 may be reduced by performing heat treatment on the oxide semiconductor layer 2716 in an oxygen atmosphere so that oxygen is added to the oxide semiconductor. The heat treatment is performed at a temperature, for example, higher than or equal to 100° C. and lower than 350° C., preferably higher than or equal to 150° C. and lower than 250° C. It is preferable that an oxygen gas used for the heat treatment in an oxygen atmosphere do not contain water, hydrogen, and the like. Alternatively, the purity of an oxygen gas which is introduced into the heat treatment apparatus is preferably higher than or equal to 6N (99.9999%), further preferably higher than or equal to 7N (99.99999%) (that is, the impurity concentration of the oxygen gas is preferably lower than or equal to 1 ppm, further preferably lower than or equal to 0.1 ppm).

Alternatively, oxygen may be added to the oxide semiconductor layer 2716 by an ion implantation method, an ion doping method, or the like so that oxygen vacancies that serve as donors are reduced. For example, oxygen made to be plasma with a microwave of 2.45 GHz may be added to the oxide semiconductor layer 2716.

The gate electrode 2722 can be formed in such a manner that a conductive film is formed over the gate insulating film 2721 and then is processed by etching. The gate electrode 2722 can be formed using a material similar to that for the gate electrode 2707 or the conductive layers 2719 and 2720.

The thickness of the gate electrode 2722 is 10 nm to 400 nm, preferably 100 nm to 200 nm. In this embodiment, a 150-nm-thick conductive film for the gate electrode is formed by a sputtering method using a tungsten target, and then the conductive film is processed into a desired shape by etching, so that the gate electrode 2722 is formed. Note that a resist mask may be formed by an inkjet method. Formation of the resist mask by an inkjet method needs no photomask; thus, manufacturing cost can be reduced.

Through the above steps, the transistor 102 is formed.

In the transistor 102, the source electrode and the drain electrode (the conductive layer 2719 and the conductive layer 2720) do not overlap with the gate electrode 2722. A gap which is larger than the thickness of the gate insulating film 2721 is provided between the source and drain electrodes (the conductive layers 2719 and 2720) and the gate electrode 2722. Thus, in the transistor 102, parasitic capacitance between the source and drain electrodes and the gate electrode can be reduced. Consequently, high-speed operation can be achieved.

Note that the transistor 102 is not limited to a transistor whose channel formation region is formed in an oxide semiconductor layer. As the transistor 102, it is possible to use a transistor that includes a semiconductor material whose bandgap is wider than that of silicon and whose intrinsic carrier density is lower than that of silicon in a channel formation region. As such a semiconductor material, for example, silicon carbide or gallium nitride can be used instead of an oxide semiconductor. With a channel formation region including such a semiconductor material, a transistor with extremely small off-state current can be provided.

Although the transistor 102 is described as a single-gate transistor in this embodiment, a multi-gate transistor which includes a plurality of gate electrodes electrically connected so that a plurality of channel formation regions is formed can be manufactured as needed.

Note that an insulating film in contact with the oxide semiconductor layer 2716 (which corresponds to the gate insulating film 2721 in this embodiment) may be formed using an insulating material containing a Group 13 element and oxygen. Many of oxide semiconductor materials contain Group 13 elements, and an insulating material containing a Group 13 element is compatible with an oxide semiconductor. Thus, when an insulating material containing a Group 13 element is used for the insulating film in contact with the oxide semiconductor layer, the state of the interface between the oxide semiconductor layer and the insulating film can be kept favorable.

The insulating material containing a Group 13 element is an insulating material containing one or more Group 13 elements. As examples of the insulating material containing a Group 13 element, gallium oxide, aluminum oxide, aluminum gallium oxide, and gallium aluminum oxide are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, when a material containing gallium oxide is used for an insulating film in contact with an oxide semiconductor layer containing gallium, characteristics at an interface between the oxide semiconductor layer and the insulating film can be kept favorable. For example, the oxide semiconductor layer and the insulating film containing gallium oxide are provided in contact with each other, so that pile up of hydrogen at the interface between the oxide semiconductor layer and the insulating film can be reduced.

Note that a similar effect can be obtained in the case where an element in the same group as a constituent element of the oxide semiconductor is used in an insulating film. For example, it is effective to form an insulating film with the use of a material containing aluminum oxide. Aluminum oxide does not easily transmit water. Thus, it is preferable to use the material containing aluminum oxide in order to prevent water from entering the oxide semiconductor layer.

The insulating film in contact with the oxide semiconductor layer 2716 is preferably made to contain oxygen in a proportion higher than that in the stoichiometric composition by heat treatment in an oxygen atmosphere or by oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen made to be plasma is added to a bulk. The oxygen doping may be performed by an ion implantation method or an ion doping method.

For example, in the case where the insulating film in contact with the oxide semiconductor layer 2716 is formed using gallium oxide, the composition of gallium oxide can be set to be $Ga_2O_X$ ($X=3+\alpha$, $0<\alpha<1$) by heat treatment in an oxygen atmosphere or by oxygen doping.

In the case where the insulating film in contact with the oxide semiconductor layer 2716 is formed using aluminum oxide, the composition of aluminum oxide can be set to be $Al_2O_X$ ($X=3+\alpha$, $0<\alpha<1$) by heat treatment in an oxygen atmosphere or by oxygen doping.

In the case where the insulating film which is in contact with the oxide semiconductor layer 2716 is formed using gallium aluminum oxide (aluminum gallium oxide), the composition of gallium aluminum oxide (aluminum gallium oxide) can be set to be $Ga_XAl_{2-X}O_{3+\alpha}$ ($0<X<2$, $0<\alpha<1$) by heat treatment in an oxygen atmosphere or by oxygen doping.

By oxygen doping, an insulating film which includes a region where the proportion of oxygen is higher than that in the stoichiometric composition can be formed. When the insulating film including such a region is in contact with the oxide semiconductor layer, excess oxygen in the insulating film is supplied to the oxide semiconductor layer, and oxygen defects in the oxide semiconductor layer or at the interface between the oxide semiconductor layer and the insulating film are reduced. Thus, the oxide semiconductor layer can be made to be an i-type or substantially i-type oxide semiconductor.

Note that the insulating film including a region where the proportion of oxygen is higher than that in the stoichiometric composition may be applied to either the insulating film located on the upper side of the oxide semiconductor layer 2716 or the insulating film located on the lower side of the oxide semiconductor layer 2716 of the insulating films in contact with the oxide semiconductor layer 2716; however, it is preferable to apply such an insulating film to both the insulating films. The above effect can be enhanced with a structure where the oxide semiconductor layer 2716 is interposed between the insulating films each including a region where the proportion of oxygen is higher than that in the stoichiometric composition, which are used as the insulating films in contact with the oxide semiconductor layer 2716 and located on the upper side and the lower side of the oxide semiconductor layer 2716.

The insulating films located on the upper side and the lower side of the oxide semiconductor layer 2716 may contain the same constituent element or different constituent elements. For example, the insulating films on the upper side and the lower side may be both formed using gallium oxide whose composition is $Ga_2O_X$ ($X=3+\alpha$, $0<\alpha<1$). Alternatively, one of the insulating films on the upper side and the lower side may be formed using gallium oxide whose composition is $Ga_2O_X$ ($X=3+\alpha$, $0<\alpha<1$) and the other may be formed using aluminum oxide whose composition is $Al_2O_X$ ($X=3+\alpha$, $0<\alpha<1$).

The insulating film in contact with the oxide semiconductor layer 2716 may be formed by stacking insulating films each including a region where the proportion of oxygen is higher than that in the stoichiometric composition. For example, the insulating film on the upper side of the oxide semiconductor layer 2716 may be formed as follows: gallium oxide whose composition is $Ga_2O_X$ ($X=3+a$, $0<\alpha<1$) is formed and gallium aluminum oxide (aluminum gallium oxide) whose composition is $Ga_XAl_{2-X}O_{3+\alpha}$ ($0<X<2$, $0<\alpha<1$) is formed thereover. Note that the insulating film on the lower side of the oxide semiconductor layer 2716 may be formed by stacking insulating films each including a region where the proportion of oxygen is higher than that in the stoichiometric composition. Alternatively, both the insulating films on the upper side and the lower side of the oxide semiconductor layer 2716 may be formed by stacking insulating films each including a region where the proportion of oxygen is higher than that in the stoichiometric composition.

Figure 22C:
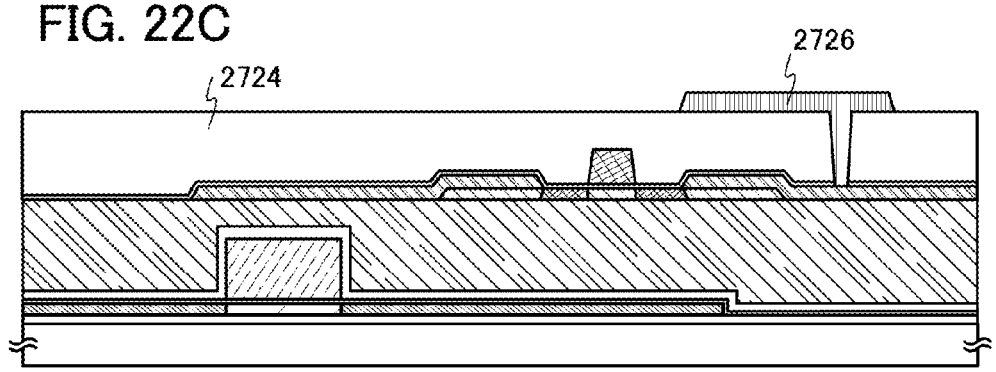

Next, as illustrated in FIG. 22C, an insulating film 2724 is formed so as to cover the gate insulating film 2721 and the gate electrode 2722.

The insulating film 2724 can be formed by a PVD method, a CVD method, or the like. The insulating film 2724 can be formed using a material containing an inorganic insulating material such as silicon oxide, silicon oxynitride, silicon nitride, hafnium oxide, gallium oxide, or aluminum oxide.

Note that for the insulating film 2724, a material with a low dielectric constant or a structure with a low dielectric constant (e.g., a porous structure) is preferably used. When the dielectric constant of the insulating film 2724 is lowered, parasitic capacitance generated between wirings or electrodes can be reduced, which results in higher speed operation.

Note that although the insulating film 2724 has a single-layer structure in this embodiment, one embodiment of the present invention is not limited to this structure. The insulating film 2724 may have a stacked structure including two or more layers.

Next, an opening is formed in the gate insulating film 2721 and the insulating film 2724, so that part of the conductive layer 2720 is exposed. After that, a wiring 2726 which is in contact with the conductive layer 2720 through the opening is formed over the insulating film 2724.

The wiring 2726 is formed in such a manner that a conductive film is formed by a PVD method or a CVD method and then is processed by etching. As a material for the conductive film, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used as a material for the conductive film.

Specifically, for example, it is possible to employ a method in which a thin titanium film (approximately 5 nm) is formed in a region including the opening of the insulating film 2724 by a PVD method, and then an aluminum film is formed so as to be embedded in the opening. Here, the titanium film formed by a PVD method has a function of reducing an oxide film (e.g., a native oxide film) formed on a surface over which the titanium film is formed, to reduce the contact resistance with the lower electrode or the like (here, the conductive layer 2720). In addition, hillock of the aluminum film can be prevented. A copper film may be formed by a plating method after the formation of the barrier film of titanium, titanium nitride, or the like.

Figure 22D:
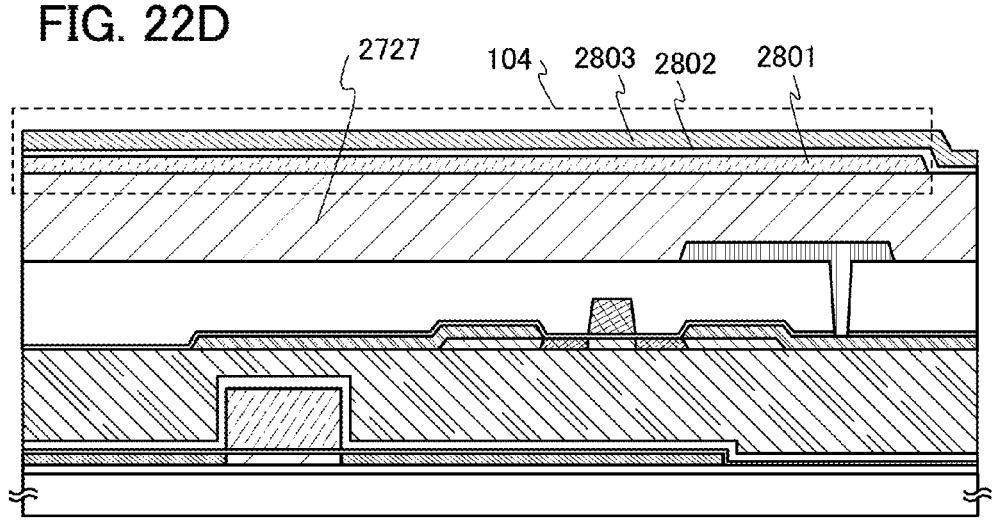

Next, as illustrated in FIG. 22D, an insulating film 2727 is formed so as to cover the wiring 2726. Further, a conductive film is formed over the insulating film 2727 and then is processed by etching, so that a conductive layer 2801 is formed. After that, an insulating film 2802 is formed so as to cover the conductive layer 2801, and a conductive film 2803 is formed over the insulating film 2802. In this manner, the capacitor 104 can be formed.

One terminal of the capacitor 104 corresponds to the conductive layer 2801, the other terminal of the capacitor 104 corresponds to the conductive film 2803, and a dielectric layer of the capacitor 104 corresponds to the insulating film 2802. Here, materials for the insulating film 2727, the conductive layer 2801, the insulating film 2802, and the conductive film 2803 may be similar to those for the above-described other insulating films and conductive layers.

Through the above steps, the signal processing circuit 120 can be manufactured.

This embodiment can be combined with any of the other embodiments as appropriate.

Embodiment 8

In this embodiment, the oxide used for the oxide semiconductor layer in Embodiment 7 will be described. The oxide includes a crystal with c-axis alignment (also referred to as a c-axis aligned crystal (CAAC)) that has a triangular or hexagonal atomic arrangement when seen from the direction of an a-b plane, a surface, or an interface. In the crystal, metal atoms are arranged in a layered manner along the c-axis, or metal atoms and oxygen atoms are arranged in a layered manner along the c-axis, and the direction of the a-axis or the b-axis is varied in the a-b plane (the crystal rotates around the c-axis).

In a broad sense, an oxide including a CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (a crystalline portion), a boundary between one crystalline portion and another crystalline portion is not clear in some cases.

In the case where oxygen is included in the CAAC, nitrogen may be substituted for part of oxygen included in the CAAC. The c-axes of the individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a substrate over which the CAAC is formed, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 23A to 23E, FIGS. 24A to 24C, FIGS. 25A to 25C, and FIGS. 26A and 26B. In FIGS. 23A to 23E, FIGS. 24A to 24C, FIGS. 25A to 25C, and FIGS. 26A and 26B, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane).

Furthermore, in FIG. 23A to 23E, O surrounded by a circle represents tetracoordinate O and a double circle represents tricoordinate O.

Figure 23A:
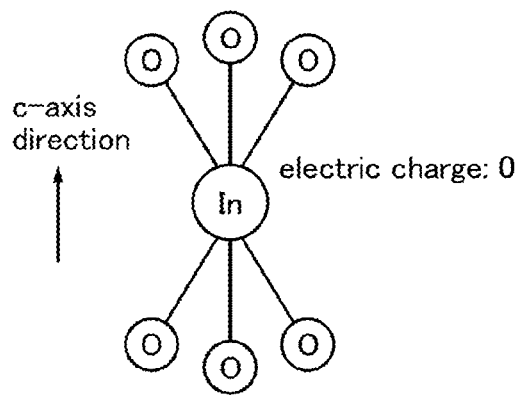
FIGS. 23A to 23E illustrate structures of oxide materials.

FIG. 23A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 23A is actually an octahedral structure, but is illustrated as a planar structure for simplicity. Note that three tetracoordinate O atoms exist in each of an upper half and a lower half in FIG. 23A. In the small group illustrated in FIG. 23A, electric charge is 0.

Figure 23D:
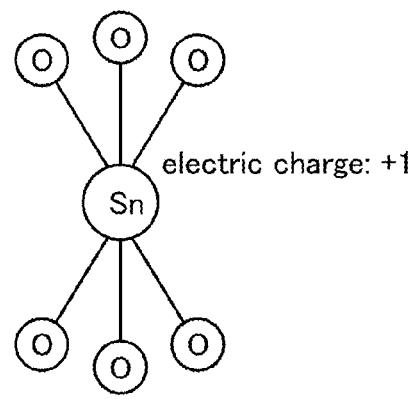
Figure 23B:
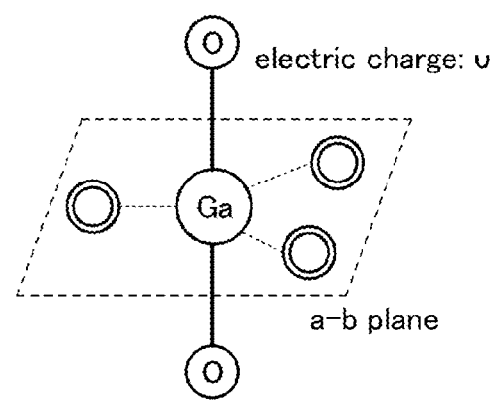

FIG. 23B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 23B. An In atom can also have the structure illustrated in FIG. 23B because an In atom can have five ligands. In the small group illustrated in FIG. 23B, electric charge is 0.

Figure 23E:
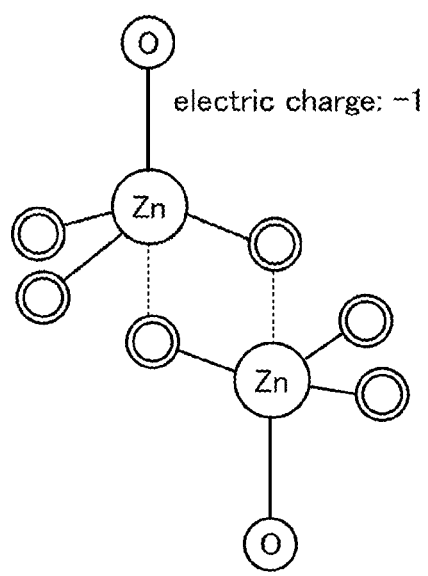
Figure 23C:
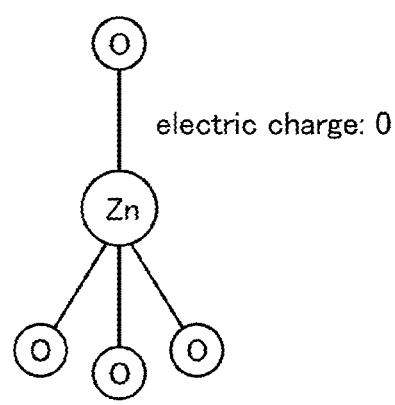

FIG. 23C illustrates a structure including one tetracoordinate Zn atom and four tetracoordinate O atoms proximate to the Zn atom. In FIG. 23C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 23C. In the small group illustrated in FIG. 23C, electric charge is 0.

FIG. 23D illustrates a structure including one hexacoordinate Sn atom and six tetracoordinate O atoms proximate to the Sn atom. In FIG. 23D, three tetracoordinate O atoms exist in each of an upper half and a lower half In the small group illustrated in FIG. 23D, electric charge is +1.

FIG. 23E illustrates a small group including two Zn atoms. In FIG. 23E, one tetracoordinate O atom exists in each of an upper half and a lower half In the small group illustrated in FIG. 23E, electric charge is −1.

Here, a plurality of small groups forms a medium group, and a plurality of medium groups forms a large group (also referred to as a unit cell).

Now, a rule of bonding between the small groups will be described. The three O atoms in the upper half with respect to the hexacoordinate In atom in FIG. 23A each have three proximate In atoms in the downward direction, and the three O atoms in the lower half each have three proximate In atoms in the upward direction. The one O atom in the upper half with respect to the pentacoordinate Ga atom in FIG. 23B has one proximate Ga atom in the downward direction, and the one O atom in the lower half has one proximate Ga atom in the upward direction. The one O atom in the upper half with respect to the tetracoordinate Zn atom in FIG. 23C has one proximate Zn atom in the downward direction, and the three O atoms in the lower half each have three proximate Zn atoms in the upward direction.

In this manner, the number of tetracoordinate O atoms above a metal atom is equal to the number of metal atoms proximate to and below each of the tetracoordinate O atoms. Similarly, the number of tetracoordinate O atoms below a metal atom is equal to the number of metal atoms proximate to and above each of the tetracoordinate O atoms. Since the coordination number of the tetracoordinate O atom is 4, the sum of the number of metal atoms proximate to and below the O atom and the number of metal atoms proximate to and above the O atom is 4.

Accordingly, when the sum of the number of tetracoordinate O atoms above a metal atom and the number of tetracoordinate O atoms below another metal atom is 4, the two kinds of small groups including the metal atoms can be bonded.

For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 24A illustrates a model of a medium group included in a layered structure of an In—Sn—Zn—O-based material. FIG. 24B illustrates a large group including three medium groups. FIG. 24C illustrates an atomic arrangement in the case where the layered structure in FIG. 24B is observed from the c-axis direction.

In FIG. 24A, for simplicity, a tricoordinate O atom is omitted and a tetracoordinate O atom is shown by a circle; the number in the circle shows the number of tetracoordinate O atoms. For example, three tetracoordinate O atoms existing in each of an upper half and a lower half with respect to a Sn atom are denoted by circled 3. Similarly, in FIG. 24A, one tetracoordinate O atom existing in each of an upper half and a lower half with respect to an In atom is denoted by circled 1. FIG. 24A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 24A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge of a small group including a Sn atom is +1. Therefore, electric charge of −1, which cancels +1, is needed to form a layered structure including a Sn atom. As a structure having electric charge of −1, the small group including two Zn atoms as illustrated in FIG. 23E can be given. For example, with one small group including two Zn atoms, electric charge of one small group including a Sn atom can be cancelled, so that the total electric charge of the layered structure can be 0.

When the large group illustrated in FIG. 24B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 25A:
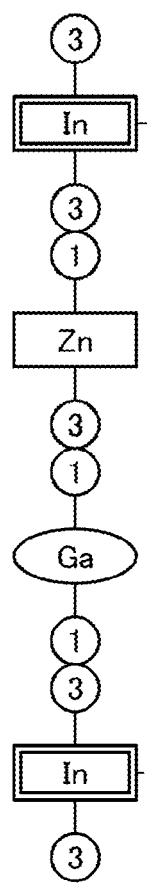
FIGS. 25A to 25C illustrate a structure of an oxide material.

As an example, FIG. 25A illustrates a model of a medium group included in a layered structure of an In—Ga—Zn—O-based material.

In the medium group included in the layered structure of the In—Ga—Zn—O-based material in FIG. 25A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

Figure 25B:
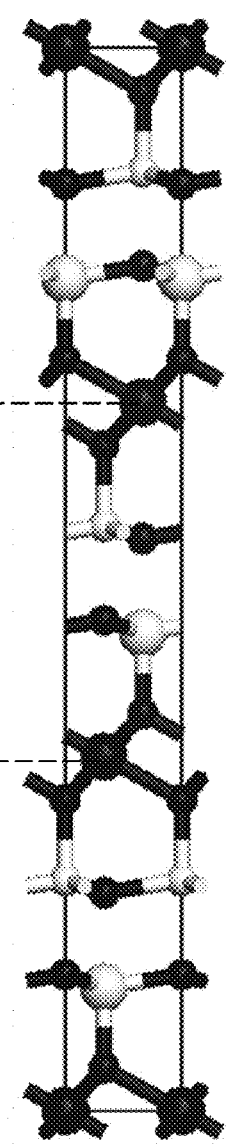
Figure 25C:
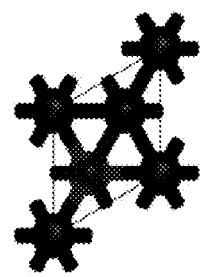

FIG. 25B illustrates a large group including three medium groups. FIG. 25C illustrates an atomic arrangement in the case where the layered structure in FIG. 25B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 25A but also a medium group in which the arrangement of the In atom, the Ga atom, and the Zn atom is different from that in FIG. 25A.

When the large group illustrated in FIG. 25B is repeated, an In—Ga—Zn—O-based crystal can be obtained. Note that a layered structure of the obtained In—Ga—Zn—O-based crystal can be expressed as a composition formula, $InGaO_3(ZnO)_n$ (n is a natural number).

Figure 26A:
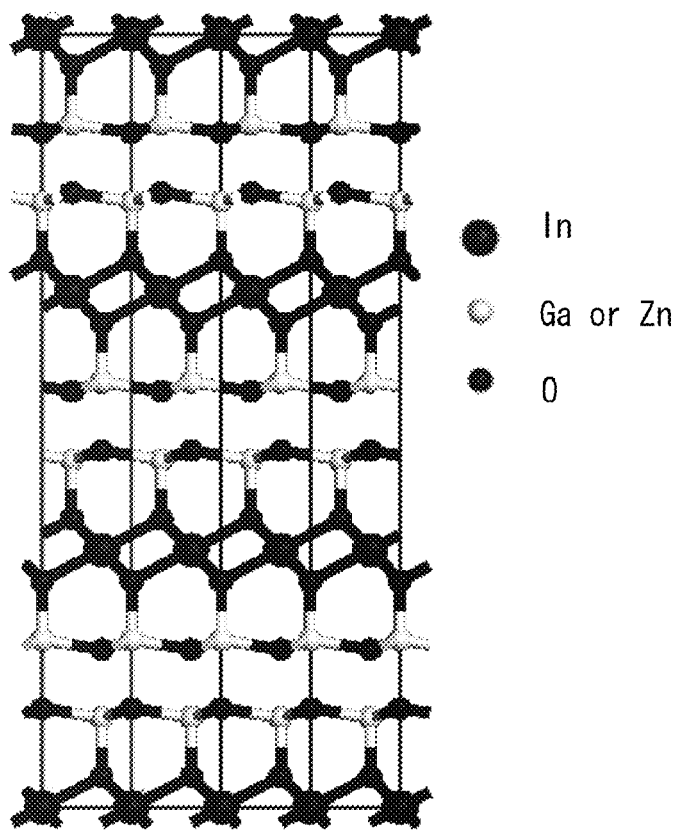
FIGS. 26A and 26B each illustrate a crystal structure of an oxide material.

In the case where n=1 ($InGaZnO_4$), a crystal structure illustrated in FIG. 26A can be obtained, for example. Note that in the crystal structure in FIG. 26A, since a Ga atom and an In atom each have five ligands as illustrated in FIG. 23B, a structure in which Ga is replaced with In can be obtained.

Figure 26B:
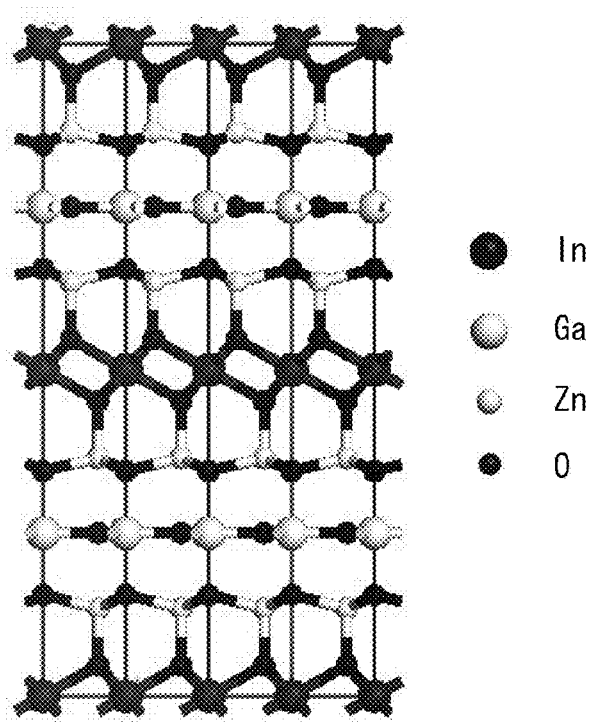

In the case where n=2 ($InGaZn_2O_5$), a crystal structure illustrated in FIG. 26B can be obtained, for example. Note that in the crystal structure in FIG. 26B, since a Ga atom and an In atom each have five ligands as illustrated in FIG. 23B, a structure in which Ga is replaced with In can be obtained.

Embodiment 9

In this embodiment, a transistor which is formed using an oxide semiconductor layer and has a structure different from the structures in Embodiments 6 and 7 will be described with reference to FIGS. 27A to 27C. Note that the reference numerals in the drawings used in the above embodiments are also used in this embodiment.

Figure 27A:
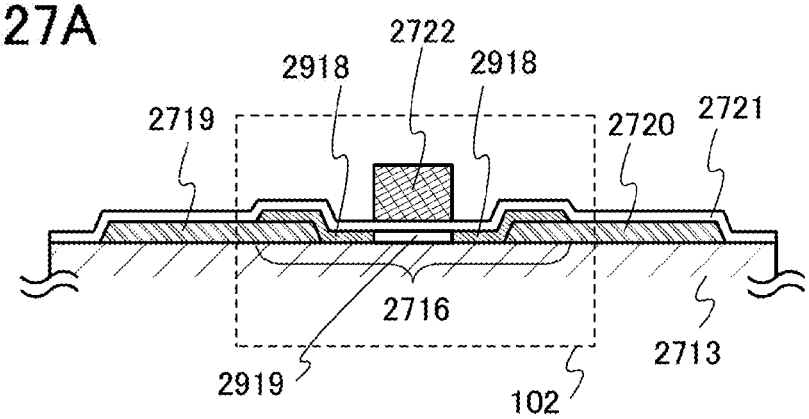
FIGS. 27A to 27C each illustrate an example of a structure of a transistor.

The transistor 102 illustrated in FIG. 27A is a top-gate transistor in which the gate electrode 2722 is formed over the oxide semiconductor layer 2716 and is also a bottom-contact transistor in which the source electrode and the drain electrode (the conductive layer 2719 and the conductive layer 2720) are formed below the oxide semiconductor layer 2716.

Further, the oxide semiconductor layer 2716 includes a pair of high-concentration regions 2918. The pair of high-concentration regions 2918 can be obtained by adding a dopant imparting n-type conductivity to the oxide semiconductor layer 2716 after the gate electrode 2722 is formed. Further, a region which is included in the oxide semiconductor layer 2716 and overlaps with the gate electrode 2722 with the gate insulating film 2721 positioned therebetween is a channel formation region 2919. In the oxide semiconductor layer 2716, the channel formation region 2919 is provided between the pair of high-concentration regions 2918.

The high-concentration regions 2918 can be formed in a manner similar to that of the high-concentration regions 2723 described in Embodiment 7.

Figure 27B:
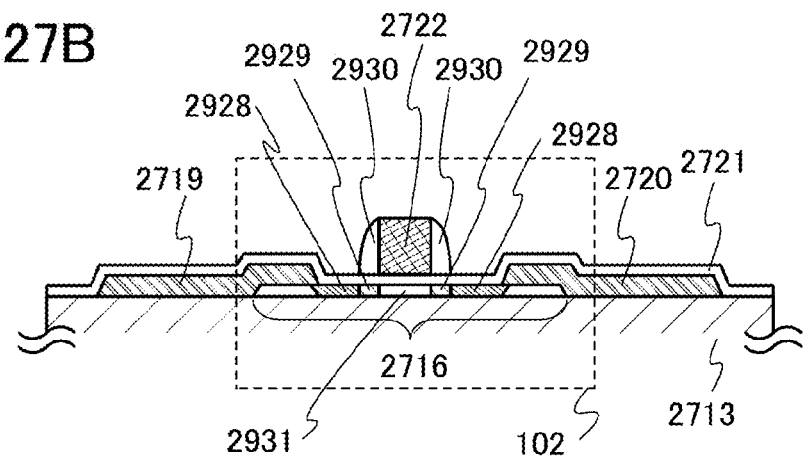

The transistor 102 illustrated in FIG. 27B is a top-gate transistor in which the gate electrode 2722 is formed over the oxide semiconductor layer 2716 and is also a top-contact transistor in which the source electrode and the drain electrode (the conductive layer 2719 and the conductive layer 2720) are formed over the oxide semiconductor layer 2716. In addition, the transistor 102 includes sidewalls 2930 which are provided on the sides of the gate electrode 2722 and are formed using an insulating film.

Further, the oxide semiconductor layer 2716 includes a pair of high-concentration regions 2928 and a pair of low-concentration regions 2929. The pair of high-concentration regions 2928 and the pair of low-concentration regions 2929 can be obtained by adding a dopant imparting n-type conductivity to the oxide semiconductor layer 2716 after the gate electrode 2722 is formed.

Further, a region which is included in the oxide semiconductor layer 2716 and overlaps with the gate electrode 2722 with the gate insulating film 2721 positioned therebetween is a channel formation region 2931. In the oxide semiconductor layer 2716, the channel formation region 2931 is provided between the pair of low-concentration regions 2929 provided between the pair of high-concentration regions 2928. Further, the pair of low-concentration regions 2929 is provided in regions which are included in the oxide semiconductor layer 2716 and overlap with the sidewalls 2930 with the gate insulating film 2721 positioned therebetween.

The high-concentration regions 2928 and the low-concentration regions 2929 can be formed in a manner similar to that of the high-concentration regions 2723 described in Embodiment 7.

Figure 27C:
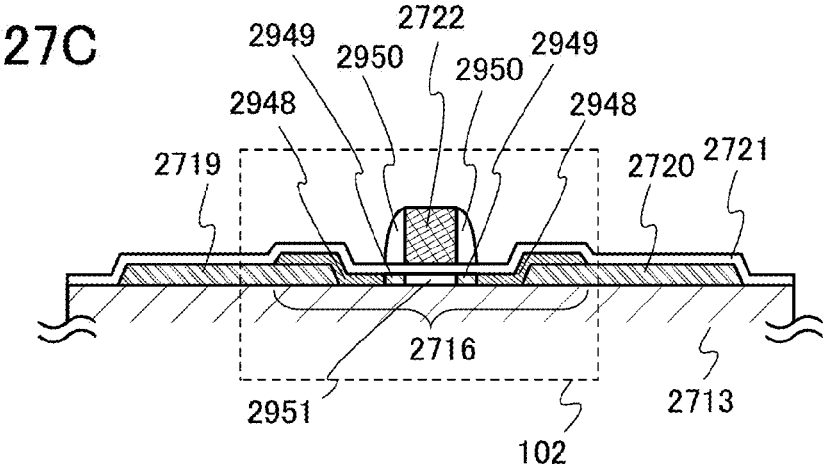

The transistor 102 illustrated in FIG. 27C is a top-gate transistor in which the gate electrode 2722 is formed over the oxide semiconductor layer 2716 and is also a bottom-contact transistor in which the source electrode and the drain electrode (the conductive layer 2719 and the conductive layer 2720) are formed below the oxide semiconductor layer 2716. In addition, the transistor 102 includes sidewalls 2950 which are provided on the sides of the gate electrode 2722 and are formed using an insulating film.

Further, the oxide semiconductor layer 2716 includes a pair of high-concentration regions 2948 and a pair of low-concentration regions 2949. The pair of high-concentration regions 2948 and the pair of low-concentration regions 2949 can be obtained by adding a dopant imparting n-type conductivity to the oxide semiconductor layer 2716 after the gate electrode 2722 is formed.

Further, a region which is included in the oxide semiconductor layer 2716 and overlaps with the gate electrode 2722 with the gate insulating film 2721 positioned therebetween is a channel formation region 2951. In the oxide semiconductor layer 2716, the channel formation region 2951 is provided between the pair of low-concentration regions 2949 provided between the pair of high-concentration regions 2948. Further, the pair of low-concentration regions 2949 is provided in regions which are included in the oxide semiconductor layer 2716 and overlap with the sidewalls 2950 with the gate insulating film 2721 positioned therebetween.

The high-concentration regions 2948 and the low-concentration regions 2949 can be formed in a manner similar to that of the high-concentration regions 2723 described in Embodiment 7.

This embodiment can be combined with any of the other embodiments as appropriate.

Embodiment 10

Figure 28A:
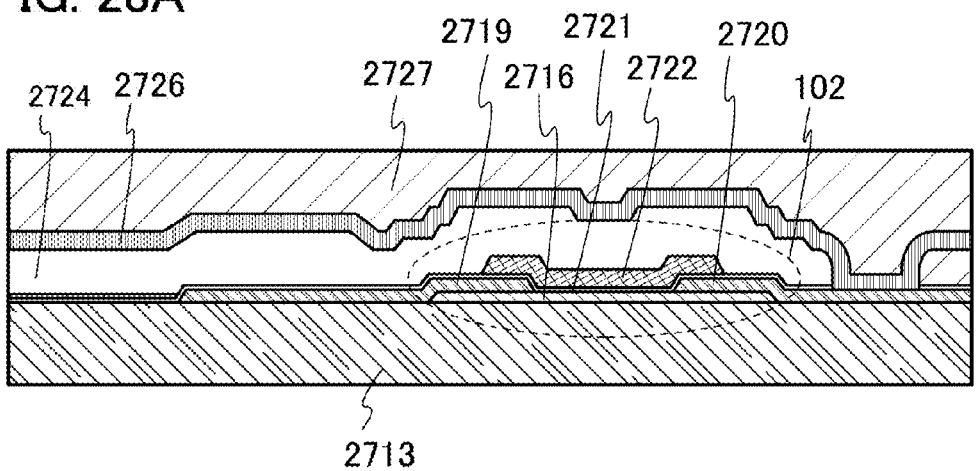
FIGS. 28A and 28B each illustrate an example of a structure of a transistor.
Figure 28B:
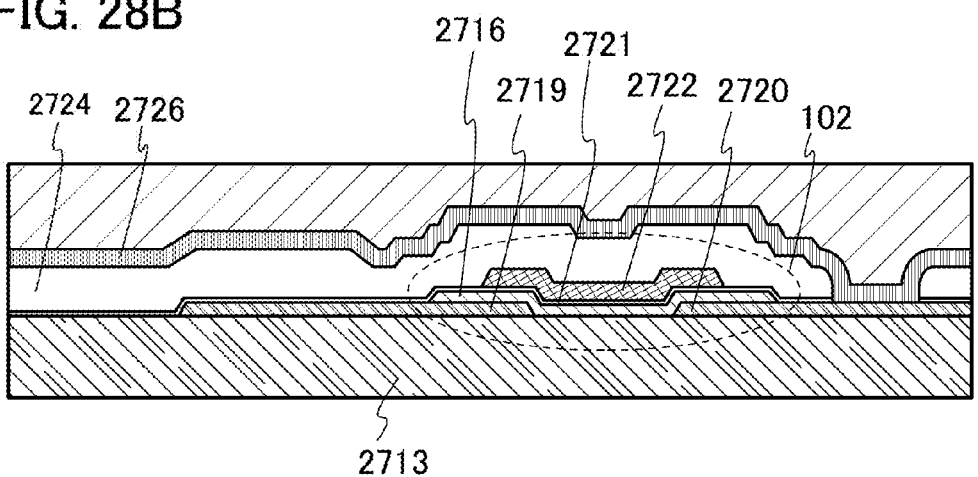

In this embodiment, a transistor which is formed using an oxide semiconductor layer and has a structure different from the structures in Embodiments 6, 7, and 9 will be described with reference to FIGS. 28A and 28B. Note that the reference numerals in the drawings used in the above embodiments are also used in this embodiment.

In the transistor 102 in this embodiment, the gate electrode 2722 is provided so as to overlap with the conductive layer 2719 and the conductive layer 2720. In addition, the transistor 102 in this embodiment is different from the transistor 102 described in Embodiments 6, 7, and 9 in that an impurity element imparting a conductivity type is not added to the oxide semiconductor layer 2716 with the use of the gate electrode 2722 as a mask.

In the transistor 102 illustrated in FIG. 28A, the oxide semiconductor layer 2716 is provided below the conductive layer 2719 and the conductive layer 2720. In the transistor 102 illustrated in FIG. 28B, the oxide semiconductor layer 2716 is provided above the conductive layer 2719 and the conductive layer 2720. Note that although a top surface of the insulating film 2724 is not planarized in each of FIGS. 28A and 28B, one embodiment of the present invention is not limited to this structure. The top surface of the insulating film 2724 may be planarized.

This embodiment can be combined with any of the other embodiments as appropriate.

Embodiment 11

In this embodiment, characteristics of a transistor will be described with reference to FIG. 29, FIGS. 30A to 30C, FIGS. 31A to 31C, FIGS. 32A to 32C, and FIGS. 33A and 33B.

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following formula.

$$\mu = \mu_0 \exp\left(-\frac{E}{kT}\right) \qquad \text{[Formula 2]}$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \qquad \text{[Formula 3]}$$

Here, e represents the elementary charge, N represents the average defect density per unit area in a channel, $\varepsilon$ represents the dielectric constant of the semiconductor, n represents the number of carriers per unit area in the channel, $C_{ox}$ represents the capacitance per unit area, $V_g$ represents the gate voltage, and t represents the thickness of a channel formation region. In the case where the thickness of the semiconductor layer is less than or equal to 30 nm, the thickness of the channel formation region may be regarded as being the same as the thickness of the semiconductor layer. The drain current $I_d$ in a linear region can be expressed as the following formula.

$$I_d = \frac{W \mu V_g V_d C_{ox}}{L} \exp\left(-\frac{E}{kT}\right) \qquad \text{[Formula 4]}$$

Here, L represents the channel length and W represents the channel width, and L and W are each 10 μm in this case. In addition, $V_d$ represents the drain voltage. When dividing both sides of the above equation by $V_g$ and then taking logarithms of both sides, the following formula can be obtained.

$$\ln\left(\frac{I_d}{V_g}\right) = \qquad \text{[Formula 5]}$$

$$\ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g}$$

The right side of Formula 5 is a function of $V_g$. From the formula, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1\times10^{12}/\text{cm}^2$.

On the basis of the defect density obtained in this manner, or the like, $\mu_0$ can be calculated to be 120 cm$^2$/Vs from Formula 2 and Formula 3. The measured mobility of an In—Sn—Zn oxide including a defect is approximately 35 cm$^2$/Vs. However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside the semiconductor, scattering at an interface between a channel formation region and a gate insulating film affects the transport property of the transistor. In other words, the mobility $\mu_1$ of the oxide semiconductor at a position that is distance x away from the interface between the channel formation region and the gate insulating film can be expressed as the following formula.

$$\frac{1}{\mu_1} = \frac{1}{\mu_0} + \frac{D}{B}\exp\left(-\frac{x}{G}\right) \qquad \text{[Formula 6]}$$

Here, D represents the electric field in the gate direction, and B and G are constants. B and G can be obtained from actual measurement results; according to the above measurement results, B is $4.75\times10^7$ cm/s and G is 10 nm (the depth to which the influence of interface scattering reaches). When D is increased (i.e., when the gate voltage is increased), the second term of Formula 6 is increased and accordingly the mobility $\mu_1$ is decreased.

Figure 29:
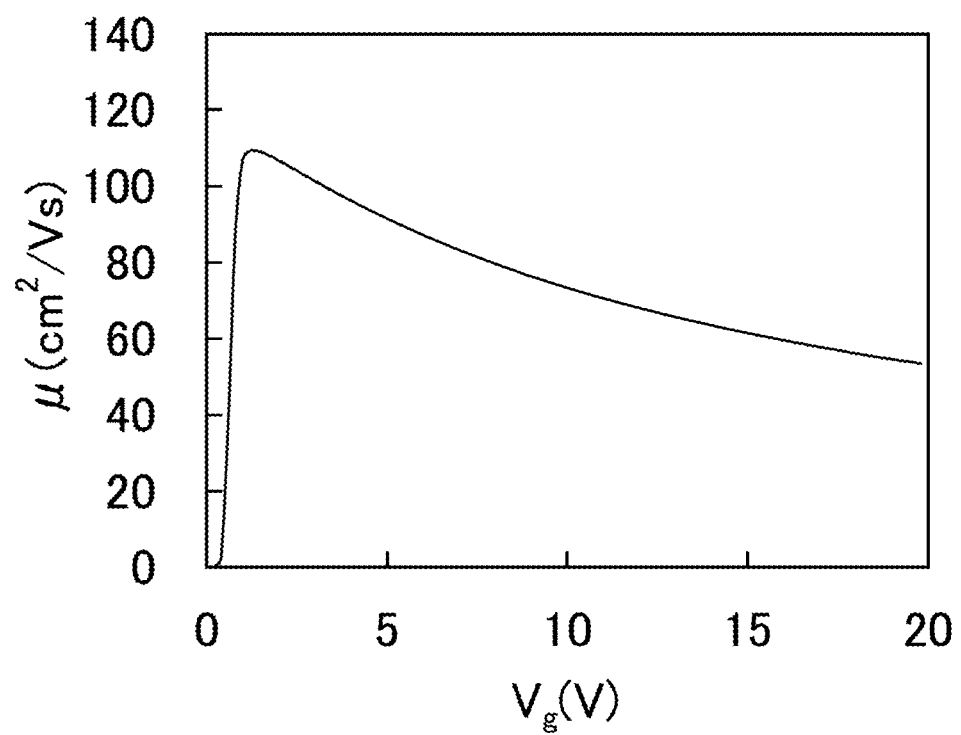
FIG. 29 shows gate voltage dependence of mobility, which is obtained by calculation.

Calculation results of the mobility $\mu_2$ of a transistor in which a channel formation region includes an ideal oxide semiconductor without a defect inside the semiconductor are shown in FIG. 29. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 29, the mobility has a peak of 100 cm$^2$/Vs or more at a gate voltage that is a little over 1 V, and is decreased as the gate voltage becomes higher because the influence of interface scattering is increased. Note that in order to reduce interface scattering, it is preferable that a surface of the semiconductor layer be flat at the atomic level (atomic layer flatness).

Calculation results of characteristics of minute transistors which are manufactured using an oxide semiconductor having such a mobility are shown in FIGS. 30A to 30C, FIGS. 31A to 31C, and FIGS. 32A to 32C. FIGS. 33A and 33B illustrate cross-sectional structures of the transistors used for the calculation.

The transistors illustrated in FIGS. 33A and 33B each include a semiconductor region (also referred to as an impurity region) 3103a and a semiconductor region (also referred to as an impurity region) 3103c which have n$^+$-type conductivity in an oxide semiconductor layer. The resistivities of the semiconductor region 3103a and the semiconductor region 3103c are each $2\times10^{-3}$ Ωcm.

The transistor illustrated in FIG. 33A is formed over a base insulating layer 3101 and an embedded insulator 3102 which is embedded in the base insulating layer 3101 and formed of aluminum oxide. The transistor includes the semiconductor region 3103a, the semiconductor region 3103c, an intrinsic semiconductor region 3103b serving as a channel formation region therebetween, and a gate electrode 3105. The width of the gate electrode 3105 is 33 nm.

A gate insulating film 3104 is formed between the gate electrode 3105 and the semiconductor region 3103b. In addition, a sidewall insulator 3106a and a sidewall insulator 3106b are formed on both side surfaces of the gate electrode 3105, and an insulator 3107 is formed over the gate electrode 3105 so as to prevent a short circuit between the gate electrode 3105 and another wiring. The sidewall insulator has a width of 5 nm. A conductive film 3108a serving as a source electrode and a conductive film 3108b serving as a drain electrode are provided in contact with the semiconductor region 3103a and the semiconductor region 3103c, respectively. Note that the channel width of this transistor is 40 nm.

The transistor illustrated in FIG. 33B is the same as the transistor illustrated in FIG. 33A in that it is formed over the base insulating layer 3101 and the embedded insulator 3102 formed of aluminum oxide and that it includes the semiconductor region 3103a, the semiconductor region 3103c, the intrinsic semiconductor region 3103b provided therebetween, the gate electrode 3105 having a width of 33 nm, the gate insulating film 3104, the sidewall insulator 3106a, the sidewall insulator 3106b, the insulator 3107, the conductive film 3108a, and the conductive film 3108b.

The transistor illustrated in FIG. 33A is different from the transistor illustrated in FIG. 33B in the conductivity type of semiconductor regions under the sidewall insulator 3106a and the sidewall insulator 3106b. In the transistor in FIG. 33A, the semiconductor regions under the sidewall insulator 3106a and the sidewall insulator 3106b are part of the semiconductor region 3103a having n$^+$-type conductivity and part of the semiconductor region 3103c having n$^+$-type conductivity, whereas in the transistor in FIG. 33B, the semiconductor regions under the sidewall insulator 3106a and the sidewall insulator 3106b are part of the intrinsic semiconductor region 3103b. In other words, in the semiconductor layer of FIG. 33B, a region having a width of $L_{\textit{off}}$ in which the semiconductor region 3103a (the semiconductor region 3103c) and the gate electrode 3105 do not overlap is provided. This region is called an offset region, and the width $L_{\textit{off}}$ is called an offset length. As is seen from the drawing, the offset length is equal to the width of the sidewall insulator 3106a (the sidewall insulator 3106b).

Figure 30A:
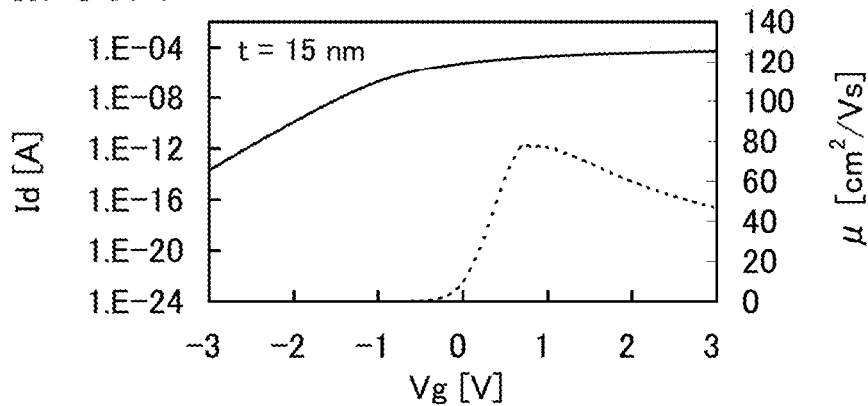
FIGS. 30A to 30C each show gate voltage dependence of drain current and mobility, which is obtained by calculation.
Figure 30B:
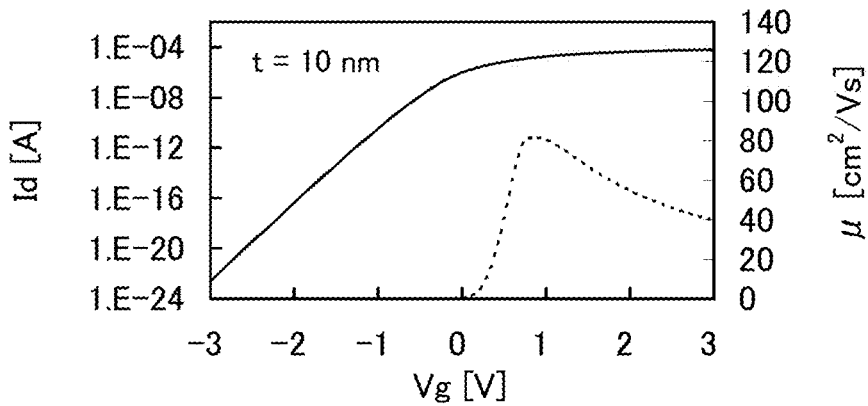
Figure 30C:
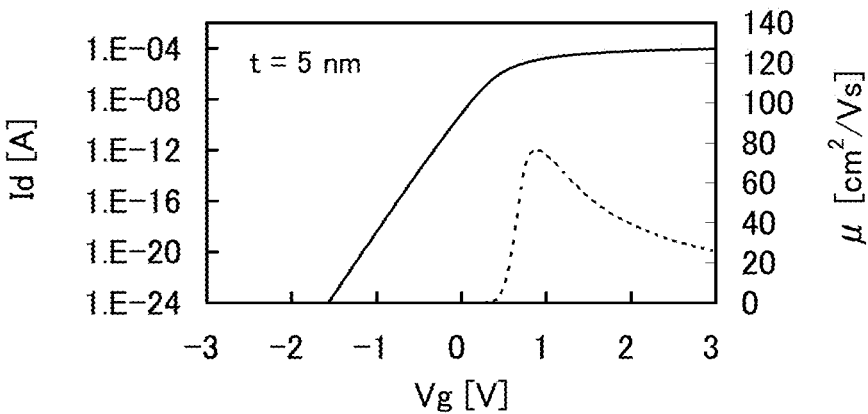

The other parameters used in calculation are as described above. For the calculation, device simulation software Sentaurus Device manufactured by Synopsys, Inc. was used. FIGS. 30A to 30C show the gate voltage ($V_g$: a potential difference between the gate and the source) dependence of the drain current ($I_d$, a solid line) and the mobility ($\mu$, a dotted line) of the transistor having the structure illustrated in FIG. 33A. The drain current $I_d$ is obtained by calculation under the assumption that the drain voltage (a potential difference between the drain and the source) is +1 V and the mobility $\mu$ is obtained by calculation under the assumption that the drain voltage is +0.1 V.

FIG. 30A shows the gate voltage dependence of the transistor in the case where the thickness of the gate insulating film is 15 nm, FIG. 30B shows that of the transistor in the case where the thickness of the gate insulating film is 10 nm, and FIG. 30C shows that of the transistor in the case where the thickness of the gate insulating film is 5 nm. As the gate insulating film is thinner, the drain current $I_d$ in an off state (off-state current) in particular is significantly decreased. In contrast, there is no noticeable change in the peak value of the mobility $\mu$ and the drain current $I_d$ in an on state (on-state current). The graphs show that the drain current exceeds 10 μA, which is required in a memory element and the like, at a gate voltage of around 1 V.

Figure 31A:
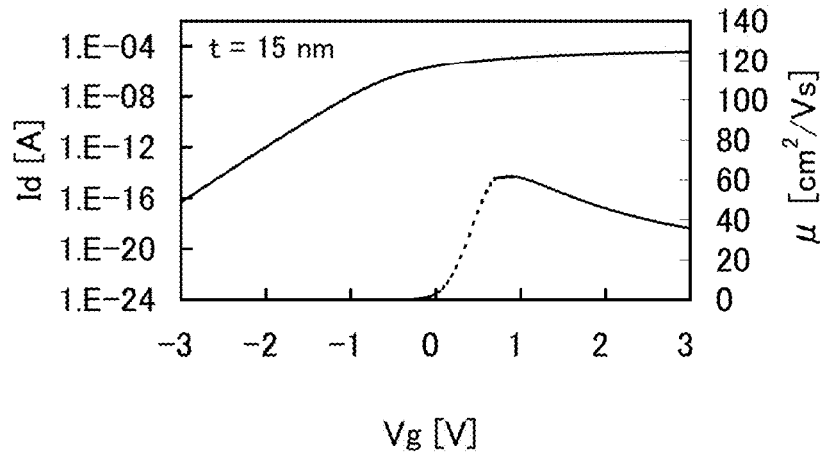
FIGS. 31A to 31C each show gate voltage dependence of drain current and mobility, which is obtained by calculation.
Figure 31B:
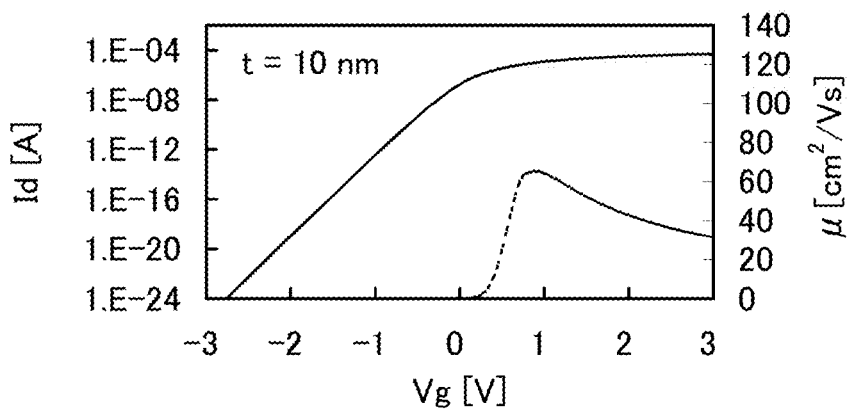
Figure 31C:
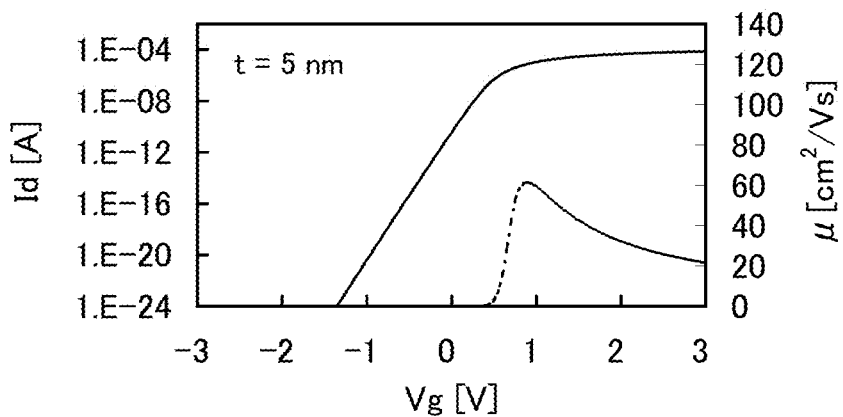

FIGS. 31A to 31C show the gate voltage $V_g$ dependence of the drain current $I_d$ (a solid line) and the mobility $\mu$ (a dotted line) of the transistor having the structure illustrated in FIG. 33B where the offset length $L_{off}$ is 5 nm. The drain current $I_d$ is obtained by calculation under the assumption that the drain voltage is +1 V and the mobility $\mu$ is obtained by calculation under the assumption that the drain voltage is +0.1 V. FIG. 31A shows the gate voltage dependence of the transistor in the case where the thickness of the gate insulating film is 15 nm, FIG. 31B shows that of the transistor in the case where the thickness of the gate insulating film is 10 nm, and FIG. 31C shows that of the transistor in the case where the thickness of the gate insulating film is 5 nm.

Figure 32A:
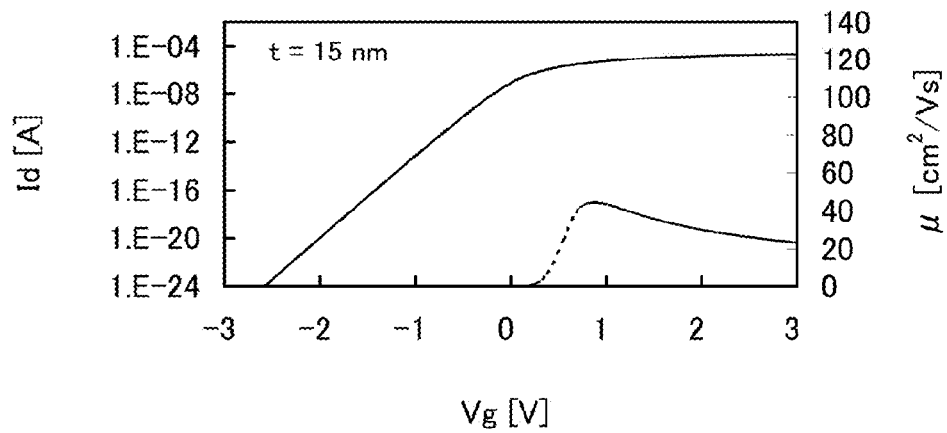
FIGS. 32A to 32C show gate voltage dependence of drain current and mobility, which is obtained by calculation.
Figure 32B:
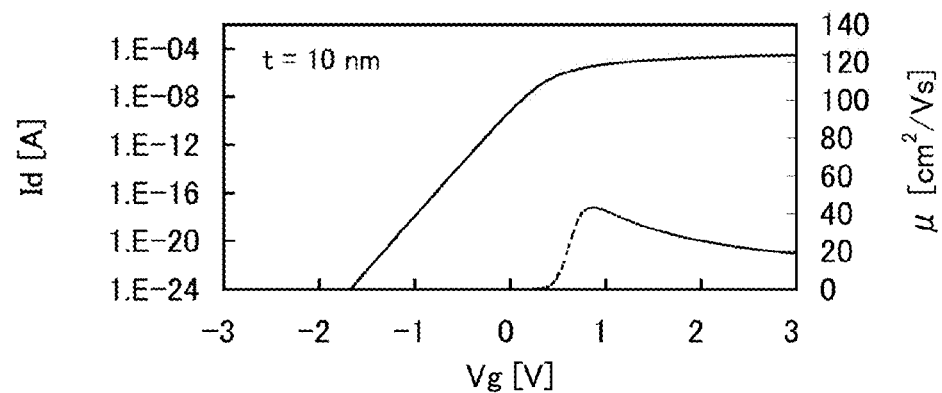
Figure 32C:
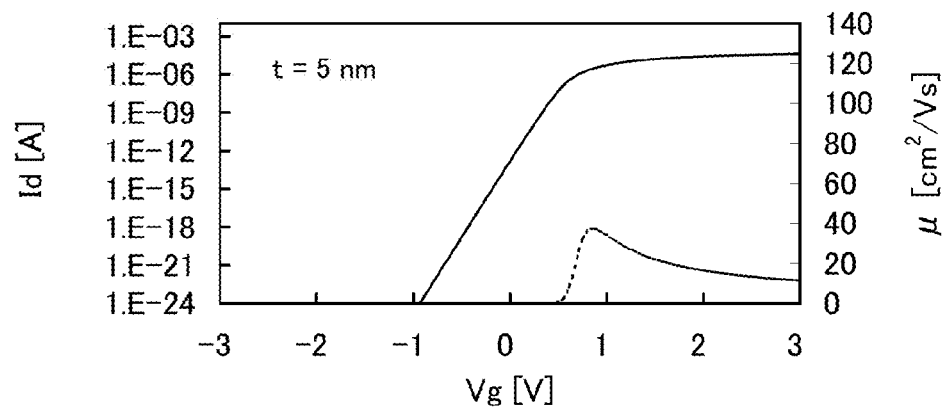

Further, FIGS. 32A to 32C show the gate voltage dependence of the drain current $I_d$ (a solid line) and the mobility $\mu$ (a dotted line) of the transistor having the structure illustrated in FIG. 33B where the offset length $L_{off}$ is 15 nm. The drain current $I_d$ is obtained by calculation under the assumption that the drain voltage is +1 V and the mobility $\mu$ is obtained by calculation under the assumption that the drain voltage is +0.1 V. FIG. 32A shows the gate voltage dependence of the transistor in the case where the thickness of the gate insulating film is 15 nm, FIG. 32B shows that of the transistor in the case where the thickness of the gate insulating film is 10 nm, and FIG. 32C shows that of the transistor in the case where the thickness of the gate insulating film is 5 nm.

In either of the structures, as the gate insulating film is thinner, the off-state current is significantly decreased, whereas no noticeable change arises in the peak value of the mobility $\mu$ and the on-state current.

Note that the peak of the mobility $\mu$ is approximately 80 cm$^2$/Vs in FIGS. 30A to 30C, approximately 60 cm$^2$/Vs in FIGS. 31A to 31C, and approximately 40 cm$^2$/Vs in FIGS. 32A to 32C; thus, the peak of the mobility $\mu$ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

Embodiment 12

In this embodiment, a transistor in which an oxide semiconductor containing In, Sn, and Zn as main components is used as a channel formation region will be described with reference to FIGS. 34A to 34C, FIGS. 35A and 35B, FIGS. 36A and 36B, FIG. 37, FIG. 38, FIG. 39, and FIGS. 40A and 40B.

A transistor in which an oxide semiconductor containing In, Sn, and Zn as main components is used as a channel formation region can have favorable characteristics by depositing the oxide semiconductor while heating a substrate or by performing heat treatment after an oxide semiconductor film is formed. Note that a main component refers to an element included in a composition at 5 at. % or more.

By intentionally heating the substrate after formation of the oxide semiconductor film containing In, Sn, and Zn as main components, the field-effect mobility of the transistor can be improved. Further, the threshold voltage of the transistor can be positively shifted to make the transistor normally off.

Figure 34A:
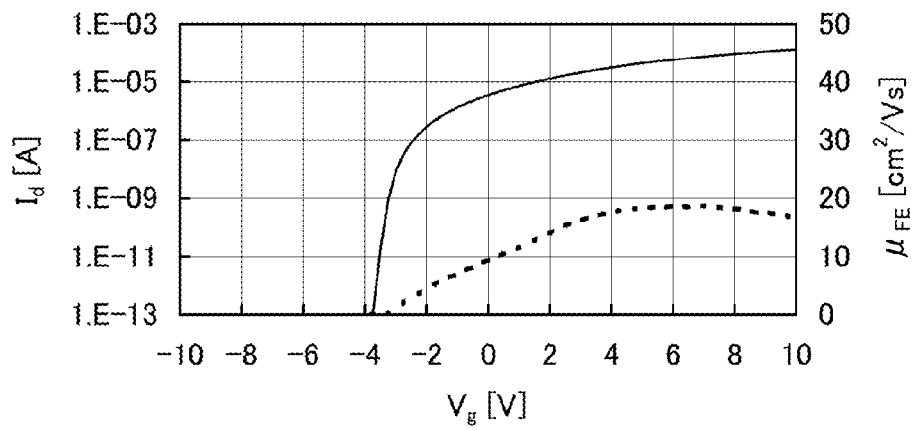
FIGS. 34A to 34C each show characteristics of a transistor formed using an oxide semiconductor film.
Figure 34B:
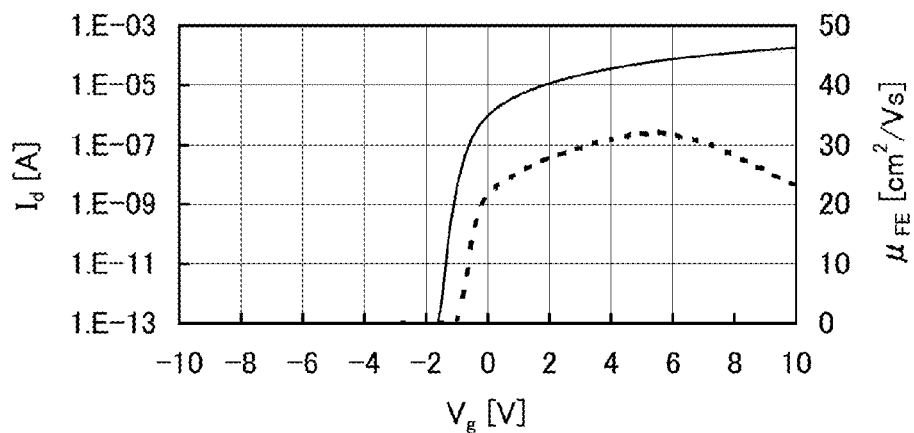
Figure 34C:
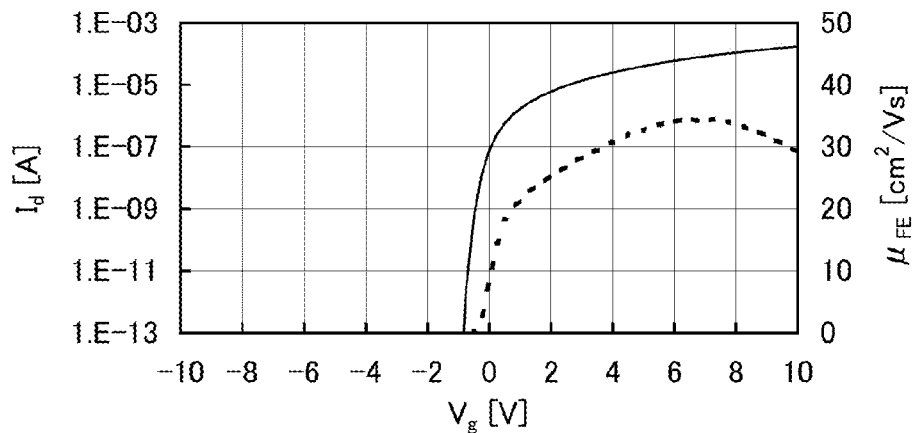

As an example, FIGS. 34A to 34C are graphs each showing characteristics of a transistor in which an oxide semiconductor film containing In, Sn, and Zn as main components and having a channel length L of 3 μm and a channel width W of 10 μm, and a gate insulating film with a thickness of 100 nm are used. Note that $V_d$ was set to 10 V.

FIG. 34A shows characteristics of a transistor whose oxide semiconductor film containing In, Sn, and Zn as main components was formed by a sputtering method without heating a substrate intentionally. The field-effect mobility of the transistor is 18.8 cm$^2$/Vsec. On the other hand, when the oxide semiconductor film containing In, Sn, and Zn as main components is formed while heating the substrate intentionally, the field-effect mobility can be improved.

FIG. 34B shows characteristics of a transistor whose oxide semiconductor film containing In, Sn, and Zn as main components was formed while heating a substrate at 200° C. The field-effect mobility of the transistor is 32.2 cm$^2$/Vsec.

The field-effect mobility can be further improved by performing heat treatment after formation of the oxide semiconductor film containing In, Sn, and Zn as main components.

FIG. 34C shows characteristics of a transistor whose oxide semiconductor film containing In, Sn, and Zn as main components was formed by sputtering at 200° C. and then subjected to heat treatment at 650° C. The field-effect mobility of the transistor is 34.5 cm$^2$/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a highly purified non-single-crystal oxide semiconductor, ideally, a field-effect mobility exceeding 100 cm$^2$/Vsec is expected to be realized.

The oxide semiconductor containing In, Sn, and Zn as main components may be crystallized in the following manner: oxygen ions are implanted into the oxide semiconductor, hydrogen, a hydroxyl group, or moisture contained in the oxide semiconductor is released by heat treatment, and the oxide semiconductor is crystallized through the heat treatment or by another heat treatment performed later. By such crystallization treatment or recrystallization treatment, a non-single crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that contains In, Sn, and Zn as main components and is formed without heating a substrate intentionally is used as a channel formation region, the threshold voltage tends to be shifted negatively.

However, when the oxide semiconductor film formed while heating the substrate intentionally is used, the problem of the negative shift of the threshold voltage can be solved. That is, the threshold voltage is shifted so that the transistor becomes a normally-off transistor; this tendency can be confirmed by comparison between FIGS. 34A and 34B.

Note that the threshold voltage can also be controlled by changing the ratio of In, Sn, and Zn; when the composition ratio of In, Sn, and Zn is 2:1:3, a normally off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_{as}$ of 10 V. Note that $V_d$ refers to drain voltage (a potential difference between a drain and a source). Then, the substrate temperature was set to 150° C. and $V_{ds}$ was set to 0.1 V. After that, 20 V of $V_g$ was applied so that the intensity of an electric field applied to gate insulating films was 2 MV/cm, and the condition was kept for one hour. Next, $V_g$ was set to 0 V. Then, $V_g$-$I_d$ characteristics of the transistors were measured at a substrate temperature of 25° C. and $V_{as}$ of 10 V. This process is called a positive BT test.

In a similar manner, first, $V_g$-$I_d$ characteristics of the transistors were measured at a substrate temperature of 25° C. and $V_{ds}$ of 10 V. Then, the substrate temperature was set to 150° C. and $V_{ds}$ was set to 0.1 V. After that, −20 V of $V_g$ was applied so that the intensity of an electric field applied to the gate insulating films was −2 MV/cm, and the condition was kept for one hour. Next, $V_g$ was set to 0 V. Then, $V_g$-$I_d$ characteristics of the transistors were measured at a substrate temperature of 25° C. and $V_{ds}$ of 10 V. This process is called a negative BT test.

Figure 35A:
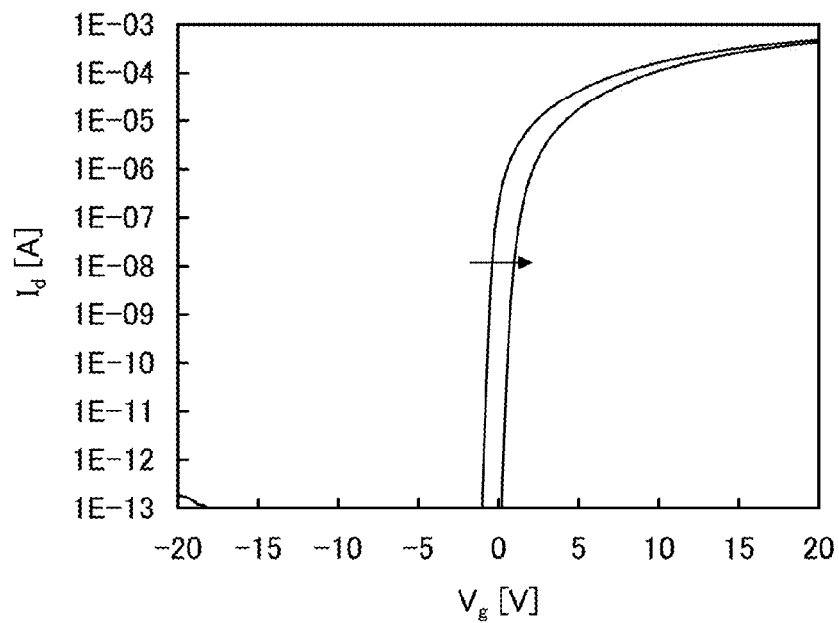
FIGS. 35A and 35B show $V_g$-$I_d$ characteristics after a BT test of a transistor of Sample 1.
Figure 35B:
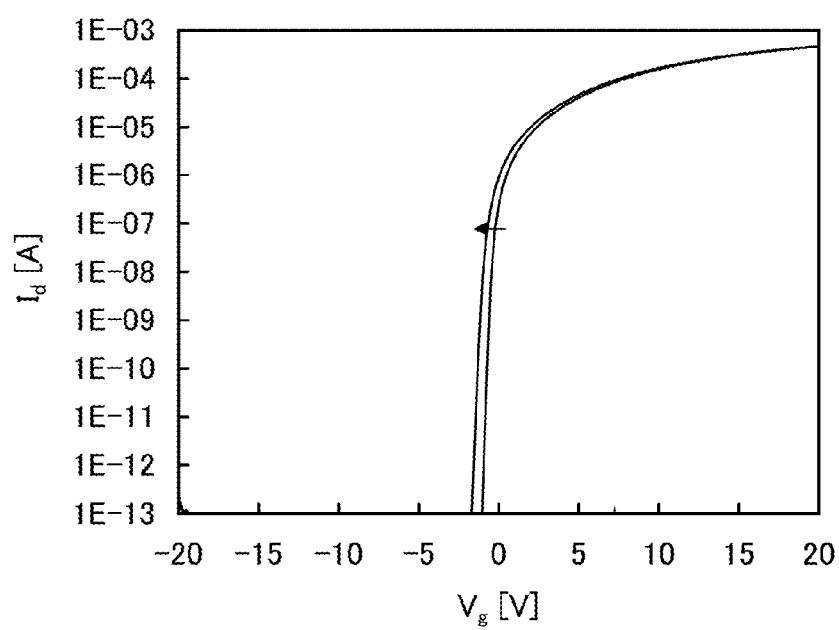
Figure 36A:
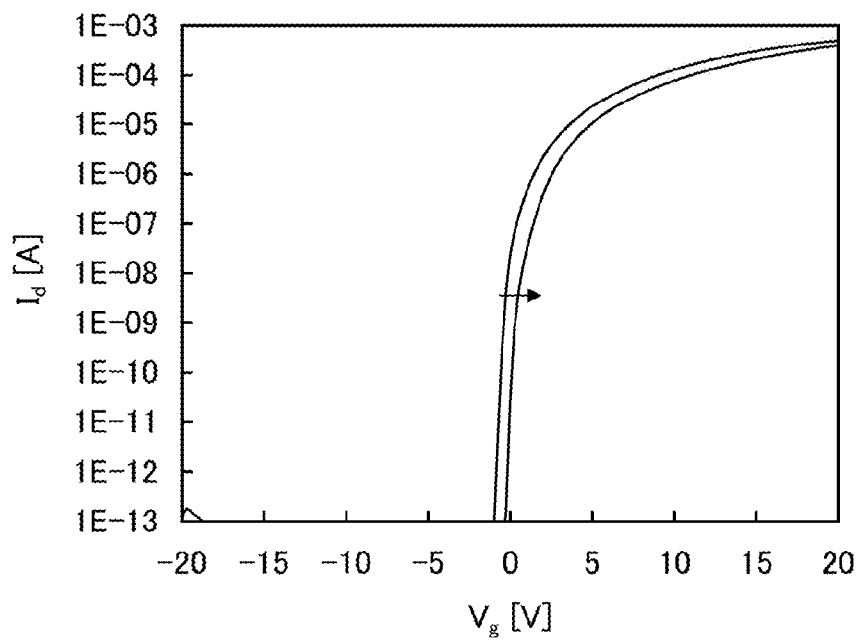
FIGS. 36A and 36B show $V_g$-$I_d$ characteristics after a BT test of a transistor of Sample 2.
Figure 36B:
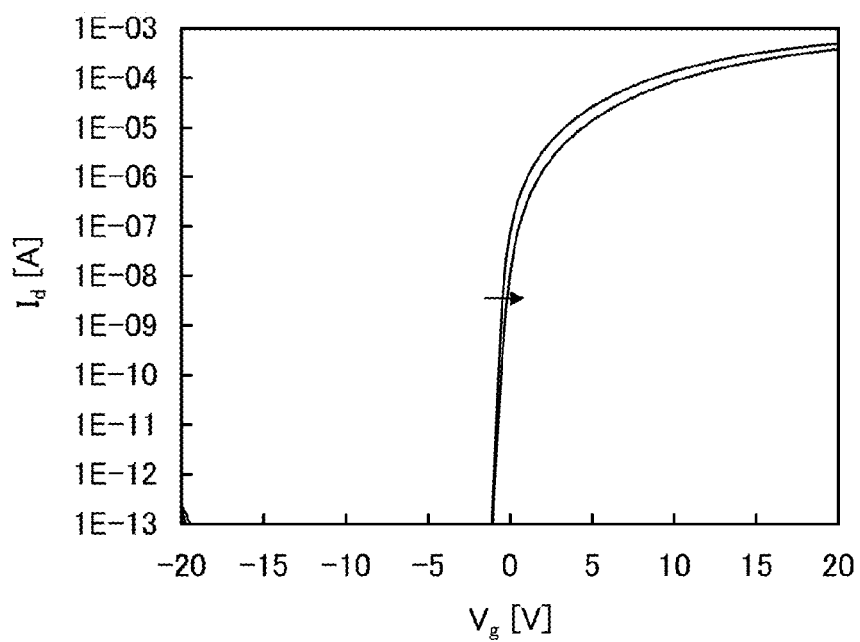

FIGS. 35A and 35B show a result of the positive BT test of Sample 1 and a result of the negative BT test of Sample 1, respectively. Further, FIGS. 36A and 36B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability thereof is high.

The heat treatment can be performed in an oxygen atmosphere; alternatively, the heat treatment may be performed first in an atmosphere of nitrogen or an inert gas or under reduced pressure, and then in an atmosphere containing oxygen. Oxygen is supplied to the oxide semiconductor after dehydration or dehydrogenation, whereby an effect of the heat treatment can be further increased. As a method of supplying oxygen after dehydration or dehydrogenation, a method in which oxygen ions are accelerated by an electric field and implanted into the oxide semiconductor film may be employed.

A defect due to an oxygen vacancy is easily caused in the oxide semiconductor or at an interface between the oxide semiconductor and a film in contact with the oxide semiconductor; however, when excess oxygen is contained in the oxide semiconductor by the heat treatment, an oxygen vacancy caused constantly can be compensated for with excess oxygen. The excess oxygen is oxygen existing mainly between lattices. When the concentration of excess oxygen is set to be higher than or equal to $1 \times 10^{16}$/cm$^3$ and lower than or equal to $2 \times 10^{20}$/cm$^3$, excess oxygen can be contained in the oxide semiconductor without causing crystal distortion or the like.

When heat treatment is performed so that at least part of the oxide semiconductor includes a crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis were performed thereon. A method of manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set to 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 37:
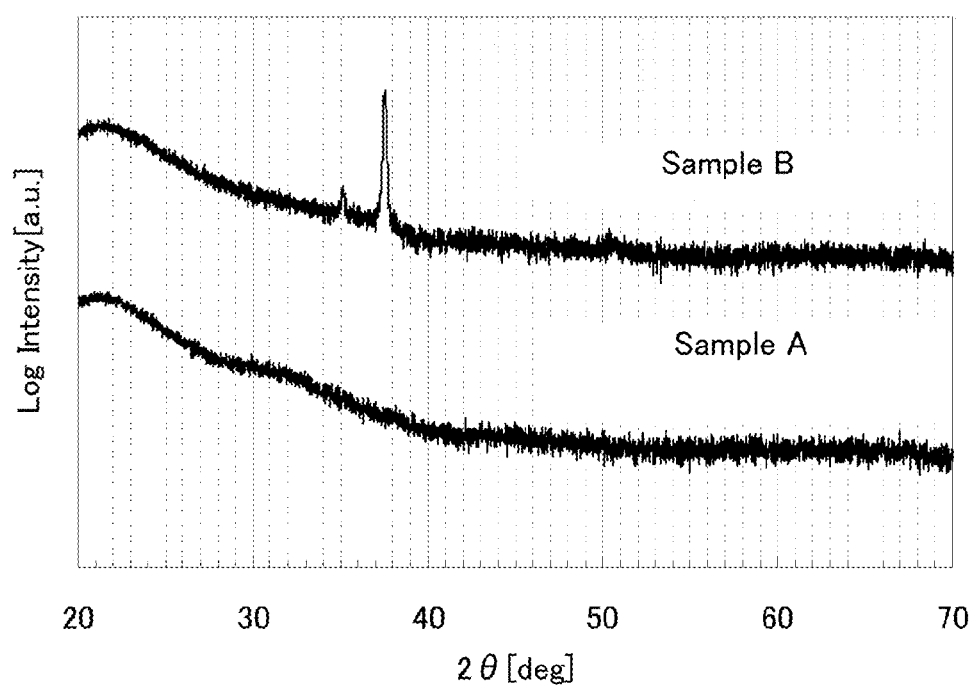
FIG. 37 shows XRD spectra of Sample A and Sample B.

FIG. 37 shows XRD spectra of Sample A and Sample B. No peak derived from crystal was observed in Sample A, whereas peaks derived from crystal were observed when 2θ was around 35 deg and 37 deg to 38 deg in Sample B.

As described above, by intentionally heating a substrate during deposition of an oxide semiconductor containing In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being contained in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or smaller. Here, the unit of the off-state current represents current per micrometer of a channel width.

Figure 38:
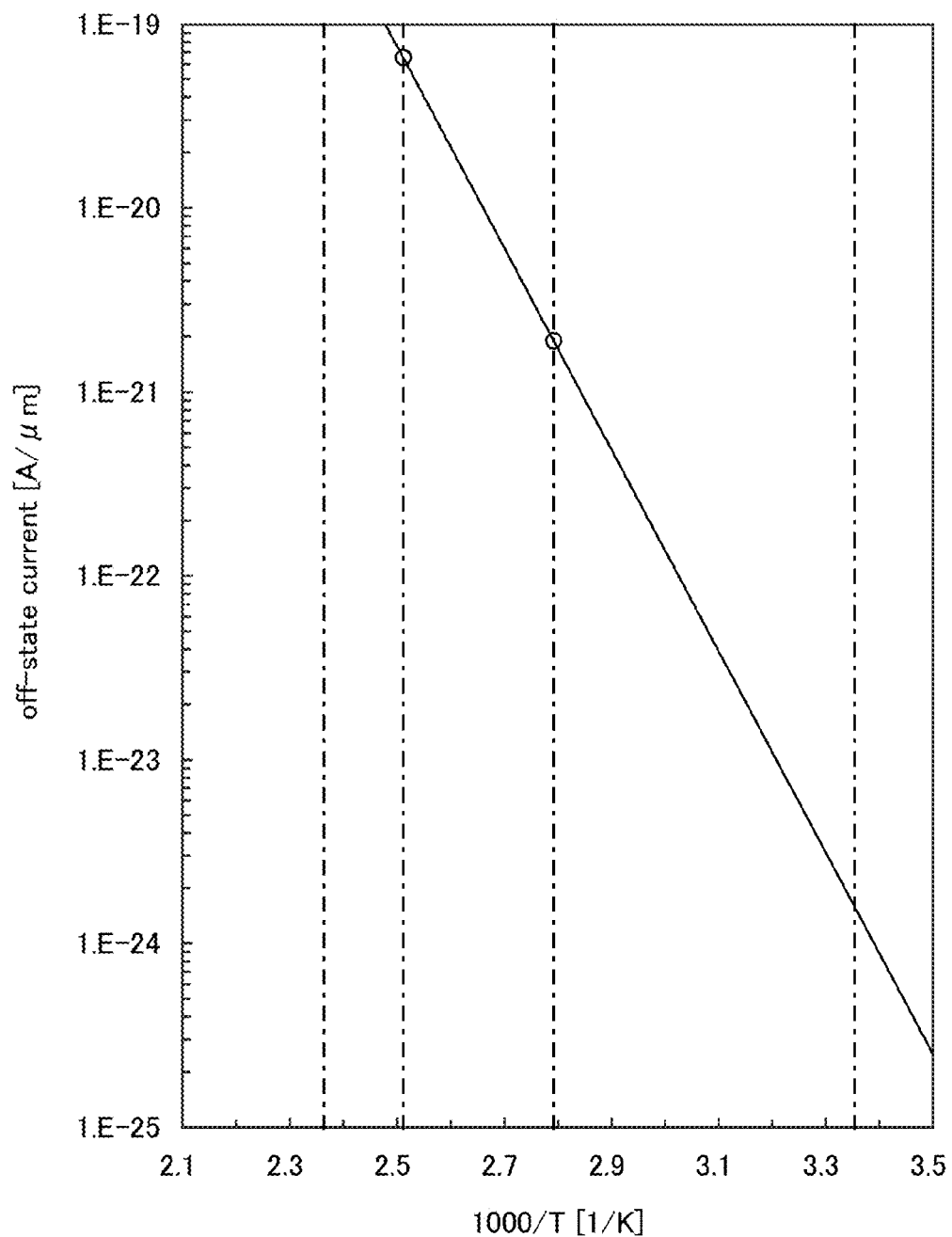
FIG. 38 shows a relation between the off-state current of a transistor and substrate temperature in measurement.

FIG. 38 shows a relation between the off-state current of a transistor and the inverse of substrate temperature (absolute temperature) at measurement. Here, for simplicity, the horizontal axis represents a value (1000/T) obtained by multiplying an inverse of substrate temperature at measurement by 1000.

Specifically, as shown in FIG. 38, the off-state current was 0.1 aA/μm ($1 \times 10^{-19}$ A/μm) or smaller and 10 zA/μm ($1 \times 10^{-20}$ A/μm) or smaller when the substrate temperature is 125° C. and 85° C., respectively. The proportional relation between the logarithm of the off-state current and the inverse of the temperature suggests that the off-state current at room temperature (27° C.) is 0.1 zA/μm ($1 \times 10^{-22}$ A/μm) or smaller. Hence, the off-state current can be 1 aA/μm ($1 \times 10^{-18}$ A/μm) or smaller, 100 zA/μm ($1 \times 10^{-19}$ A/μm) or smaller, and 1 zA/μm ($1 \times 10^{-21}$ A/μm) or smaller at 125° C., 85° C., and room temperature, respectively.

Note that in order to prevent hydrogen and moisture from being contained in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being contained in the film. In addition, it is preferable to use a target which is highly purified so as not to contain impurities such as hydrogen and moisture. Although it is possible to remove moisture from a film of an oxide semiconductor containing In, Sn, and Zn as main components by heat treatment, a film which does not contain moisture originally is preferably formed because moisture is released from the oxide semiconductor containing In, Sn, and Zn as main components at a higher temperature than from an oxide semiconductor containing In, Ga, and Zn as main components.

The relation between the substrate temperature and electric characteristics of the transistor using Sample B, on which heat treatment at 650° C. was performed after formation of the oxide semiconductor film, was evaluated.

The transistor used for the measurement has a channel length L of 3 μm, a channel width W of 10 μm, $L_{ov}$ of 0 μm, and dW of 0 μm. Note that $V_{ds}$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as $L_{ov}$, and the width of a portion of the pair of electrodes, which does not overlap with an oxide semiconductor film, is referred to as dW.

Figure 39:
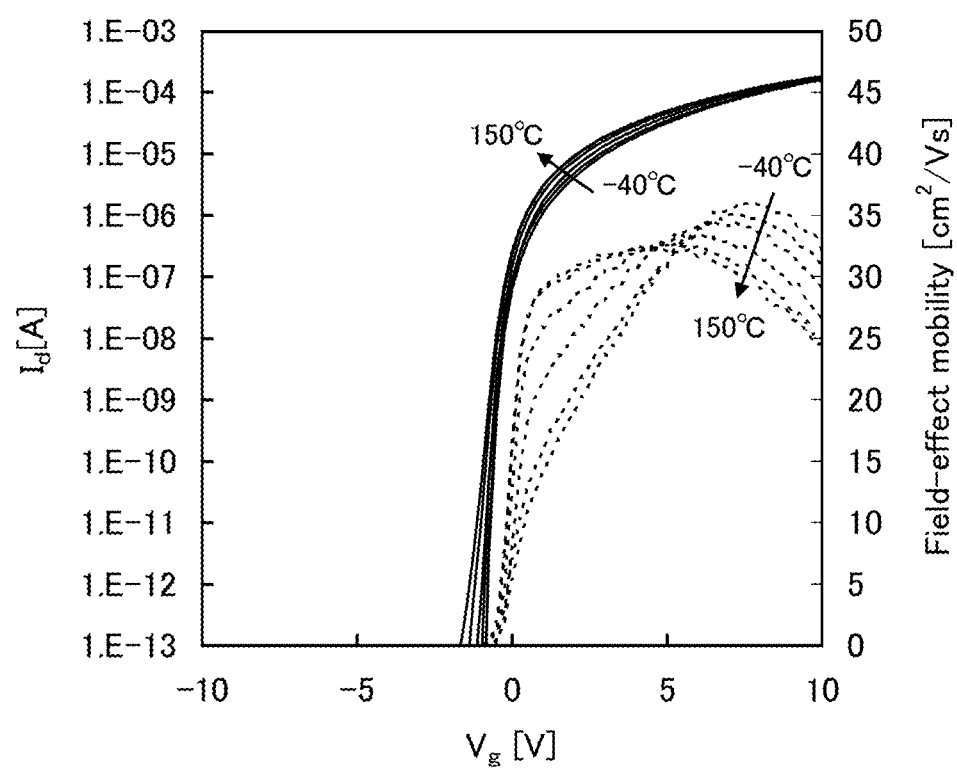
FIG. 39 shows $V_g$ dependence of $I_d$ and field-effect mobility.
Figure 40A:
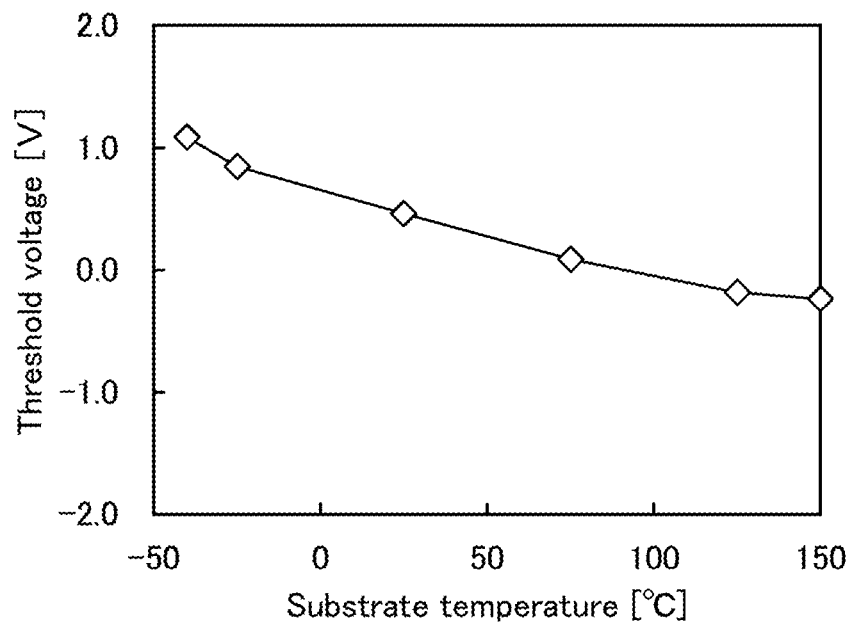
FIG. 40A shows a relation between substrate temperature and threshold voltage.

FIG. 39 shows the $V_g$ dependence of $I_d$ (a solid line) and field-effect mobility (a dotted line). FIG. 40A shows a relation between the substrate temperature and the threshold voltage, and FIG. 40B shows a relation between the substrate temperature and the field-effect mobility.

From FIG. 40A, it is found that the threshold voltage gets lower as the substrate temperature increases. Note that the threshold voltage is decreased from 1.09 V to −0.23 V in the range from −40° C. to 150° C.

Figure 40B:
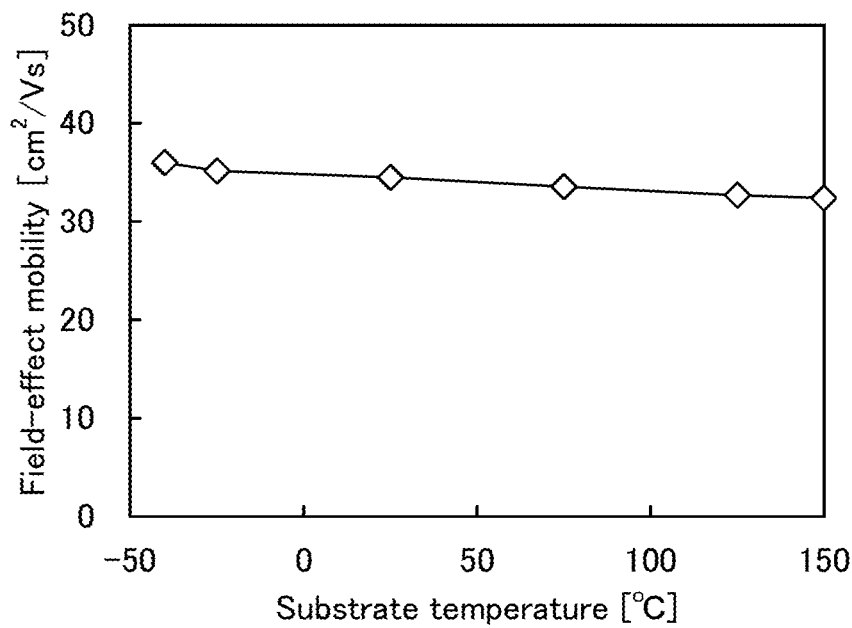
FIG. 40B shows a relation between substrate temperature and field-effect mobility.

From FIG. 40B, it is found that the field-effect mobility gets lower as the substrate temperature increases. Note that the field-effect mobility is decreased from 36 cm²/Vs to 32 cm²/Vs in the range from −40° C. to 150° C. Thus, it is found that variation in electric characteristics is small in the above temperature range.

In a transistor in which such an oxide semiconductor containing In, Sn, and Zn as main components is used as a channel formation region, a field-effect mobility of 30 cm²/Vsec or higher, preferably 40 cm²/Vsec or higher, further preferably 60 cm²/Vsec or higher, can be obtained with the off-state current maintained at 1 aA/μm or smaller, which can achieve on-state current needed for an LSI.

For example, in an FET where L/W is 33 nm/40 nm, an on-state current of 12 μA or larger can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

This embodiment can be combined with any of the other embodiments as appropriate.

Embodiment 13

In this embodiment, an example of an electronic device using a signal processing circuit according to one embodiment of the present invention will be described. With the use of the signal processing circuit according to one embodiment of the present invention, an electronic device with low power consumption can be provided.

Electronic devices in which the signal processing circuit according to one embodiment of the present invention can be used are display devices, personal computers, image reproducing devices provided with recording media (typically, devices which reproduce the content of recording media such as digital versatile discs (DVDs) and have displays for displaying the reproduced images), and the like.

Besides, as electronic devices in which the signal processing circuit according to one embodiment of the present invention can be used, mobile phones, smartphones, e-book readers, game machines including portable ones, portable information terminals, cameras (such as video cameras and digital still cameras), head mounted displays (such as goggle-type displays), navigation systems, audio reproducing devices (such as car audio systems and digital audio players), copiers, facsimiles, printers, multifunction printers, automated teller machines (ATM), vending machines, and the like can be given.

Particularly in the case of a portable electronic device for which it is difficult to be constantly supplied with power, use of the signal processing circuit according to one embodiment of the present invention as a component leads to suppression of the power consumption of the signal processing circuit, so that the continuous operating time can be longer.

In this embodiment, examples of a portable electronic device to which the signal processing circuit according to one embodiment of the present invention is applied will be described with reference to FIG. 18 and FIG. 19. Examples of the portable electronic device include mobile phones, smartphones, and e-book readers.

Figure 18:
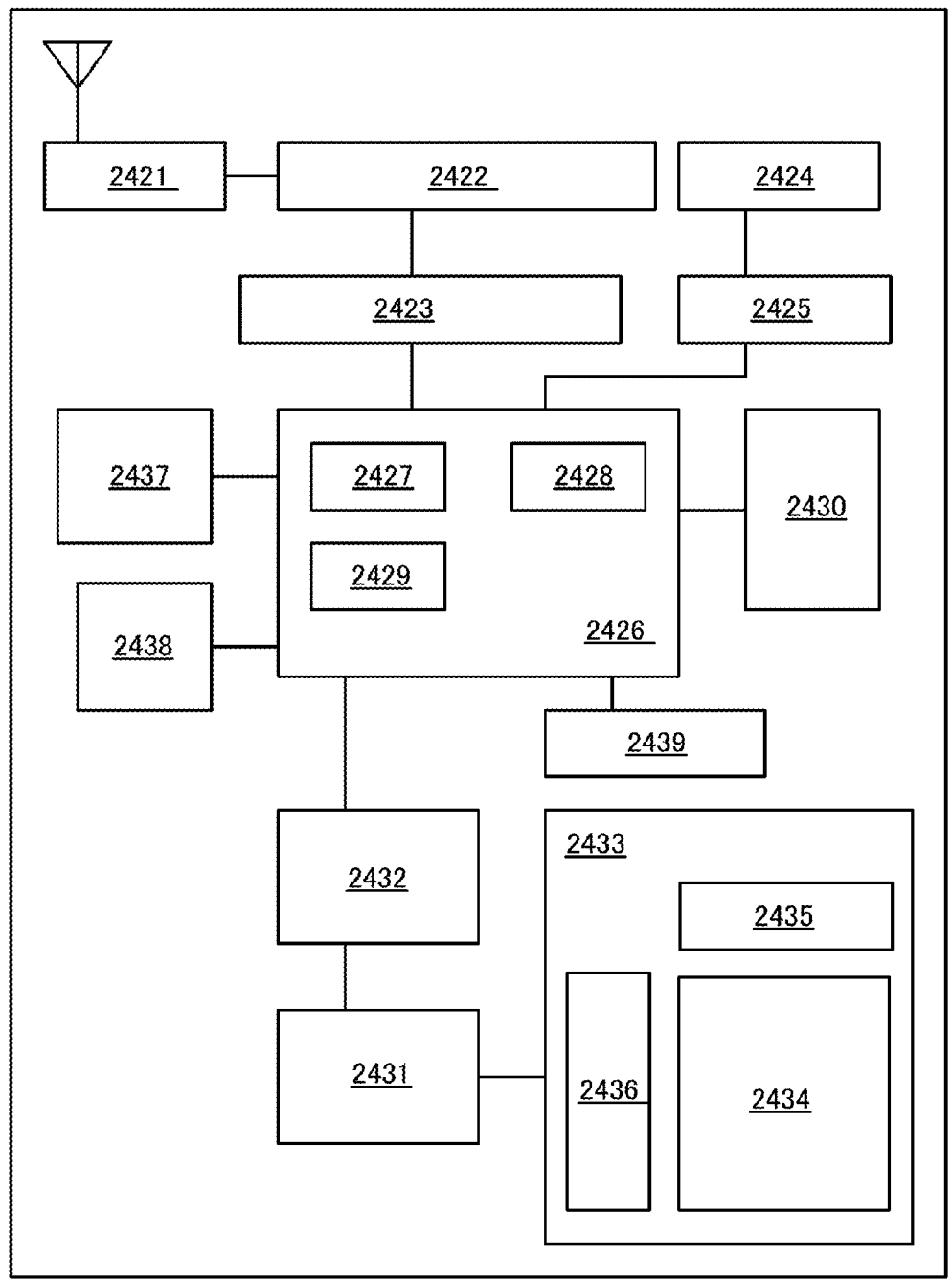
FIG. 18 illustrates an example of an electronic device.

FIG. 18 is a block diagram illustrating an example of a portable electronic device.

The portable electronic device illustrated in FIG. 18 includes an RF circuit 2421, an analog baseband circuit 2422, a digital baseband circuit 2423, a battery 2424, a power supply circuit 2425, an application processor 2426, a flash memory 2430, a display controller 2431, a memory 2432, a display 2433, an audio circuit 2437, a keyboard 2438, a touch sensor 2439, and the like.

The display 2433 includes a display portion 2434, a source driver 2435, a gate driver 2436, and the like. The application processor 2426 includes a CPU 2427, a DSP 2428, an interface 2429, and the like.

The signal processing circuit described in any of the above embodiments is used for, for example, the CPU 2427, whereby the power consumption of the portable electronic device can be reduced.

Figure 19:
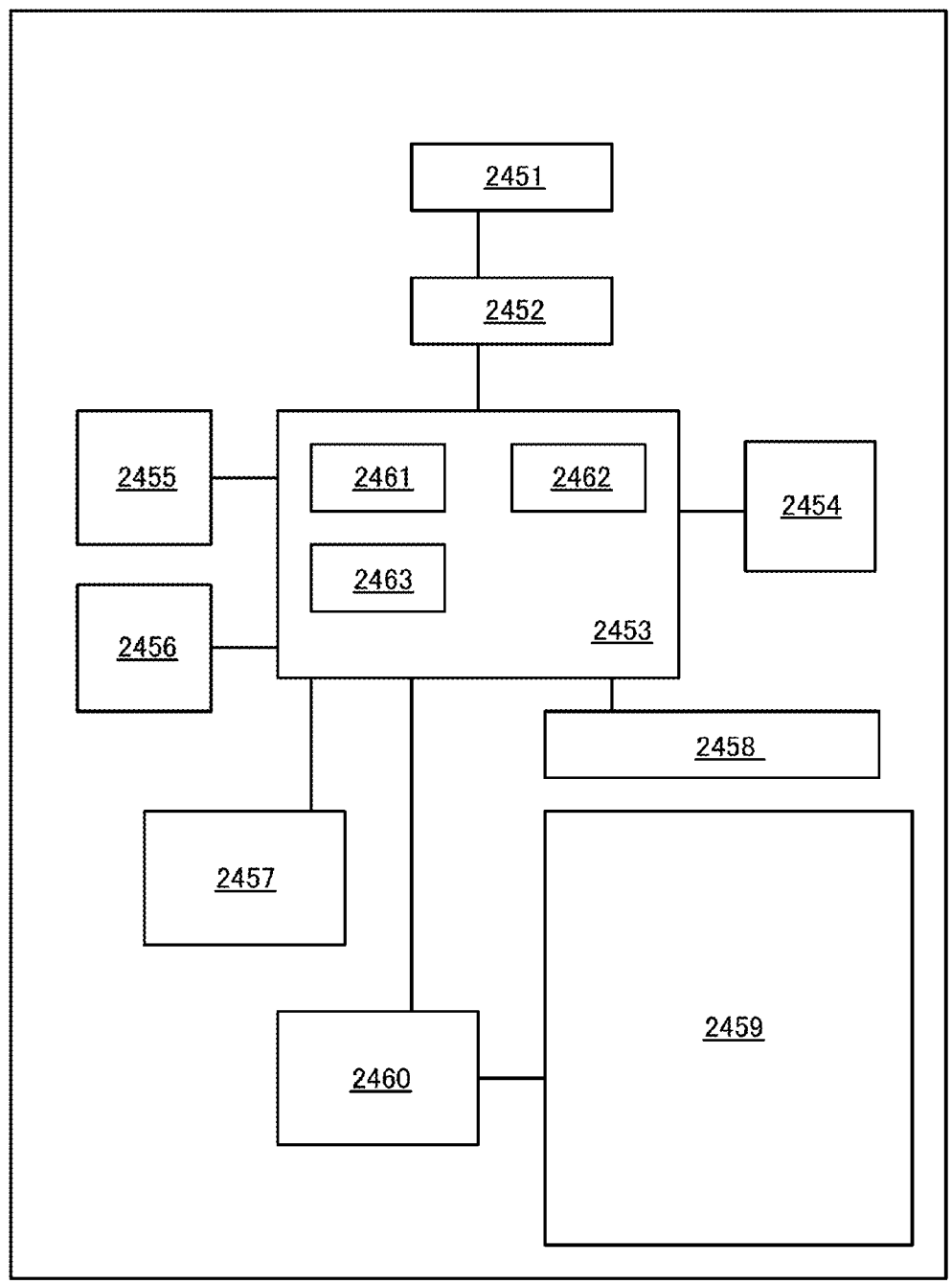
FIG. 19 illustrates an example of an electronic device.

FIG. 19 is a block diagram illustrating an e-book reader as an example of a portable electronic device.

The e-book reader includes a battery 2451, a power supply circuit 2452, a microprocessor 2453, a flash memory 2454, an audio circuit 2455, a keyboard 2456, a memory 2457, a touch panel 2458, a display 2459, a display controller 2460, and the like.

The microprocessor 2453 includes a CPU 2461, a DSP 2462, an interface 2463, and the like.

The signal processing circuit described in any of the above embodiments is used for, for example, the CPU 2461, whereby the power consumption of the e-book reader can be reduced.

This embodiment can be combined with any of the other embodiments as appropriate.

This application is based on Japanese Patent Application serial no. 2011-113874 filed with the Japan Patent Office on May 20, 2011, the entire contents of which are hereby incorporated by reference.

What is claimed is:

1. A semiconductor device comprising:
a first memory circuit comprising a first inverter circuit and a second inverter circuit;
a first switching circuit configured to control an input of a data signal;
a second switching circuit;
a third inverter circuit;
a fourth inverter circuit;
a second memory circuit comprising a first transistor and a first capacitor;
a third memory circuit comprising a second transistor and a second capacitor; and
a precharge circuit comprising a third transistor and a fourth transistor,
wherein each of the first transistor and the second transistor comprises a channel formation region comprising an oxide semiconductor,
wherein an input terminal of the first inverter circuit is electrically connected to an output terminal of the second inverter circuit,
wherein an input terminal of the second inverter circuit is electrically connected to an output terminal of the first inverter circuit,
wherein the first switching circuit is electrically connected to the input terminal of the first inverter circuit,
wherein the output terminal of the first inverter circuit is electrically connected to an input terminal of the third inverter circuit via the second switching circuit,
wherein the input terminal of the third inverter circuit is electrically connected to an output terminal of the fourth inverter circuit,
wherein an input terminal of the fourth inverter circuit is electrically connected to an output terminal of the third inverter circuit,
wherein one of a source and a drain of the first transistor is electrically connected to the output terminal of the first inverter circuit,
wherein the other of the source and the drain of the first transistor is electrically connected to the first capacitor,
wherein one of a source and a drain of the second transistor is electrically connected to the output terminal of the second inverter circuit,
wherein the other of the source and the drain of the second transistor is electrically connected to the second capacitor,
wherein one of a source and a drain of the third transistor is electrically connected to the output terminal of the first inverter circuit,
wherein the other of the source and the drain of the third transistor is electrically connected to a power supply line,
wherein one of a source and a drain of the fourth transistor is electrically connected to the output terminal of the second inverter circuit, and
wherein the other of the source and the drain of the fourth transistor is electrically connected to the power supply line.

2. The semiconductor device according to claim 1, wherein a clock signal and a signal generated by inverting the clock signal are input to the first switching circuit so that the first switching circuit is controlled to be in an on-state or an off-state.

3. The semiconductor device according to claim 1, wherein a register comprises the first memory circuit, the first switching circuit, the second switching circuit, the third inverter circuit, the fourth inverter circuit, the second memory circuit, the third memory circuit and the precharge circuit, and wherein each of the second memory circuit and the third memory circuit is configured to hold data while a supply of a power supply voltage to the register is stopped.

4. The semiconductor device according to claim 1, wherein a flip-flop circuit comprises the first memory circuit the first switching circuit, the second switching circuit, the third inverter circuit and the fourth inverter circuit.

5. The semiconductor device according to claim 1, further comprising:
an arithmetic circuit; and
a main memory,
wherein a register comprises the first memory circuit, the first switching circuit, the second switching circuit, the third inverter circuit, the fourth inverter circuit, the second memory circuit, the third memory circuit and the precharge circuit, and
wherein data signals output from the arithmetic circuit are input to the main memory and the register.

6. A semiconductor device comprising:
a first inverter circuit;
a second inverter circuit;
a first switching circuit configured to control an input of a data signal;
a second switching circuit;
a third inverter circuit;
a fourth inverter circuit;
a first transistor;
a second transistor;
a third transistor;
a fourth transistor;
a first capacitor; and
a second capacitor,
wherein each of the first transistor and the third transistor comprises a channel formation region comprising an oxide semiconductor,
wherein an input terminal of the first inverter circuit is electrically connected to an output terminal of the second inverter circuit,
wherein an input terminal of the second inverter circuit is electrically connected to an output terminal of the first inverter circuit,
wherein the first switching circuit is electrically connected to the input terminal of the first inverter circuit,
wherein the output terminal of the first inverter circuit is electrically connected to an input terminal of the third inverter circuit via the second switching circuit,
wherein the input terminal of the third inverter circuit is electrically connected to an output terminal of the fourth inverter circuit,
wherein an input terminal of the fourth inverter circuit is electrically connected to an output terminal of the third inverter circuit,
wherein one of a source and a drain of the first transistor is electrically connected to the output terminal of the first inverter circuit,
wherein the other of the source and the drain of the first transistor is electrically connected to the first capacitor,
wherein one of a source and a drain of the second transistor is electrically connected to the output terminal of the first inverter circuit,
wherein the other of the source and the drain of the second transistor is electrically connected to a power supply line,
wherein one of a source and a drain of the third transistor is electrically connected to the output terminal of the second inverter circuit,
wherein the other of the source and the drain of the third transistor is electrically connected to the second capacitor,
wherein one of a source and a drain of the fourth transistor is electrically connected to the output terminal of the second inverter circuit, and
wherein the other of the source and the drain of the fourth transistor is electrically connected to the power supply line.

7. The semiconductor device according to claim 6, wherein a clock signal and a signal generated by inverting the clock signal are input to the first switching circuit so that the first switching circuit is controlled to be in an on-state or an off-state.

8. The semiconductor device according to claim 6, wherein a flip-flop circuit comprises the first inverter circuit, the second inverter circuit the first switching circuit, the second switching circuit, the third inverter circuit and the fourth inverter circuit.

9. The semiconductor device according to claim 6, further comprising:
an arithmetic circuit; and
a main memory,
wherein a register comprises the first inverter circuit, the second inverter circuit, the first switching circuit, the second switching circuit, the third inverter circuit and the fourth inverter circuit, the first transistor, the second transistor, the third transistor, the fourth transistor, the first capacitor and the second capacitor, and
wherein data signals output from the arithmetic circuit are input to the main memory and the register.

10. A semiconductor device comprising:
a first memory circuit comprising a first inverter circuit and a second inverter circuit;
a first switching circuit configured to control an input of a data signal;
a second switching circuit;
a third inverter circuit;
a fourth inverter circuit;
a second memory circuit comprising a first transistor and a first capacitor;
a third memory circuit comprising a second transistor and a second capacitor;
a fourth memory circuit comprising a third transistor and a third capacitor;
a fifth memory circuit comprising a fourth transistor and a fourth capacitor; and
a precharge circuit comprising a fifth transistor and a sixth transistor,
wherein each of the first transistor, the second transistor, the third transistor and the fourth transistor comprises a channel formation region comprising an oxide semiconductor,
wherein an input terminal of the first inverter circuit is electrically connected to an output terminal of the second inverter circuit,
wherein an input terminal of the second inverter circuit is electrically connected to an output terminal of the first inverter circuit,
wherein the first switching circuit is electrically connected to the input terminal of the first inverter circuit,
wherein the output terminal of the first inverter circuit is electrically connected to an input terminal of the third inverter circuit via the second switching circuit,
wherein the input terminal of the third inverter circuit is electrically connected to an output terminal of the fourth inverter circuit,
wherein an input terminal of the fourth inverter circuit is electrically connected to an output terminal of the third inverter circuit,
wherein one of a source and a drain of the first transistor is electrically connected to the output terminal of the first inverter circuit, wherein the other of the source and the drain of the first transistor is electrically connected to the first capacitor, wherein one of a source and a drain of the second transistor is electrically connected to the output terminal of the second inverter circuit, wherein the other of the source and the drain of the second transistor is electrically connected to the second capacitor, wherein one of a source and a drain of the third transistor is electrically connected to the output terminal of the first inverter circuit, wherein the other of the source and the drain of the third transistor is electrically connected to the third capacitor, wherein one of a source and a drain of the fourth transistor is electrically connected to the output terminal of the second inverter circuit, wherein the other of the source and the drain of the fourth transistor is electrically connected to the fourth capacitor, wherein one of a source and a drain of the fifth transistor is electrically connected to the output terminal of the first inverter circuit, wherein the other of the source and the drain of the fifth transistor is electrically connected to a power supply line, wherein one of a source and a drain of the sixth transistor is electrically connected to the output terminal of the second inverter circuit, and wherein the other of the source and the drain of the sixth transistor is electrically connected to the power supply line.

11. The semiconductor device according to claim 10, wherein a clock signal and a signal generated by inverting the clock signal are input to the first switching circuit so that the first switching circuit is controlled to be in an on-state or an off-state.

12. The semiconductor device according to claim 10, wherein a flip-flop circuit comprises the first memory circuit, the first switching circuit, the second switching circuit, the third inverter circuit and the fourth inverter circuit.

13. The semiconductor device according to claim 10, further comprising:
   an arithmetic circuit; and
   a main memory,
   wherein a register comprises the first memory circuit, the first switching circuit, the second switching circuit, the third inverter circuit and the fourth inverter circuit, the second memory circuit, the third memory circuit, the fourth memory circuit, the fifth memory circuit and the precharge circuit, and
   wherein data signals output from the arithmetic circuit are input to the main memory and the register.

* * * * *